(12) United States Patent
McDermott et al.

(10) Patent No.: US 11,136,239 B2
(45) Date of Patent: Oct. 5, 2021

(54) METHODS FOR FORMING NANOTUBE FABRICS WITH CONTROLLED SURFACE ROUGHNESS AND DEGREE OF RAFTING

(71) Applicant: Nantero, Inc., Woburn, MA (US)

(72) Inventors: Joseph James McDermott, Watertown, MA (US); Jennifer Black, Woburn, MA (US); Rahul Sen, Lexington, MA (US); David A. Roberts, Woburn, MA (US); Billy Smith, Woburn, MA (US)

(*) Notice: Subject to any disclaimer, the term of this patent is extended or adjusted under 35 U.S.C. 154(b) by 0 days.

(21) Appl. No.: 16/413,746

(22) Filed: May 16, 2019

(65) Prior Publication Data

US 2019/0292057 A1    Sep. 26, 2019

Related U.S. Application Data

(63) Continuation-in-part of application No. 15/483,614, filed on Apr. 10, 2017, now Pat. No. 10,773,960.

(Continued)

(51) Int. Cl.
| | | |
|---|---|---|
| *C01B 32/158* | (2017.01) | |
| *B82Y 40/00* | (2011.01) | |
| *B82Y 30/00* | (2011.01) | |
| *H01B 1/04* | (2006.01) | |
| *G11C 13/02* | (2006.01) | |

(52) U.S. Cl.
CPC ............ *C01B 32/158* (2017.08); *B82Y 30/00* (2013.01); *B82Y 40/00* (2013.01); *H01B 1/04* (2013.01); *C01B 2202/02* (2013.01); *C01B 2202/06* (2013.01); *C01B 2202/22* (2013.01); *C01B 2202/34* (2013.01); *C01B 2202/36* (2013.01); *G11C 13/025* (2013.01);

(Continued)

(58) Field of Classification Search
CPC . C01B 32/158; C01B 32/168; C01B 2202/02; C01B 2202/06; C01B 2202/34; B82Y 40/00; H01B 1/04
USPC ................................ 252/500, 502, 510, 511
See application file for complete search history.

(56) References Cited

U.S. PATENT DOCUMENTS

| | | | | |
|---|---|---|---|---|
| 2002/0046872 | A1* | 4/2002 | Smalley | ................. B82Y 10/00 174/137 A |
| 2006/0204427 | A1* | 9/2006 | Ghenciu | ............... C01B 32/168 423/445 B |
| 2007/0153353 | A1* | 7/2007 | Gruner | ................ H01L 29/0676 359/245 |

OTHER PUBLICATIONS

Goh "Surfactant dispersed multi-walled carbon nanotube/polyetherimide nanocomposite membrane." Solid State Sciences 12 (2010) 2155-2162 (Year: 2012).*

* cited by examiner

*Primary Examiner* — Tri V Nguyen
(74) *Attorney, Agent, or Firm* — Kenja IP Law PC

(57) ABSTRACT

Methods for forming a nanotube fabric with a controlled surface roughness (or smoothness) and a selected degree of rafting are disclosed by adjusting the concentration levels of a selected ionic species within a nanotube formulation used to form the nanotube fabric. In one aspect, the present disclosure provides a nanotube formulation roughness curve (and methods for generating such a curve) that can be used to select a utilizable range of ionic species concentration levels that will provide a nanotube fabric with a desired surface roughness (or smoothness) and degree of rafting. In some aspects of the present disclosure, such a nanotube formulation roughness curve can be used adjust nanotube formulation prior to a nanotube formulation deposition process to provide nanotube fabrics that are relatively smooth with a low degree of rafting.

13 Claims, 84 Drawing Sheets

Related U.S. Application Data which is a continuation of application No. 13/578,691, filed as application No. PCT/US2011/024710 on Feb. 14, 2011, now Pat. No. 9,617,151.

(60) Provisional application No. 61/304,045, filed on Feb. 12, 2010.

(52) U.S. Cl.
CPC ........ *Y10S 977/751* (2013.01); *Y10S 977/752* (2013.01); *Y10T 428/249921* (2015.04)

| Cation | | | | | Anion |
|---|---|---|---|---|---|
| Emim | Emim NO₃ | Emim HCO₃ | Emim Ac | Emim Fm | |
| TEA | TEA NO₃ | TEA HCO₃ | TEA Ac | TEA Fm | |
| TMA | TMA NO₃ | TMA HCO₃ | TMA Ac | TMA Fm | |
| NH₄ | NH₄NO₃ | NH₄HCO₃ | NH₄ Ac | NH₄ Fm | |
| | NO₃ | HCO₃ | Ac | Fm | |

FIG. 21

| Example # | CNT Fomulation | Ionic Species | Ionic Species Concentration (mM) | RMS Fabric Roughness (nm) | Orientation Std. Div. | Relevant Figures |
|---|---|---|---|---|---|---|
| 10 | B | None | N/A | 1.72 | ~14° | 26A-26B, 28A-28C |
| 11 | B | NH$_4$NO$_3$ | 0.75 | 2.36 | ~27° | 26A, 29A - 29C |
| 12 | B | NH$_4$NO$_3$ | 1.50 | 3.04 | ~25° | 26A, 30A - 30C |
| 13 | B | NH$_4$NO$_3$ | 7.50 | 4.10 | ~31° | 26A, 31A - 31C |
| 14 | B | TMA Fm | 0.75 | 1.95 | ~29° | 26B, 32A - 32C |
| 15 | B | TMA Fm | 1.50 | 2.22 | ~28° | 26B, 33A - 33C |
| 16 | B | TMA Fm | 7.50 | 2.61 | N/A | 26B, 34A - 34C |
| 17 | C | None | N/A | 1.77 | ~25° | 26C-26D, 35A - 35C |
| 18 | C | NH$_4$NO$_3$ | 0.71 | 3.22 | ~28° | 26C, 36A - 36C |
| 19 | C | NH$_4$NO$_3$ | 1.43 | 3.62 | ~28° | 26C, 37A - 37C |
| 20 | C | NH$_4$NO$_3$ | 8.14 | 3.82 | ~28° | 26C, 38A - 38C |
| 21 | C | TMA Fm | 0.75 | 2.33 | ~34° | 26D, 39A - 39C |
| 22 | C | TMA Fm | 1.50 | 2.50 | ~30° | 26D, 40A - 40C |
| 23 | C | TMA Fm | 7.50 | 2.78 | ~28° | 26D, 41A - 41C |

METHODS FOR FORMING NANOTUBE FABRICS WITH CONTROLLED SURFACE ROUGHNESS AND DEGREE OF RAFTING

CROSS-REFERENCE TO RELATED APPLICATIONS

This application is a continuation-in-part of U.S. patent application Ser. No. 15/483,614 (now US Patent Publication No. US 2017/0210626), entitled "Low Porosity Nanotube Fabric Articles," and filed Apr. 10, 2017, which is a continuation of U.S. patent application Ser. No. 13/578,691 (now U.S. Pat. No. 9,617,151), entitled "Methods for Controlling Density, Porosity, and/or Gap Size within Nanotube Fabric Layers and Films, filed Oct. 31, 2012, which is a U.S. National Phase application under 35 U.S.C. § 371 of International Patent Application No. PCT/US2011/024710 filed on Feb. 14, 2011, entitled "Methods for Controlling Density, Porosity, and/or Gap Size within Nanotube Fabric Layers and Films," which claims priority under 35 U.S.C. § 119(e) to U.S. Provisional Patent Application No. 61/304,045, filed Feb. 12, 2010, which is incorporated by reference its entirety. This application is also related to the following U.S. patents, which are assigned to the assignee of the present application, and are hereby incorporated by reference in their entirety:

Methods of Nanotube Films and Articles (U.S. Pat. No. 6,835,591), filed Apr. 23, 2002;

Methods of Using Pre-Formed Nanotubes to Make Carbon Nanotube Films, Layers, Fabrics, Ribbons, Elements, and Articles (U.S. Pat. No. 7,335,395), filed Jan. 13, 2003;

Devices Having Horizontally-Disposed Nanofabric Articles and Methods of Making the Same (U.S. Pat. No. 7,259,410), filed Feb. 11, 2004;

Devices Having Vertically-Disposed Nanofabric Articles and Methods of Making Same (U.S. Pat. No. 6,924,538), filed Feb. 11, 2004;

Resistive Elements Using Carbon Nanotubes (U.S. Pat. No. 7,365,632), filed Sep. 20, 2005; and Spin-Coatable Liquid for Formation of High Purity Nanotube Films (U.S. Pat. No. 7,375,369), filed Jun. 3, 2004.

This application is related to the following patent applications, which are assigned to the assignee of the application, and are hereby incorporated by reference in their entirety:

Methods of Making Carbon Nanotube Films, Layers, Fabrics, Ribbons, Elements, and Articles (U.S. patent application Ser. No. 10/341,005), filed Jan. 13, 2003;

High Purity Nanotube Fabrics and Films (U.S. patent application Ser. No. 10/860,332), filed Jun. 3, 2004;

Aqueous Carbon Nanotube Applicator Liquids and Methods for Producing Applicator Liquids Thereof (U.S. patent application Ser. No. 11/304,315), filed Dec. 15, 2005; and Anisotropic Nanotube Fabric Layers and Films and Methods of Forming Same (U.S. patent application Ser. No. 12/533,687), filed Jul. 31, 2009.

TECHNICAL FIELD

The present disclosure relates generally to nanotube fabric layers and films and, more specifically, to a method of controlling density, porosity and/or gap size within nanotube fabric layers and films.

BACKGROUND

Any discussion of the related art throughout this specification should in no way be considered as an admission that such art is widely known or forms part of the common general knowledge in the field.

Nanotube fabric layers and films are used in a plurality of electronic structures, and devices. For example, U.S. patent application Ser. No. 11/835,856 to Bertin et al., incorporated herein by reference in its entirety, teaches methods of using nanotube fabric layers to realize nonvolatile devices such as, but not limited to, block switches, programmable resistive elements, and programmable logic devices. U.S. Pat. No. 7,365,632 to Bertin et al., incorporated herein by reference, teaches the use of such fabric layers and films within the fabrication of thin film nanotube based resistors. U.S. patent application Ser. No. 12/066,063 to Ward et al., incorporated herein by reference in its entirety, teaches the use of such nanotube fabrics and films to form heat transfer elements within electronic devices and systems.

Through a variety of previously known techniques (described in more detail within the incorporated references) nanotube elements can be rendered conducting, non-conducting, or semi-conducting before or after the formation of a nanotube fabric layer or film, allowing such nanotube fabric layers and films to serve a plurality of functions within an electronic device or system. Further, in some cases the electrical conductivity of a nanotube fabric layer or film can be adjusted between two or more non-volatile states as taught in U.S. patent application Ser. No. 11/280,786 to Bertin et al., incorporated herein by reference in its entirety, allowing for such nanotube fabric layers and films to be used as memory or logic elements within an electronic system.

U.S. Pat. No. 7,334,395 to Ward et al., incorporated herein by reference in its entirety, teaches a plurality of methods for forming nanotube fabric layers and films on a substrate element using preformed nanotubes. The methods include, but are not limited to, spin coating (wherein a solution of nanotubes is deposited on a substrate which is then spun to evenly distribute said solution across the surface of said substrate), spray coating (wherein a plurality of nanotube are suspended within an aerosol solution which is then dispersed over a substrate), and dip coating (wherein a plurality of nanotubes are suspended in a solution and a substrate element is lowered into the solution and then removed). Further, U.S. Pat. No. 7,375,369 to Sen et al., incorporated herein by reference in its entirety, and U.S. patent application Ser. No. 11/304,315 to Ghenciu et al., incorporated herein by reference in its entirety, teach nanotube solutions well suited for forming a nanotube fabric layer over a substrate element via a spin coating process.

SUMMARY OF THE DISCLOSURE

The current disclosure relates to a method for controlling density, porosity and/or gap size within nanotube fabric layers and films.

In particular, the present disclosure provides a nanotube fabric layer including a plurality of individual nanotube elements where open regions between said individual nanotube elements within the nanotube fabric layer define gaps within said nanotube fabric layer and where the gaps are limited in physical dimension to be smaller than a threshold. In some embodiments, a nanotube switching device includes such a nanotube fabric layer.

The present disclosure also provides a nanotube fabric layer including a plurality of individual nanotube elements where open regions between said individual nanotube elements within said nanotube fabric layer define a porosity of said nanotube fabric layer and where said porosity is selected to provide a uniform density of individual nanotube elements within the nanotube fabric layer. In some embodiments, the nanotube fabric layer has a high porosity. In some embodiments, the nanotube fabric layer has a low porosity. In some embodiments, a nanotube switching device includes such a nanotube fabric layer.

The present disclosure also provides a method of preparing a nanotube application solution. The method first includes forming a raw nanotube application solution, this raw nanotube application solution comprising a first plurality of nanotube elements at a first concentration level and a second plurality of ionic particles at a second concentration level dispersed in a liquid medium. The method further includes adjusting at least one of the first concentration level of the first plurality of nanotube elements and the second concentration level of the second quantity of ionic particles such as to control the degree of rafting realized within a nanotube fabric layer formed using the nanotube application solution.

According to one aspect of the present disclosure, the first plurality of nanotube elements are carbon nanotubes.

Under another aspect of the present disclosure, the first plurality of nanotube elements are single walled carbon nanotubes.

Under another aspect of the present disclosure, the first plurality of nanotube elements are multi-walled carbon nanotubes.

Under another aspect of the present disclosure, the second plurality of ionic particles include ammonium nitrate salts.

Under another aspect of the present disclosure, the second plurality of ionic particles include ammonium formate.

Under another aspect of the present disclosure, the second plurality of ionic particles include ammonium acetate.

Under another aspect of the present disclosure, the second plurality of ionic particles include ammonium carbonate.

Under another aspect of the present disclosure, the second plurality of ionic particles include ammonium bicarbonate. ionic organic species, and ionic polymers Under another aspect of the present disclosure, the second plurality of ionic particles include ionic organic species.

Under another aspect of the present disclosure, the second plurality of ionic particles include ionic polymers.

Under another aspect of the present disclosure, the second plurality of ionic particles include inorganic salts.

Under another aspect of the present disclosure, the liquid medium is an aqueous solution.

Under another aspect of the present disclosure, the liquid medium is a nitric acid solution.

Under another aspect of the present disclosure, the liquid medium is a sulfuric acid solution.

Under another aspect of the present disclosure, the concentration level of nanotube elements within the nanotube application solution is increased in order to promote rafting in a nanotube fabric layer formed with such a solution.

Under another aspect of the present disclosure, the concentration level of nanotube elements within the nanotube application solution is decreased in order to discourage rafting in a nanotube fabric layer formed with such a solution.

Under another aspect of the present disclosure, the concentration level of ionic particles within the nanotube application solution is decreased in order to promote rafting in a nanotube fabric layer formed with such a solution.

Under another aspect of the present disclosure, the concentration level of ionic particles within the nanotube application solution is increased in order to discourage rafting in a nanotube fabric layer formed with such a solution.

Other features and advantages of the present invention will become apparent from the following description of the invention which is provided below in relation to the accompanying drawings.

BRIEF DESCRIPTION OF THE DRAWINGS

FIG. 21 is a table of cations and anions which can be used to form a plurality of ionic species well-suited for use with the methods of the present disclosure;

FIG. 25 is a table summarizing the data and results presented in examples 10-23;

DETAILED DESCRIPTION

Figure 1:
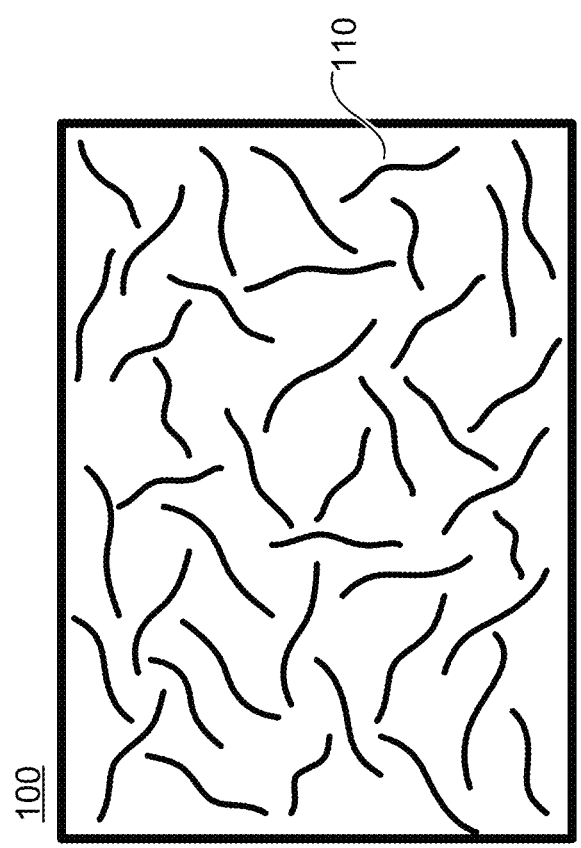
FIG. 1 is an illustration depicting a nanotube fabric layer exhibiting essentially no rafting of the individual nanotube elements.

The present disclosure teaches methods to increase or reduce the number of nanotube elements in a given area of nanotube fabric layers and films. These approaches can selectively create high density, low porosity nanotube fabrics in a controlled way. In this manner, for example, nanotube fabrics may be created in which essentially all gaps or pores between nanotubes within the fabric are no larger than a predetermined size. This is particularly useful for devices with extremely small circuit sizes in which a uniform dispersion of nanotubes is desired. For example, when a fabric with a high density and low porosity is patterned and etched, the remaining nanotube article is effectively assured of containing nanotubes as opposed to lacking nanotubes as a result of a large pore in the fabric. As the feature sizes decrease along with currently practiced lithography techniques, minimizing the porosity becomes more important to ensure a higher yield of functional circuit elements as the fabric is being etched. For example, the high density, low porosity fabrics can have nanotube free regions, i.e., pores that are less than the size of the small circuits according to the current lithography techniques (e.g., pores that are less than about 10 nm). Thus, the density or pore size is controlled such that the minimum number of nanotube elements required for operation can be utilized in a critical feature size of current lithography techniques, (e.g. 20 nm or less) which can be less than 20 nm.

Conversely, the methods can be used to create highly porous, low density fabrics, if so desired. For example, it may desirable to have a nanotube fabric where the nanotubes are dispersed to increase the optical transparency of the nanofabric. In other applications, where a thicker fabric, formed of multiple layers of nanotube fabrics, is desired, it may be preferable to limit the concentration of nanotubes to reduce cost and the electrical resistance of the fabric. Further, for low density and high porosity fabrics, it is also important that the nanotubes be dispersed in a uniform manner across the fabric.

Fabric porosity and density may be controlled in a variety of ways including, but not limited to, techniques for controlling rafting within the nanotube fabric. These fabrics can then be used in nanotube switching devices.

As described within U.S. Pat. No. 7,375,369 to Sen et al. and U.S. patent application Ser. No. 11/304,315 to Ghenciu et al., both incorporated herein by reference in their entirety, nanotube fabrics and films can be formed by applying a nanotube application solution (for example, but not limited to, a plurality of individual nanotube elements suspended within an aqueous solution) over a substrate element. A spin coating process, for example, can be used to evenly distribute the nanotube elements over the substrate element, creating a substantially uniform layer of nanotube elements. In other cases, other processes (such as, but not limited to, spray coating processes or dip coating processes) can be used to apply and distribute the nanotube elements over the substrate element.

It should be noted that nanotube elements used and referenced within the embodiments of the present disclosure may be single walled nanotubes, multi-walled nanotubes, or mixtures thereof and may be of varying lengths. Further, the nanotubes may be conductive, semiconductive, or combinations thereof.

Within many applications it is desirable to control the porosity of a nanotube fabric layer as it is formed—that is, to control how closely packed together or sparsely distributed the individual nanotube elements within the fabric layer are. In one example, a high porosity uniform nanotube fabric may have voids—that is gaps in the fabric between individual nanotube elements—on the order of 50 nm in size. In another example, a low porosity uniform nanotube fabric layer may have voids on the order of 10 nm in size.

In some applications the sheet resistance of a nanotube fabric layer may be controlled by controlling the porosity of the nanotube fabric layer, or a density of nanotubes in the fabric, along with other variables (such as, but not limited to, the length of the individual nanotube elements within the fabric and the thickness of the nanotube fabric layer). By controlling the porosity of a nanotube fabric layer, such a fabric layer can be reliably tuned to have a sheet resistance from about 1 k-Ohm/square to about 1 M-Ohm/square.

In another applications by limiting the porosity of a nanotube fabric layer the density of an array of nanotube switching devices may be increased. U.S. patent application Ser. No. 11/280,786 to Bertin et al., incorporated herein by reference in its entirety, teaches a nonvolatile two terminal nanotube switch structure having (in at least one embodiment) a nanotube fabric article deposited between two electrically isolated electrode elements. As Bertin teaches, by placing different voltages across said electrode elements, the resistive state of the nanotube fabric article can be switched between a plurality of nonvolatile states. That is, in some embodiments the nanotube fabric article can be repeatedly switched between a relatively high resistive state (resulting in, essentially, an open circuit between the two electrode elements) and a relatively low resistive state (resulting in, essentially, a short circuit between the two electrode elements).

The fabrication of an array of such nanotube switching devices can include patterning of a nanotube fabric layer to realize a plurality of these nanotube fabric articles. The porosity of a nanotube fabric layer—or more specifically the size of the voids within a nanotube fabric layer—can limit the feature size to which these nanotube fabric articles can be patterned. For example, to fabricate a nanotube switching device array wherein the individual nanotube switching devices are on the order of 20 nm square (that is, the nanotube fabric article within each device is essentially 20 nm by 20 nm), the porosity of the nanotube fabric array may need to be such that voids within the nanotube fabric layer are on the order of 10 nm. In this way, the fabrication of highly dense nanotube memory arrays (wherein the individual nanotube switching elements within the array are patterned at a sub 20 nm geometry, for example) can require highly dense (that is, less porous with void sizes on the order of 10 nm or less) nanotube fabric layers.

One method of controlling the porosity of a nanotube fabric layer is to control the degree of rafting—that is, the percentage of nanotube elements within the fabric layer which tend to bundle together along their sidewalls—within the nanotube fabric layer. By controlling certain parameters during the formation of a nanotube fabric layer, a nanotube fabric layer can be formed which is highly rafted (and, consequently, highly dense—for example, with voids on the order of 10 nm), moderately rafted (and, consequently, marginally dense—for example, with voids on the order of 25 nm), or substantially free from rafts (and consequently, highly porous—for example with voids on the order of 50 nm).

FIG. 1 depicts a nanotube fabric layer 100 which is substantially free of rafts. As described above, within such a fabric layer individual nanotube elements 110 are formed into a uniform highly porous fabric wherein the individual nanotube elements are arranged in substantially random orientations. For example, the voids within such a fabric layer 100 might range between 25 nm and 50 nm, corresponding to a sheet resistance between about 1000 k-Ohm/square to 1 M-Ohm/square within a single fabric layer. A thicker fabric layer may be formed with substantially the same porosity by applying (through multiple spin coating operations, for example) multiple fabric layers over the nanotube fabric layer 100 illustrated in FIG. 1.

Figure 2A:
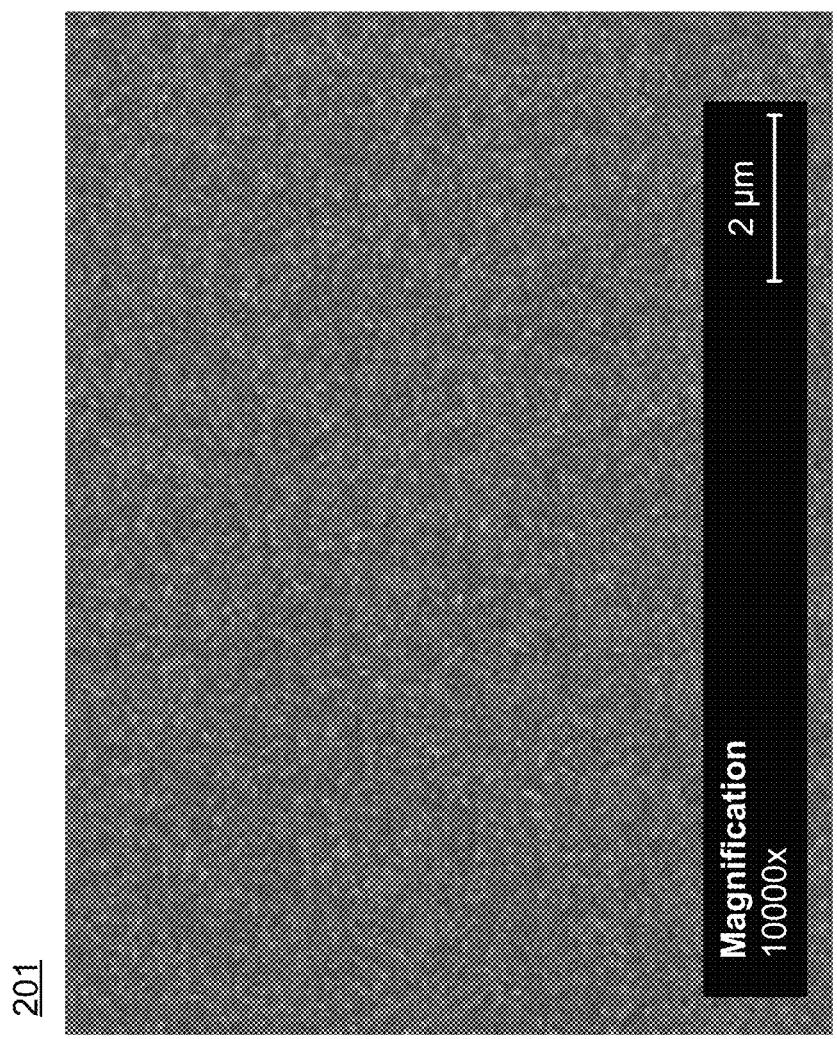
FIGS. 2A-2B are SEM images (at different magnifications) of a nanotube fabric layer exhibiting essentially no rafting of the individual nanotube elements.
Figure 2B:
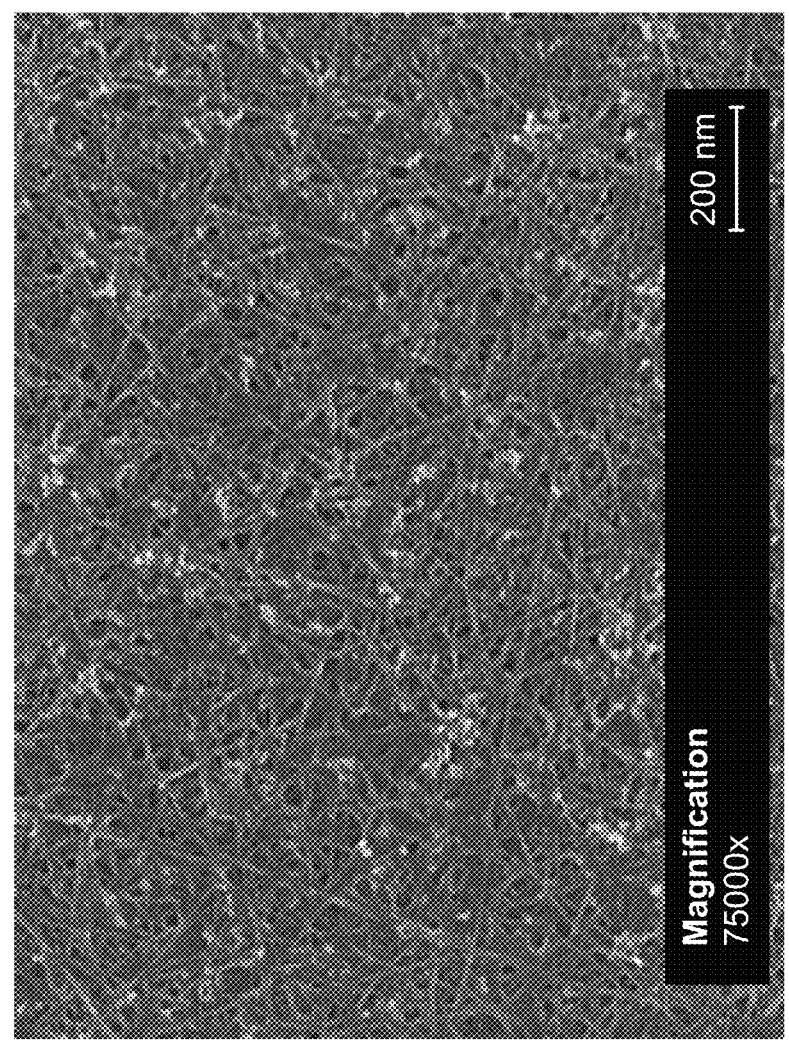

FIGS. 2A and 2B are SEM images depicting an exemplary nanotube fabric layer (201 and 202, respectively) substantially free of rafts and analogous to the nanotube fabric layer 100 depicted in FIG. 1. FIG. 2A shows the nanotube fabric layer 201 at a 10,000× magnification, and FIG. 2B shows the nanotube fabric layer 202 at a 75,000× magnification. Within both images, the random orientation—and essentially complete lack of rafting—is evident within the exemplary nanotube fabric layer.

Figure 3:
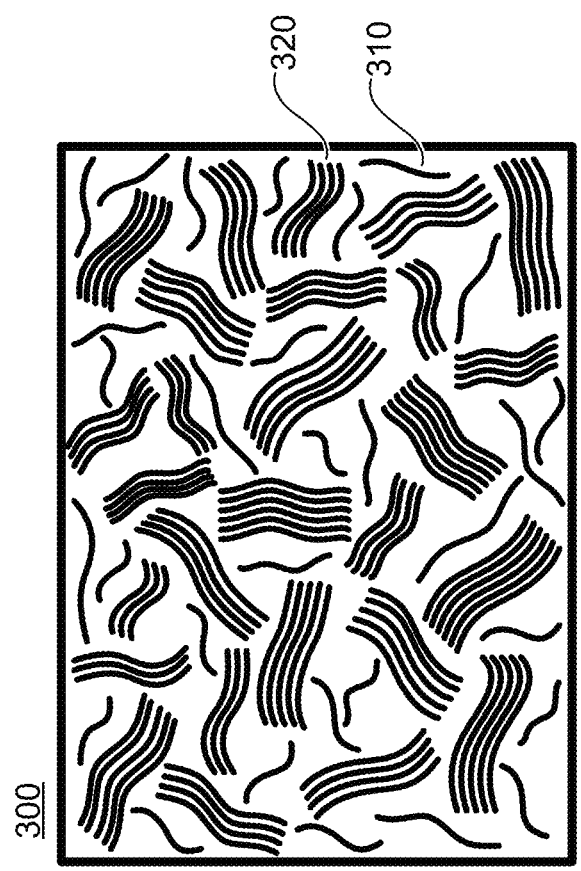
FIG. 3 is an illustration depicting a nanotube fabric layer exhibiting substantial rafting of the individual nanotube elements, according to one or more embodiments of the present disclosure.

FIG. 3 depicts a nanotube fabric layer 300 which includes a moderate number of rafted nanotube bundles 320 as well as a number of unbundled nanotube elements 310. Within such a fabric layer, individual nanotube elements within the rafted bundles 320 are packed tightly together such as to minimize the porosity within that region of the nanotube fabric layer 300. In this way, the nanotube fabric layer 300 is significantly denser as compared to the fabric layer 100 illustrated in FIG. 1. For example, the voids within such a fabric layer 300 might range between 10 nm and 20 nm, corresponding to a sheet resistance between about 10 k-Ohm/square to 100 k-Ohm/square within a single fabric layer. A thicker fabric layer may be formed with substantially the same porosity by applying (through multiple spin coating operations, for example) multiple fabric layers over the nanotube fabric layer 300 illustrated in FIG. 3.

Figure 4A:
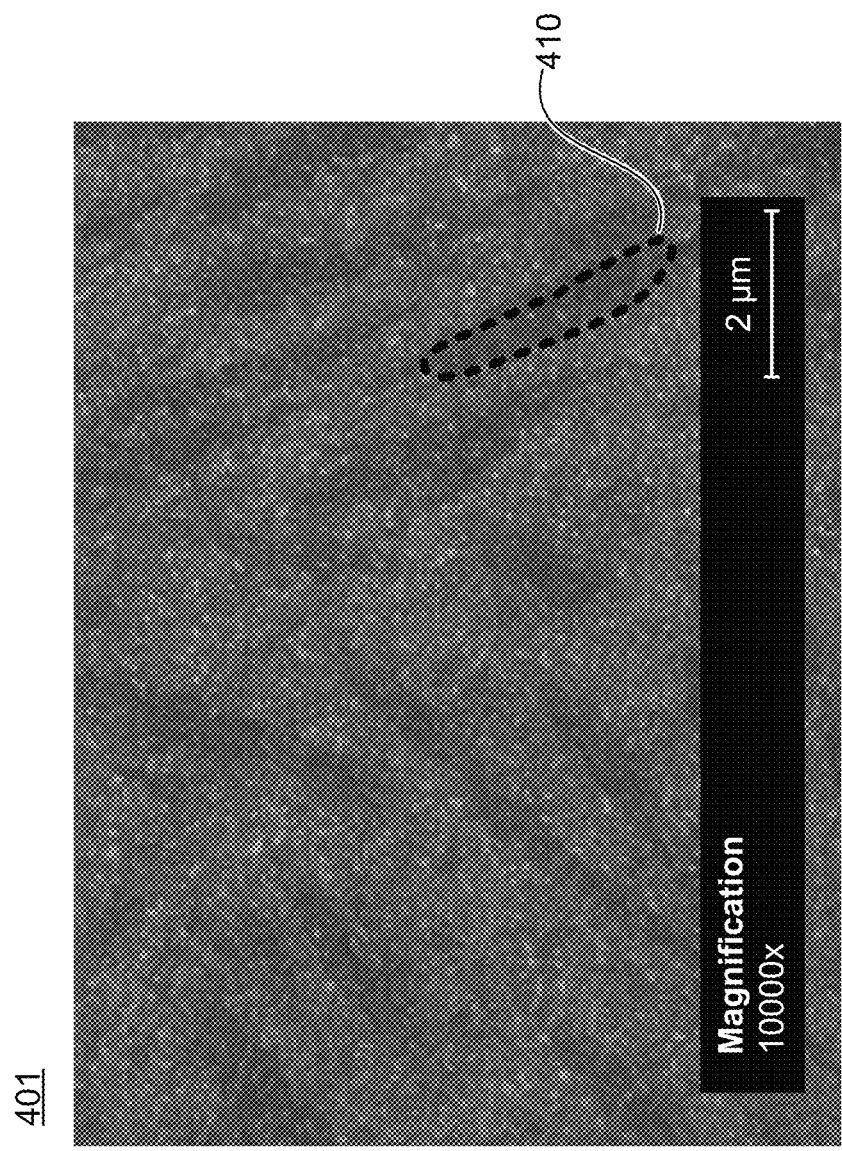
FIGS. 4A-4B are SEM images (at different magnifications) of a nanotube fabric layer exhibiting substantial rafting of the individual nanotube elements, according to one or more embodiments of the present disclosure.
Figure 4B:
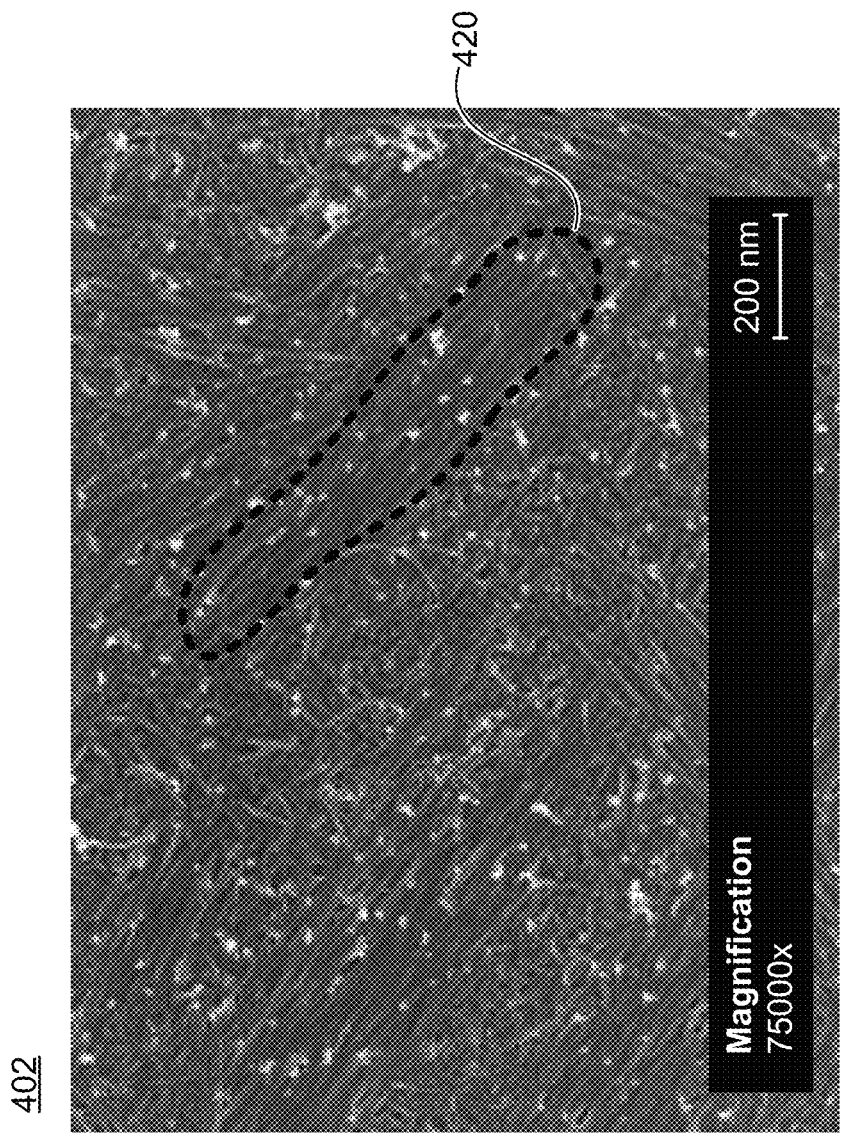

FIGS. 4A and 4B are SEM images depicting an exemplary nanotube fabric layer (401 and 402, respectively) which exhibits a moderate amount of rafting and is analogous to the nanotube fabric layer 300 depicted in FIG. 3. FIG. 4A shows the nanotube fabric layer 401 at a 10,000× magnification, and FIG. 4B shows the nanotube fabric layer 402 at a 75,000× magnification. Within both images, the randomly oriented bundles of rafted nanotube elements (410 and 420, respectively) are evident within the exemplary nanotube fabric layer.

In some cases, rafting of individual nanotube elements can occur because during the formation of a nanotube fabric layer groups of nanotube elements bundle together along their sidewalls due to van der Waals interactions (atomic level forces between the individual nanotube elements) or through JI-JI interactions (a stacking effect due to the presence of a free electrons in the JI-orbitals along the nanotube structure). Within an application solution—that is, a dispersion of individual nanotube elements within a liquid medium—the van der Waals and JI-JI interactions can be promoted or discouraged by the presence of certain ionic species within the solution. Such ionic species include, but are not limited to, ammonium salts, nitrate salts, ammonium nitrate salts, ammonium formate, ammonium acetate, ammonium carbonate, ammonium bicarbonate, ionic organic species, ionic polymers, and inorganic salts. A high concentration of such ionic species within the application solution (for example, on the order of 20 ppm or more ammonium nitrate salts within an aqueous nanotube application solution) will tend to interfere with these interactions and thereby reduce the degree of rafting within a nanotube fabric layer formed with such an application solution. Conversely, a low concentration of such ionic species within the application solution (for example, on the order of 10 ppm or less ammonium nitrate salts within an aqueous nanotube application solution) will tend to allow a plurality of these rafted bundles to form within a nanotube fabric layer.

It should be noted that this rafting effect—wherein a plurality of nanotube elements bundle together along their sidewalls to realize an orderly raft like structure—is different from the so-called clumping defects described within U.S. patent application Ser. No. 11/304,315 to Ghenciu et al., the entire disclosure of which is hereby incorporated by reference. The clumping defects described by Ghenciu are the result of precipitation or aggregation of the individual nanotube elements within the solution and are characterized by individual nanotube elements twisting around each other and bundling into clump like structures within the application solution. Such undesirable clumping defects can result in non-uniform and non-planar nanotube fabric layers. Conversely, as described by the present disclosure, a rafted nanotube fabric can remain, in most cases, substantially uniform and thus can be employed to control the density of a nanotube fabric layer. Further, the rafts described herein are essentially two dimensional nanotube structures, i.e., the height of the raft is generally one nanotube thick. The clumping defects referenced in Ghenciu generally result in three dimensional nanotube clumps.

Rafting also can be promoted (or discouraged) by controlling the concentration of nanotube elements with an application solution—that is, by controlling the number of individual nanotube elements per unit volume present within the applicator liquid. Van der Waals interactions between closely situated nanotube elements within a highly concentrated application solution (for example, an application solution with an optical density on the order of 35) can tend to increase the incidence of rafting within a nanotube fabric layer formed with such a solution. Conversely, an application solution with a relatively low concentration of nanotube elements (for example, an application solution with an optical density on the order of 10) can significantly reduce the opportunity for these van der Waals interactions and result in less rafting. It should be noted that optical density (a spectrographic technique well known to those skilled in the art) is typically used to characterize the density of nanotube elements within an application solution. The technique relies on measuring the amount of light absorbed by a nanotube application solution—essentially the light absorbed by the individual nanotube elements within such a solution—to determine the concentration of nanotube elements dispersed in the solution. For example, a solution with an optical density of 30 corresponds to approximately 0.1% concentration (by weight) of nanotube elements within the solution.

The use of these two parameters (the concentration of an ionic species within the application solution and nanotube concentration within the application solution) to control the degree of rafting within a nanotube fabric layer is illustrated in the exemplary nanotube fabric layers depicted in FIGS. 7A-7C, 8A-8C, 9A-9C, 10A-10C, and 11A-11C and described in detail within the discussion of those figures.

In addition, within certain applications other parameters of a nanotube application solution may contribute to the degree to which a nanotube fabric layer formed with that solution will raft. Such parameters include, but are not limited to, the presence of other carbon allotropes (for example, amorphous carbon), the temperature of the application solution as it is applied to the surface of a wafer or other substrate, the chemical composition of the liquid medium used, the method used for depositing the application solution to the surface of a wafer or other substrate, and the acidity of the solution.

Figure 5:
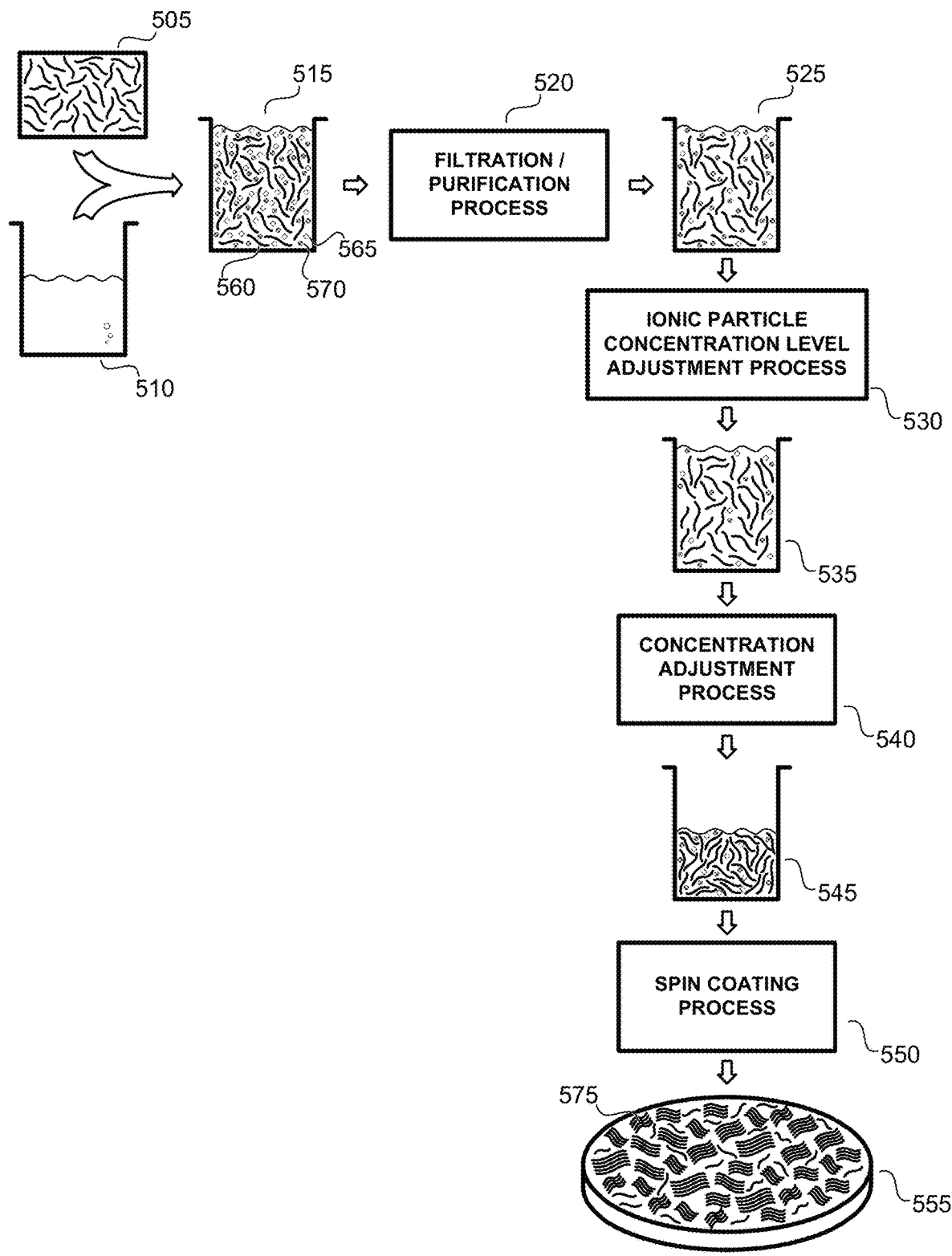
FIG. 5 is a process diagram illustrating a method according to the present disclosure of preparing a nanotube application solution such as to form a highly rafted nanotube fabric layer.

FIG. 5 illustrates an exemplary application solution preparation process according to the methods of the present disclosure which is well suited for forming a rafted nanotube fabric layer.

At the start of the application solution preparation process illustrated in FIG. 5, a plurality of individual nanotube elements 505 is dispersed into a liquid medium 510 (such as, but not limited to, an aqueous solution, a sulfuric acid solution, or a nitric acid solution) to form raw nanotube application solution 515. Raw nanotube application solution 515 includes a plurality of individual nanotube elements 560, a plurality of impurities (such as, but not limited to, residual metallic catalyst particles, amorphous carbon particles, and other carbonaceous impurities) 565, and a concentration of an ionic particles 570 (such as, but not limited to, ammonium salts, nitrate salts, ammonium nitrate salts, ammonium formate, ammonium acetate, ammonium carbonate, ammonium bicarbonate, ionic organic species, ionic polymers, and inorganic salts). The raw nanotube application solution 515 is then passed through a filtration/purification process 520 which removes a significant percentage of impurities 565 to realize purified nanotube application solution 525. A typical filtration/purification process 520 also can remove a percentage of the ionic particles 570 within raw nanotube application solution 515, as is shown in the graphic representation of the purified nanotube application solution 525 in FIG. 5.

A typical purified nanotube application solution 525 can include less than $1 \times 10^{18}$ atoms/cm$^3$ of impurities 565 and be substantially free of particle impurities 565 having a diameter of greater than about 500 nm. It also can include a nanotube concentration of 100 mg/l (a nanotube concentration well suited for memory and logic applications). This typical purified nanotube application solution 525 might also include an ionic species of ammonium nitrate salt at a concentration of about 15 ppm.

The formation and purification of nanotube application solutions (such as described above) is taught in U.S. Pat. No. 7,375,369 to Sen et al. as well as U.S. patent application Ser. No. 11/304,315 to Ghenciu et al. Within both references, a plurality of filtration/purification processes are detailed, including cross flow filtration, nitric acid treatment, hydrochloric acid treatment, and high speed centrifugation.

Within the exemplary process detailed in FIG. 5, the purified nanotube application solution 525 is then passed through an ionic particle concentration level adjustment process 530 which further reduces the concentration of ionic particles 570 within the purified application solution 530 resulting in intermediate application solution 535. For an exemplary ionic species of ammonium nitrate salts, this intermediate application solution 535 can have an ionic particle concentration level of less than 10 ppm. This ionic particle concentration level adjustment process 530 may be realized through an additional filtering process (such as, but not limited to, a cross flow filtration process, a sonication filtration process, and a centrifugation filtration process).

In a next process step, intermediate application solution 535 is passed through a nanotube concentration adjustment process 540, which increases the concentration of nanotube elements within the intermediate application solution 535 resulting in a final application solution 545, which is well suited for forming a rafted nanotube fabric layer. For example, the nanotube application solution can be adjusted such that final application solution 545 possesses an optical density on the order of 35. Typically such a nanotube concentration adjustment process 540 is realized by removing a volume of the liquid medium 510 from the solution, though the methods of the present disclosure are not limited in this regard.

Within the exemplary process detailed in FIG. 5, a spin coating process 550 is used to apply final nanotube application solution 545 over a silicon wafer to realize rafted nanotube fabric layer 555 wherein a plurality of rafted bundles of nanotube elements 575 are distributed throughout the fabric layer.

In this way a purified nanotube application solution 525 (prepared according to the methods taught by Sen and Ghenciu) is rendered into an application solution 545 well suited for forming a rafted nanotube fabric layer by reducing the concentration of ionic particles within the original purified solution in one operation and by increasing the concentration of nanotube elements within the solution in a second operation.

It should be noted that while the exemplary process detailed in FIG. 5 describes a specific nanotube application solution process in order to illustrate the methods of the present disclosure, the methods of the present disclosure are not limited to this specific example. For example, within some applications the order of the ionic particle concentration level adjustment process 530 and the nanotube concentration adjustment process 540 can be reversed (that is, the application solution first increased in nanotube concentration and then reduced in ionic particle concentration). Further, within some applications the ionic particle concentration level adjustment process 530 may be removed altogether and the nanotube concentration adjustment process 540 used alone to sufficiently render purified nanotube application solution 525 into a solution well suited for forming a rafted nanotube fabric layer. Within still other applications, the nanotube concentration adjustment process 540 may be removed altogether and the ionic particle concentration level adjustment process used alone to sufficiently render purified nanotube application solution 525 into a solution well suited for forming a rafted nanotube fabric layer.

Figure 6:
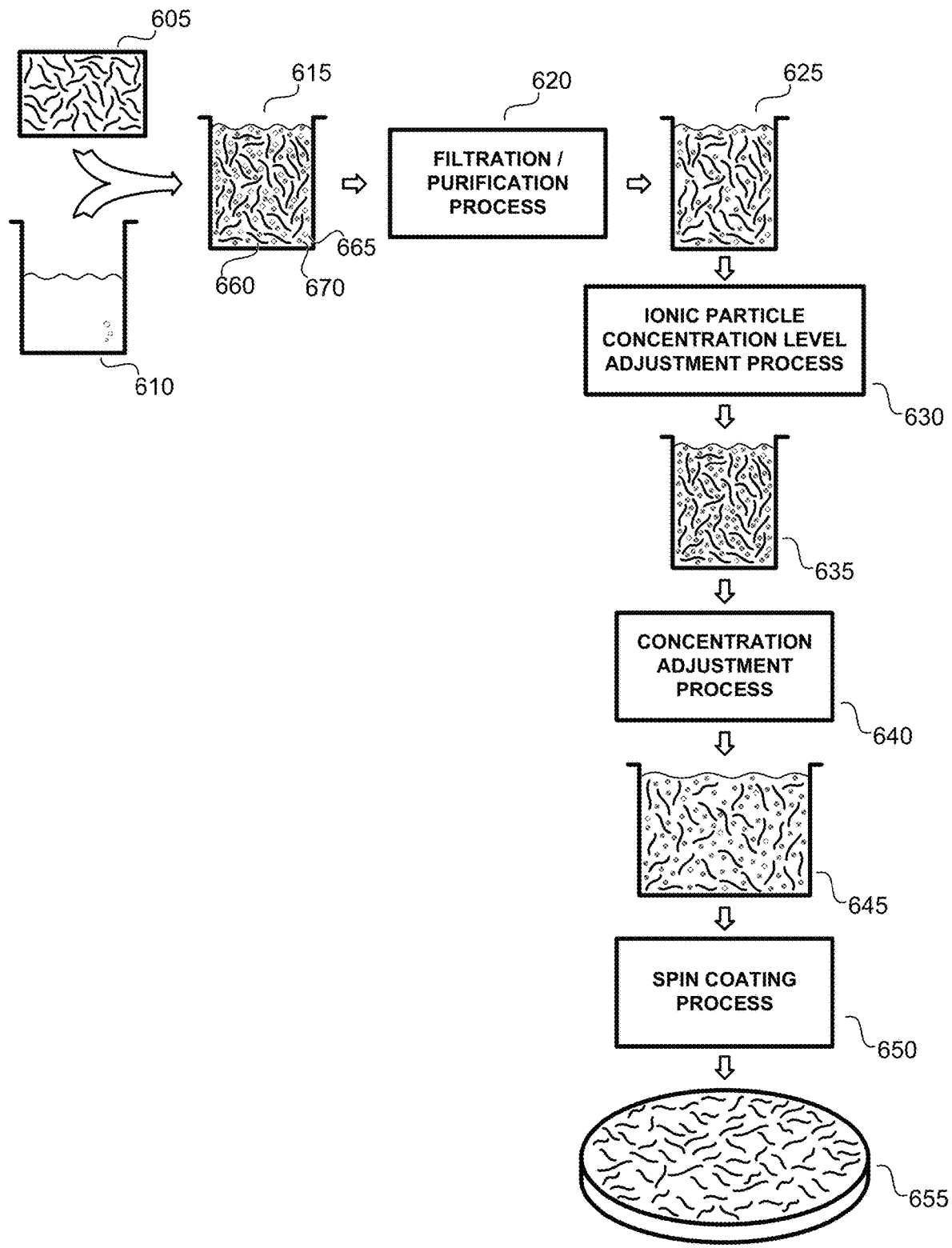
FIG. 6 is a process diagram illustrating a method according to the present disclosure of preparing a nanotube application solution such as to form a substantially non-rafted nanotube fabric layer.

FIG. 6 illustrates an exemplary application solution preparation process according to the methods of the present disclosure which is well suited for forming a nanotube fabric layer substantially free of rafted bundles of nanotube elements.

At the start of the application solution preparation process illustrated in FIG. 6, a plurality of individual nanotube elements 605 is dispersed into a liquid medium 610 (such as, but not limited to an aqueous solution, a sulfuric acid solution, or a nitric acid solution) to form raw nanotube application solution 615. Raw nanotube application solution 615 includes a plurality of individual nanotube elements 660, a plurality of impurities (such as, but not limited to, residual metallic catalyst particles, amorphous carbon particles, and other carbonaceous impurities) 665, and a concentration of ionic particles 670 (such as, but not limited to, ammonium salts, nitrate salts, ammonium nitrate salts, ammonium formate, ammonium acetate, ammonium carbonate, ammonium bicarbonate, ionic organic species, ionic polymers, and inorganic salts). The raw nanotube application solution 615 is then passed through a filtration/purification process 620 which removes a significant percentage of impurities 665 to realize purified nanotube application solution 625. A typical filtration/purification process 620 can remove a percentage of the ionic particles 670 within raw nanotube application solution 615, as is shown in the graphic representation of the purified nanotube application solution 625 in FIG. 6.

A typical purified nanotube application solution 625 can include less than $1 \times 10^{18}$ atoms/cm$^3$ of impurities 665 and be substantially free of particle impurities 665 having a diameter of greater than about 500 nm. It also can have a nanotube concentration of 100 mg/l (a nanotube concentration well suited for memory and logic applications). This typical purified nanotube application solution 625 also can include an ionic species of ammonium nitrate salt at a concentration of about 15 ppm.

The formation and purification of nanotube application solutions (such as described above) is taught in U.S. Pat. No. 7,375,369 to Sen et al. as well as U.S. patent application Ser. No. 11/304,315 to Ghenciu et al. Within both references, a plurality of filtration/purification processes are detailed, including cross flow filtration, nitric acid treatment, hydrochloric acid treatment, and high speed centrifugation.

Within the exemplary process detailed in FIG. 6, the purified nanotube application solution 625 is then passed through an ionic particle concentration level adjustment process 630 which increases the concentration of ionic particles 670 within the purified application solution 625 resulting in intermediate application solution 635. For an exemplary ionic species of ammonium nitrate salts, this intermediate application solution 535 can include an ionic particle concentration level of greater than 30 ppm. This ionic particle concentration level adjustment process 625 can be realized through the introduction of an additional quantity of ionic particles 670 into the purified application solution 625.

In a next process step, intermediate application solution 635 is passed through a nanotube concentration adjustment process 640, which decreases the concentration of nanotube elements within intermediate application solution 635 resulting in a final application solution 645, which is well suited for forming a nanotube fabric layer substantially free of rafted bundles of nanotube elements. For example the nanotube application solution can be adjusted such that final application solution 645 possesses an optical density on the order of 10. Typically, such a nanotube concentration adjustment process 640 can be realized by adding an additional volume of the liquid medium 610 into the solution, though the methods of the present disclosure are not limited in this regard.

Within the exemplary process detailed in FIG. 6, a spin coating process 650 is used to apply final nanotube application solution 645 over a silicon wafer to realize nanotube fabric layer 655 which is substantially free of rafted bundles of nanotube elements.

In this way a purified nanotube application solution 625 (prepared according to the methods taught by Sen and Ghenciu) is rendered into an application solution 645 well suited for forming a nanotube fabric layer substantially free of rafted bundles of nanotube elements by increasing the concentration of ionic particles within the original purified solution in one operation and by decreasing the concentration of nanotube elements within the solution in a second operation.

It should be noted that while the exemplary process detailed in FIG. 6 describes a specific nanotube application solution process in order to illustrate the methods of the present invention, the methods of the present invention are not limited to this specific example. Indeed, within some applications the order of the ionic particle concentration level adjustment process 630 and the nanotube concentration adjustment process 640 can be reversed (that is the application solution first decreased in nanotube concentration and then increased in ionic particle concentration). Further, within some applications the ionic particle concentration level adjustment process 630 may be removed altogether and the nanotube concentration adjustment process 640 used alone to sufficiently render purified nanotube application solution 625 into a solution well suited for forming a nanotube fabric layer substantially free from rafted bundles of nanotube elements. Within still other applications, the nanotube concentration adjustment process 640 may be removed altogether and the ionic particle concentration level adjustment process used alone to sufficiently render purified nanotube application solution 625 into a solution well suited for forming a nanotube fabric layer substantially free from rafted bundles of nanotube elements.

The following examples describe the formation of several nanotube fabric layers (with varying degrees of rafting) according to the methods of the present disclosure. Within each example, a purified nanotube application solution was first realized through the methods taught by Ghenciu in U.S. patent application Ser. No. 11/304,315 (and described in the discussions of FIGS. 5 and 6). This purified nanotube application solution was then adjusted as specified in each example to realize a specific nanotube concentration and ionic particle concentration level. Within each example the ionic species adjusted was ammonium nitrate salts. The resulting solution was then deposited on a four inch Si/SiO$_2$ wafer via a spin coating operation. For all examples, the nanotube concentration is measured in terms of optical density (a spectrographic technique well known to those skilled in the art), and the ammonium nitrate salt concentration is measured in parts-per-million (ppm) with respect to the solution.

Figure 7:
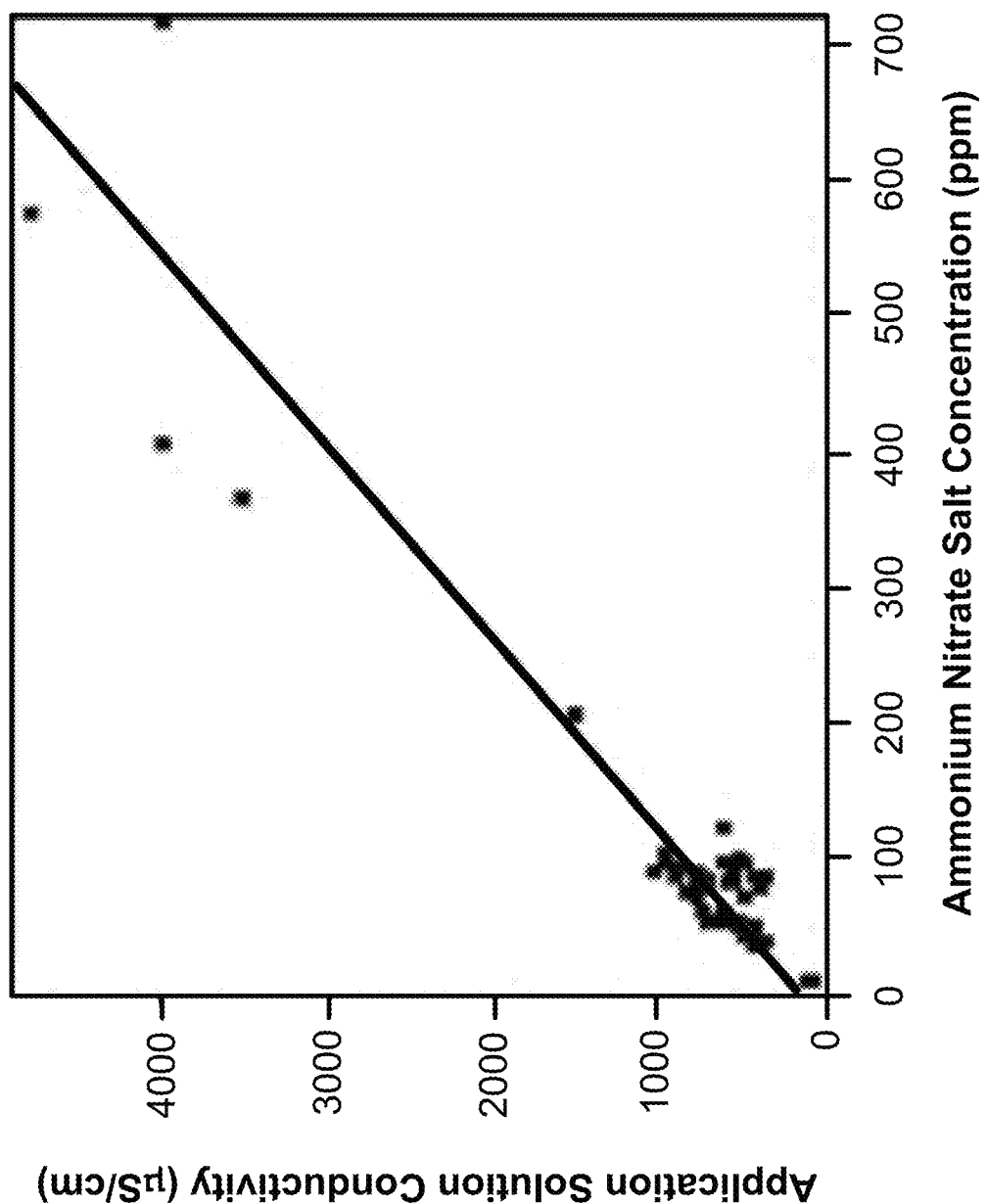
FIG. 7 is a graph plotting conductivity readings (measured in $\mu S/cm$) vs. ammonium nitrate salt levels (measure in ppm) taken on a plurality of nanotube application solutions.

It should be noted that while the following examples specify the level of ammonium nitrate salt (the exemplary ionic species used in each of the examples) in terms of ppm, another methods of tracking an ionic species concentration level may prove more convenient for some applications. FIG. 7 is a graph plotting the conductivity (measured in μS/cm) of a plurality of nanotube application solutions against the concentration level (measured in ppm) of ammonium nitrate salts in each application solution. As can be observed in FIG. 7, the conductivity of these application solutions will tend to track the concentration of ammonium nitrate salts dispersed in each. For example, within the application solutions used in the following example, a conductivity reading of approximately 700 μS/cm or higher would indicate that an application solution would be likely to promote rafting. Conversely, a conductivity reading of approximately 500 μS/cm or lower would indicate that an application solution would be likely to discourage rafting. As such, it may be convenient within some applications of the methods of the present disclosure to track and adjust the conductivity of a nanotube application solution instead of the concentration level of a particular ionic species within that application solution.

For all examples, the spin coating operation was as follows. A raw wafer was pre-baked on a 300° C. hot plate for five minutes. Approximately 3 ml of the adjusted solution was dispensed onto the wafer via a plastic pipette while the wafer was rotated at 60 rpm. After thirty seconds, the spin speed was increased to 500 rpm for two seconds, then subsequently reduced to fifty rpm for 180 seconds, and finally increased to 2000 rpm for twenty seconds. The wafer (now coated with the application solution) was then placed on a 300° C. hot plate for two minutes. After a cool down cycle, the entire process was repeated again twice such as to apply three coats of the application solution over the wafer.

For the application solutions used in the following examples it was found that generally an ammonium nitrate salt concentration level of 10 ppm or lower would tend to result in a highly rafted fabric. It was further found that generally an ammonium nitrate salt concentration level of 20 ppm or more would tend to result in fabric layers with lower incidences of rafting. Applications solutions with ammonium nitrate salt concentration levels between these ranges were found to result in fabric layers with moderate rafting.

Further, for the application solutions used in the following examples it was found that generally an optical density of approximately 10 or lower would tend to result in fabric layers with low incidences of rafting. It was further found that generally an optical density of 30 or more would tend to result in fabric layers with very high incidences of rafting. Applications solutions with optical densities between these ranges were found to result in fabric layers with moderate rafting.

Example 1

Figure 8A:
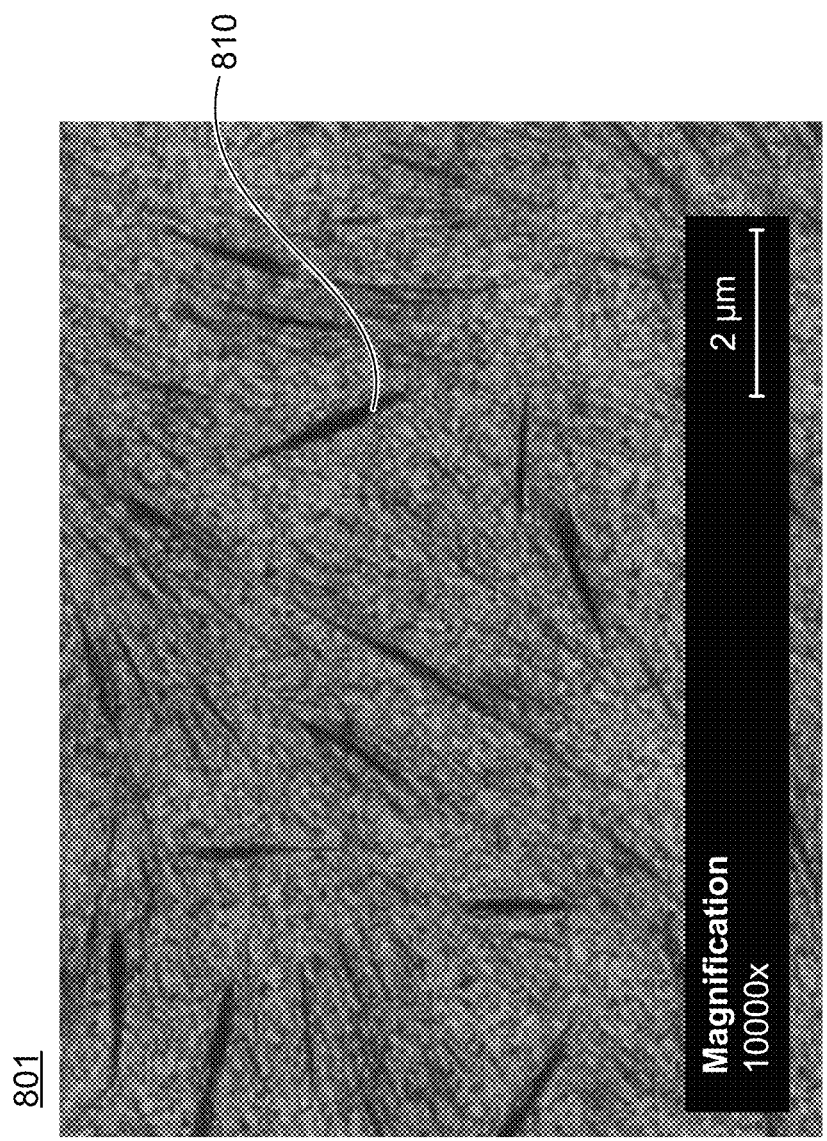
FIGS. 8A-8C are SEM images (at increasing magnifications) of an exemplary nanotube fabric layer formed according to the methods of the present disclosure which exhibits approximately 11.6% rafting.
Figure 8B:
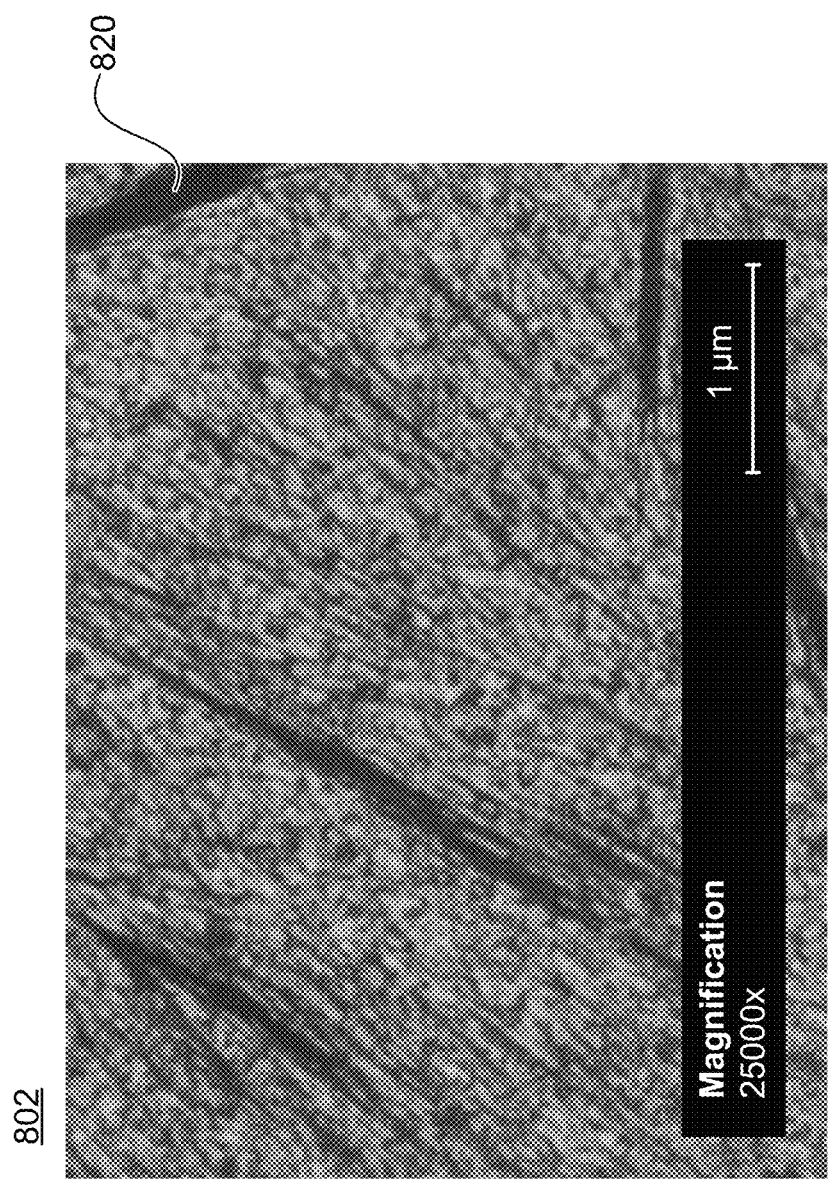
Figure 8C:
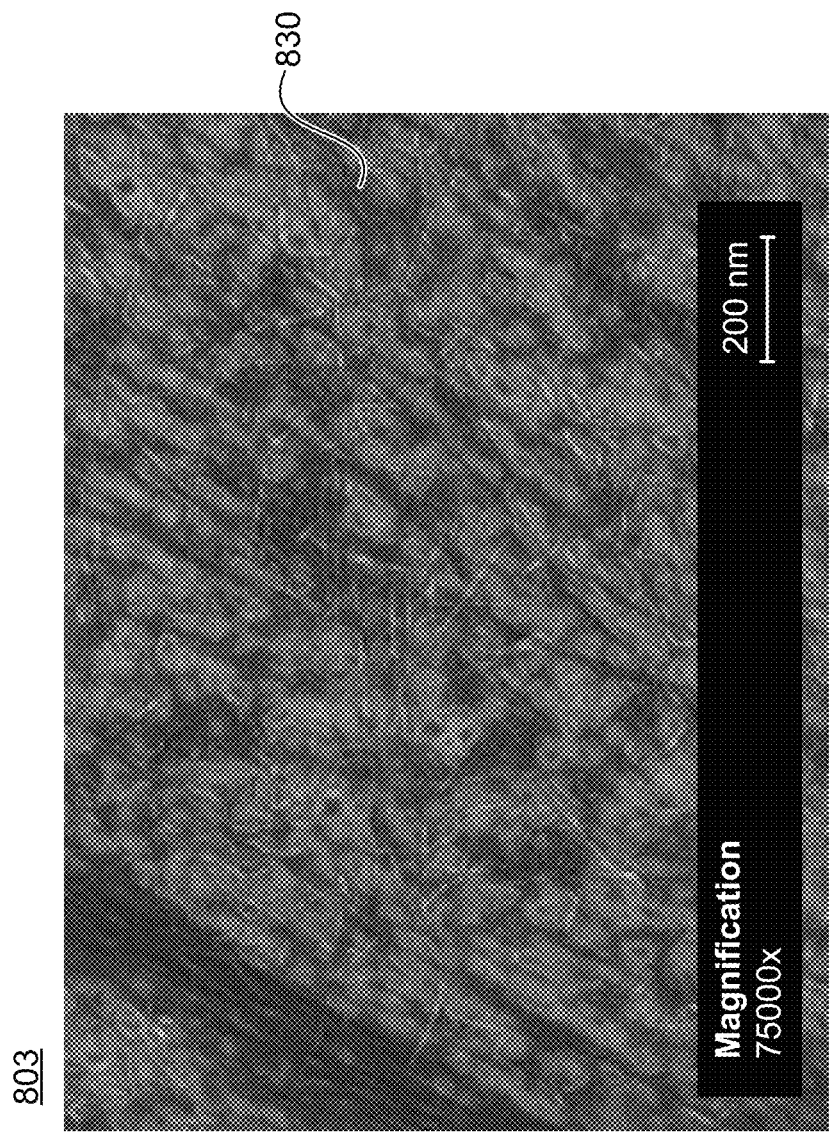

FIGS. 8A-8C are SEM images of an exemplary nanotube fabric layer at different magnifications (801, 802, and 803 respectively) prepared according to the methods of the present disclosure. The nanotube fabric layer depicted in FIGS. 8A-8C was rendered from an application solution with an optical density of 19.11 and an ammonium nitrate salt concentration of 16 ppm. These parameters resulted in a moderate amount of rafting within the nanotube fabric layer (801, 802, 803). Analysis of the entire nanotube fabric layer showed that approximately 11.6% of the fabric (by area) was comprised of rafted bundles of nanotube elements. These rafted bundles of nanotube elements are evident in FIG. 8A (810), FIG. 8B (820), and FIG. 8C (830).

Example 2

Figure 9A:
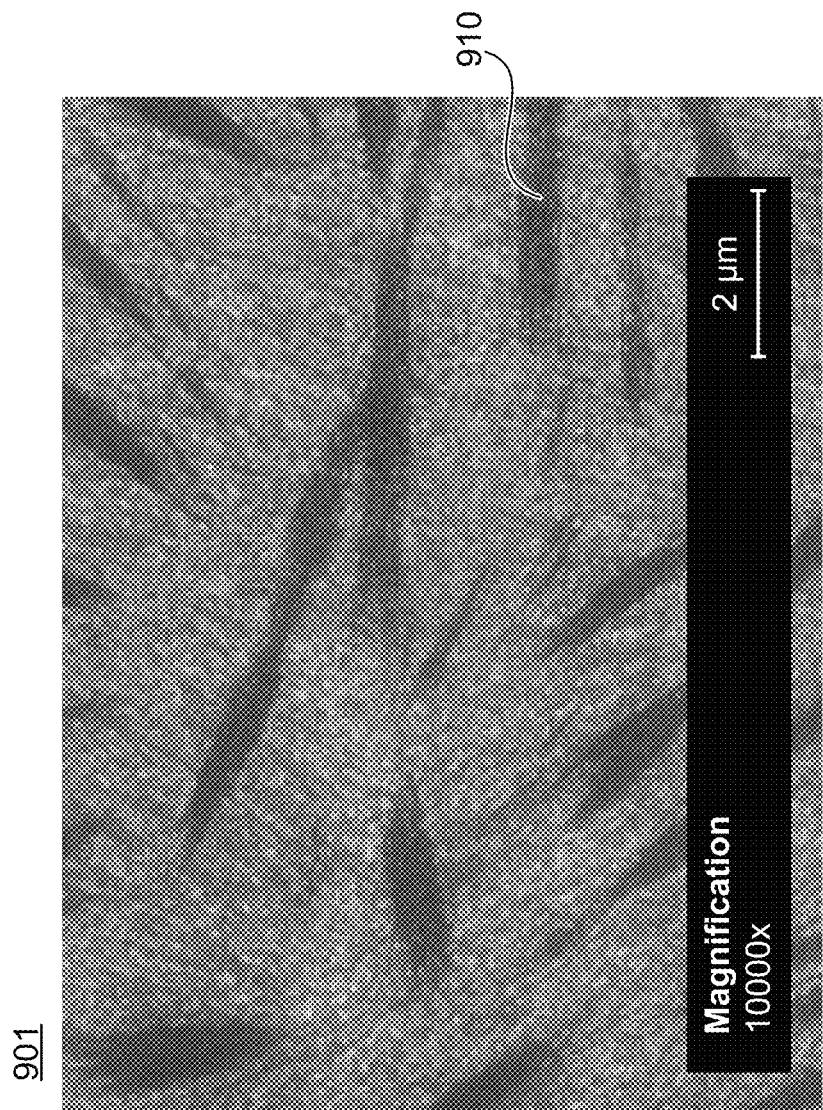
FIGS. 9A-9C are SEM images (at increasing magnifications) of an exemplary nanotube fabric layer formed according to the methods of the present disclosure which exhibits approximately 18.9% rafting.
Figure 9B:
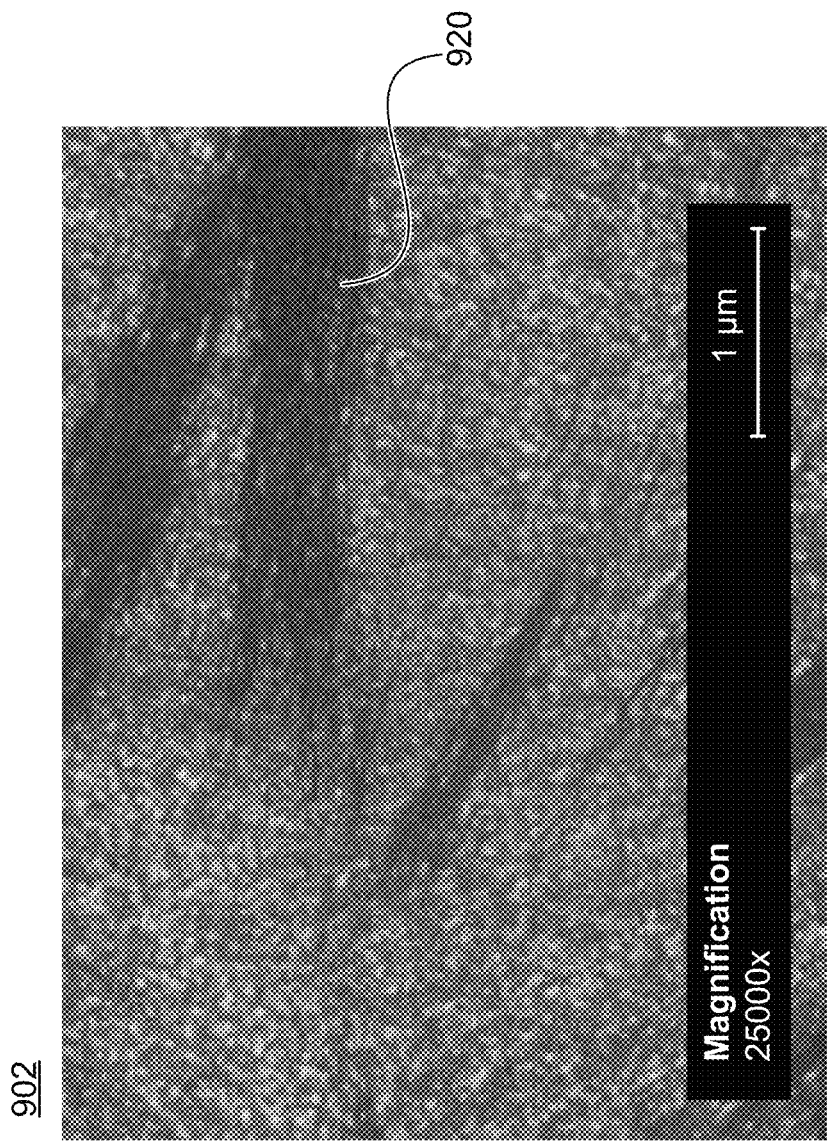
Figure 9C:
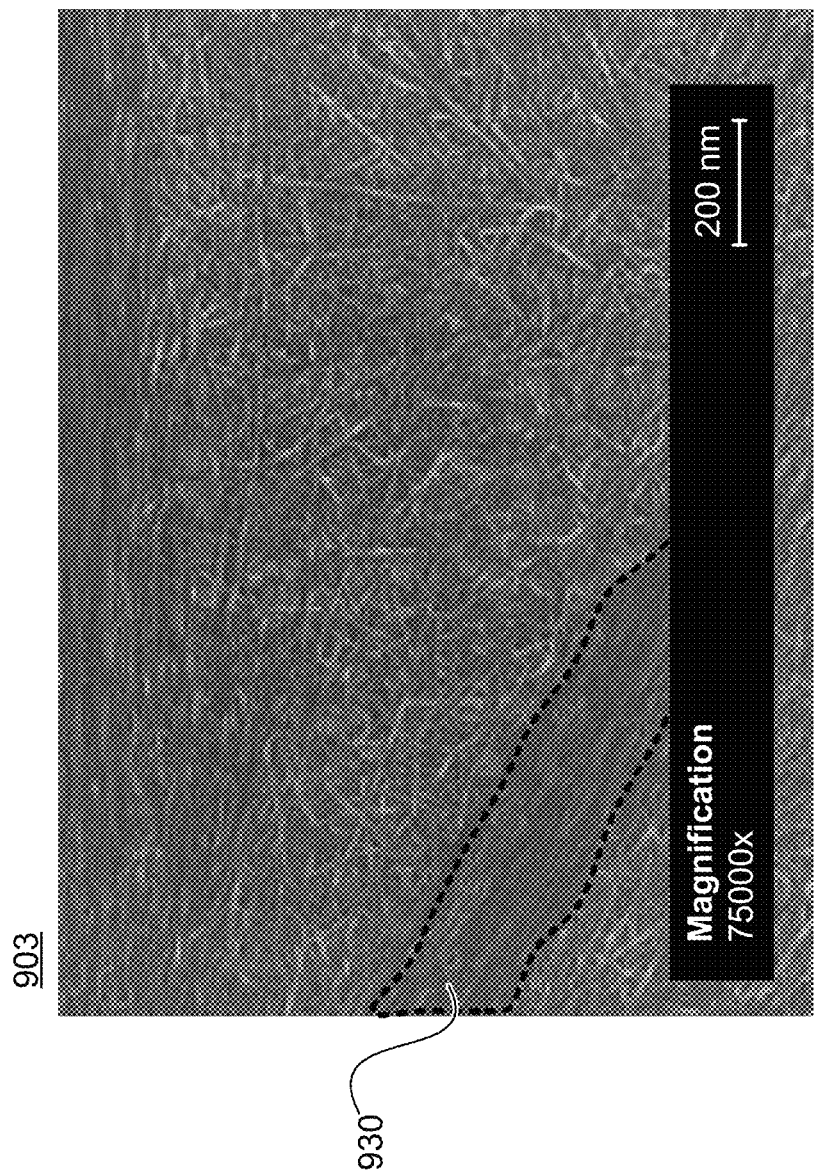

FIGS. 9A-9C are SEM images of an exemplary nanotube fabric layer at different magnifications (901, 902, and 903 respectively) prepared according to the methods of the present disclosure. The nanotube fabric layer depicted in FIGS. 9A-9C was rendered from an application solution with an optical density of 34.35 and an ammonium nitrate salt concentration of 12 ppm. These parameters resulted in a high degree of rafting within the nanotube fabric layer (901, 902, 903). Analysis of the entire nanotube fabric layer showed that approximately 18.9% of the fabric (by area) was comprised of rafted bundles of nanotube elements. These rafted bundles of nanotube elements are evident in FIG. 9A (910), FIG. 9B (920), and FIG. 9C (930).

Example 3

Figure 10A:
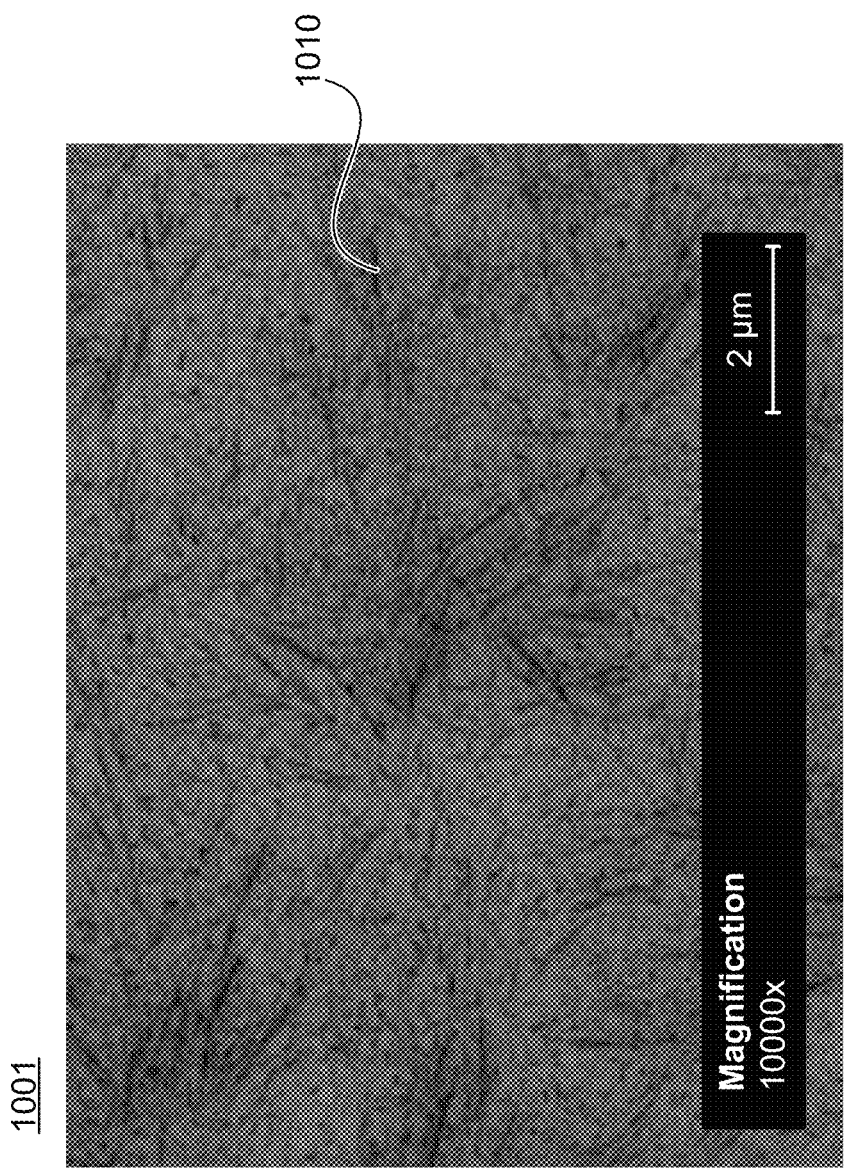
FIGS. 10A-10C are SEM images (at increasing magnifications) of an exemplary nanotube fabric layer formed according to the methods of the present disclosure which exhibits approximately 5.5% rafting.
Figure 10B:
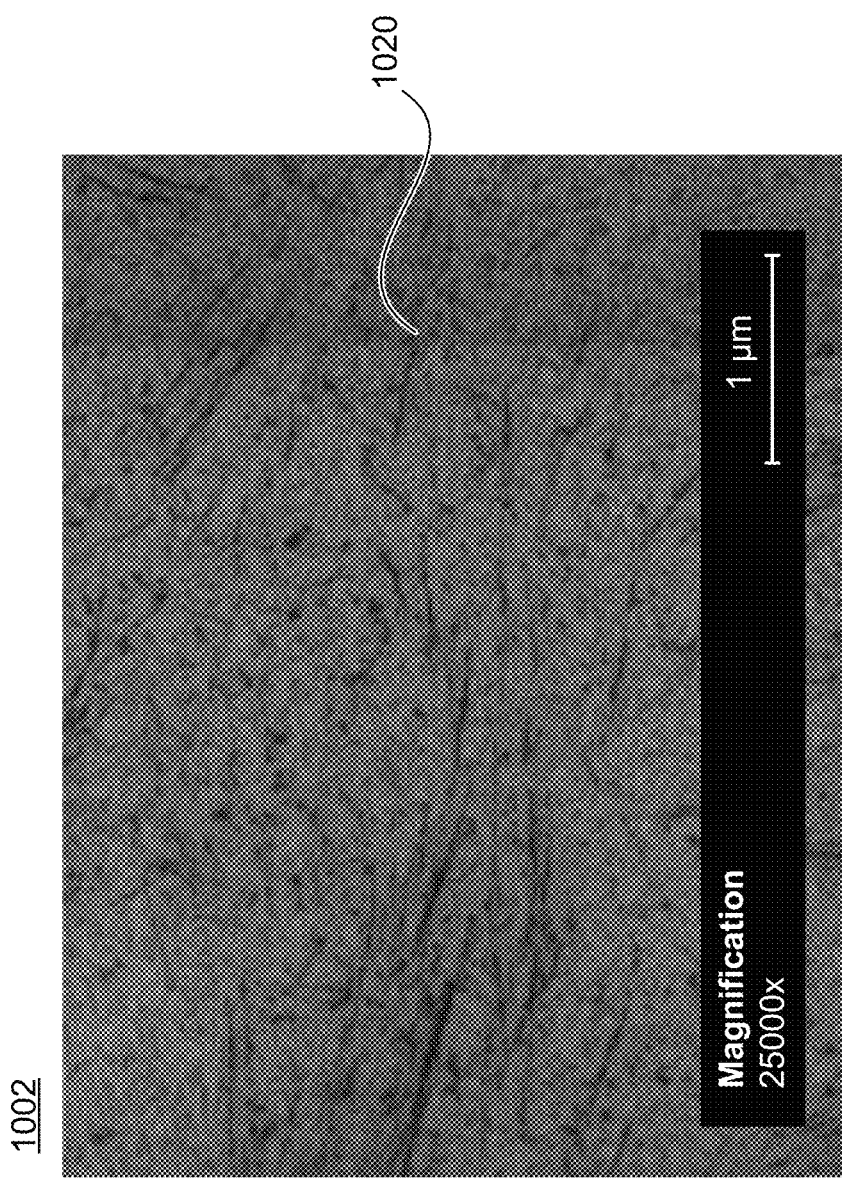
Figure 10C:
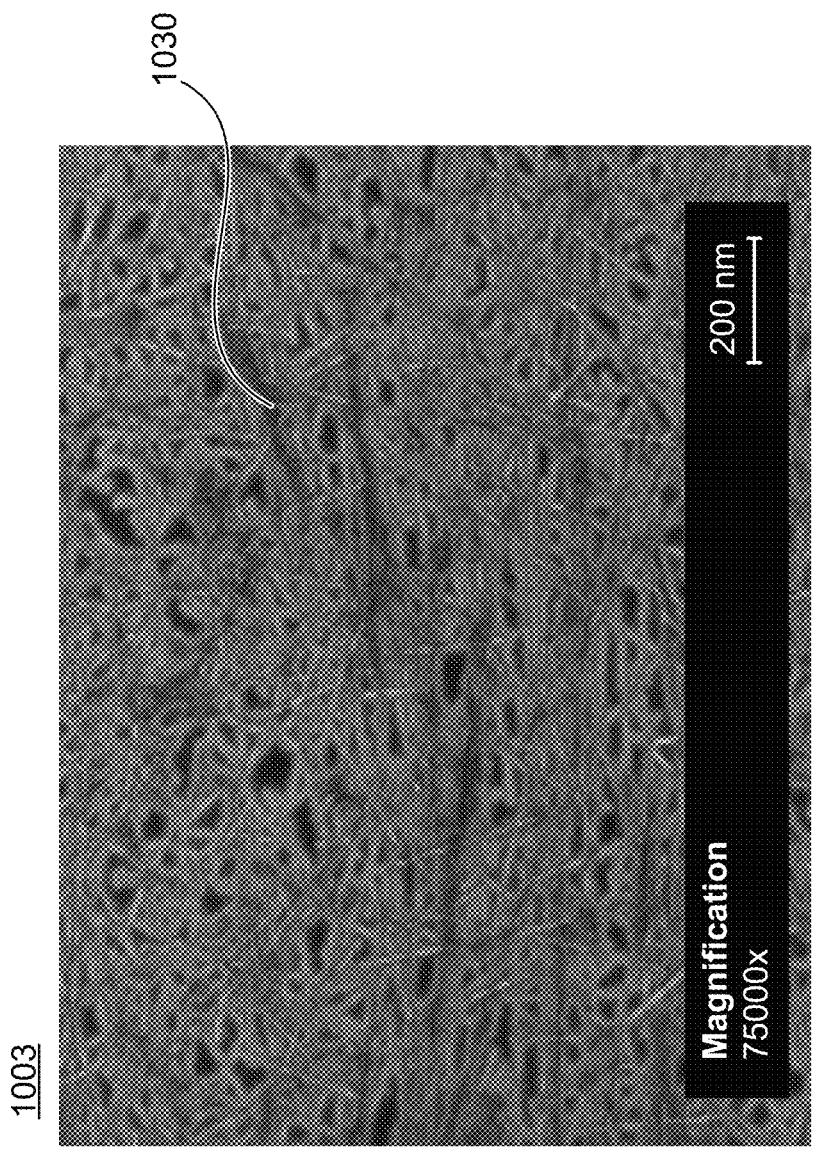

FIGS. 10A-10C are SEM images of an exemplary nanotube fabric layer at different magnifications (1001, 1002, and 1003 respectively) prepared according to the methods of the present disclosure. The nanotube fabric layer depicted in FIGS. 10A-10C was rendered from an application solution with an optical density of 10.02 and an ammonium nitrate salt concentration of 11 ppm. These parameters resulted in a low degree of rafting within the nanotube fabric layer (1001, 1002, 1003). Analysis of the entire nanotube fabric layer showed that approximately 5.5% of the fabric (by area) was comprised of rafted bundles of nanotube elements. These rafted bundles of nanotube elements are evident in FIG. 10A (1010), FIG. 10B (1020), and FIG. 10C (1030).

Example 4

Figure 11A:
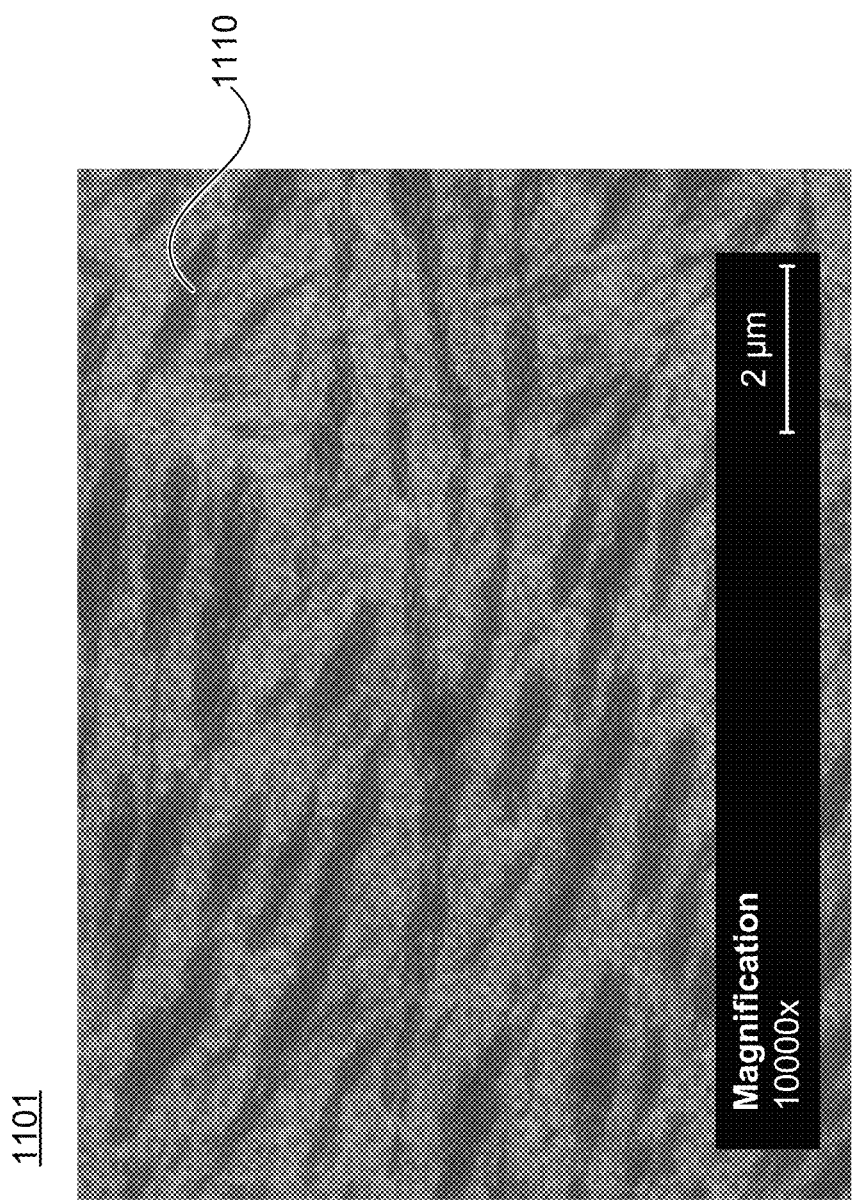
FIGS. 11A-11C are SEM images (at increasing magnifications) of an exemplary nanotube fabric layer formed according to the methods of the present disclosure which exhibits approximately 37.8% rafting.
Figure 11B:
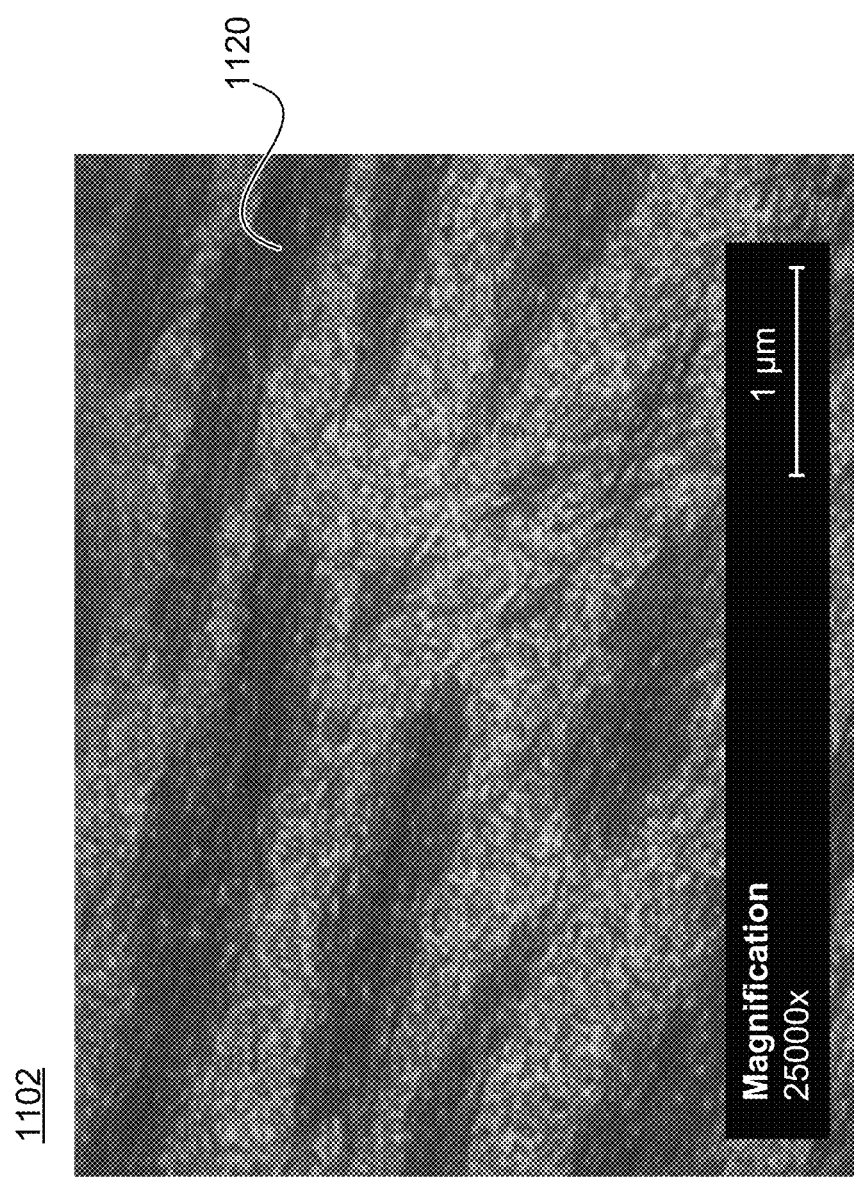
Figure 11C:
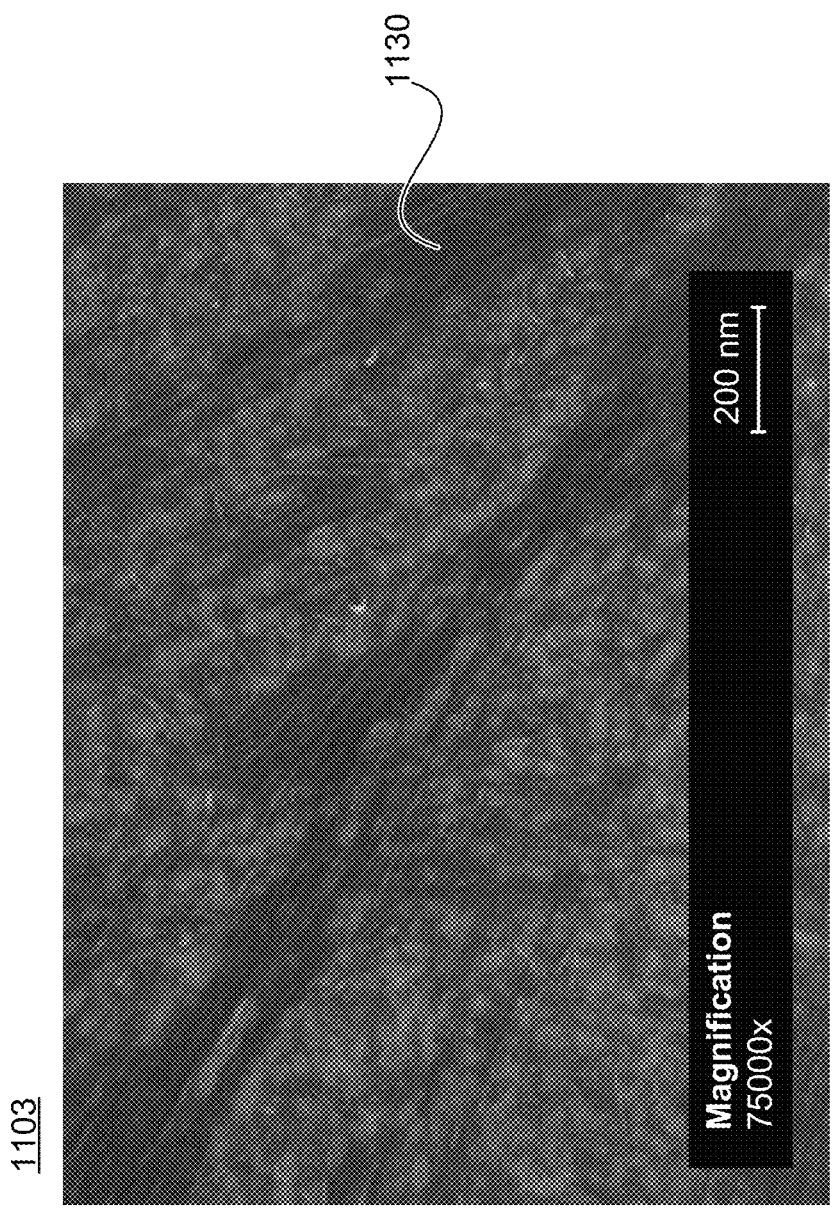

FIGS. 11A-11C are SEM images of an exemplary nanotube fabric layer at different magnifications (1101, 1102, and 1103 respectively) prepared according to the methods of the present disclosure. The nanotube fabric layer depicted in FIGS. 11A-11C was rendered from an application solution with an optical density of 19.69 and an ammonium nitrate salt concentration of 1.5 ppm. These parameters resulted in a high degree of rafting within the nanotube fabric layer (1101, 1102, 1103). Analysis of the entire nanotube fabric layer showed that approximately 37.8% of the fabric (by area) was comprised of rafted bundles of nanotube elements. These rafted bundles of nanotube elements are evident in FIG. 11A (1110), FIG. 11B (1120), and FIG. 11C (1130).

Example 5

Figure 12A:
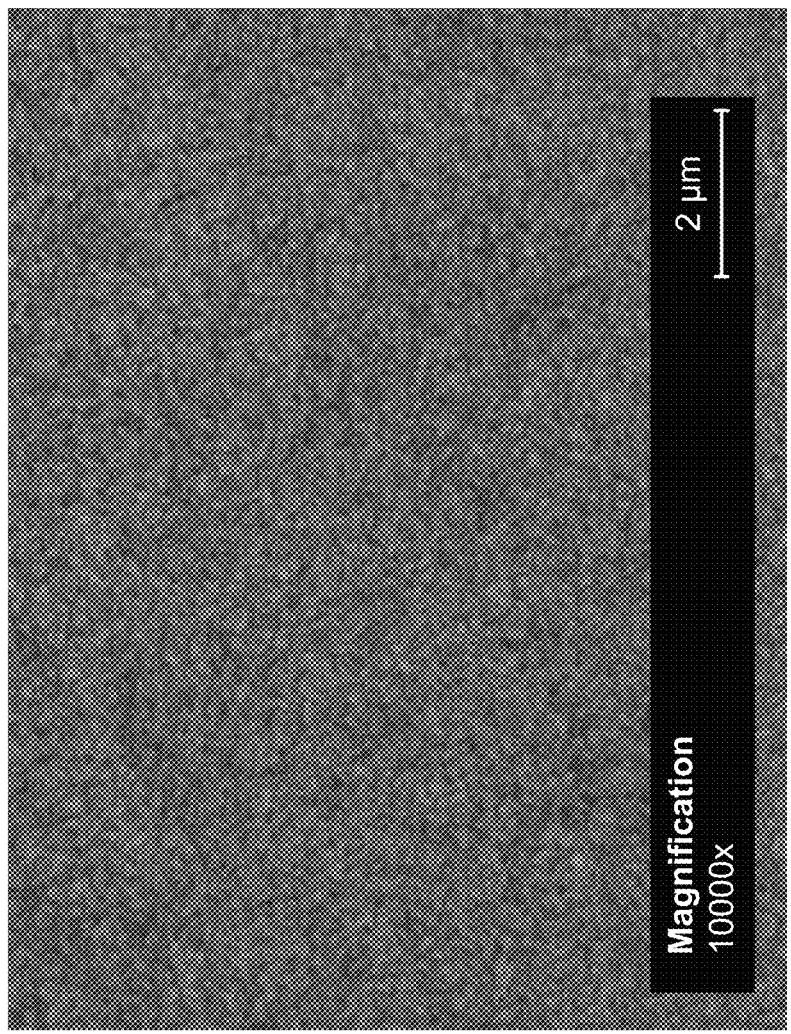
FIGS. 12A-12C are SEM images (at increasing magnifications) of an exemplary nanotube fabric layer formed according to the methods of the present disclosure which exhibits substantially no rafting.
Figure 12B:
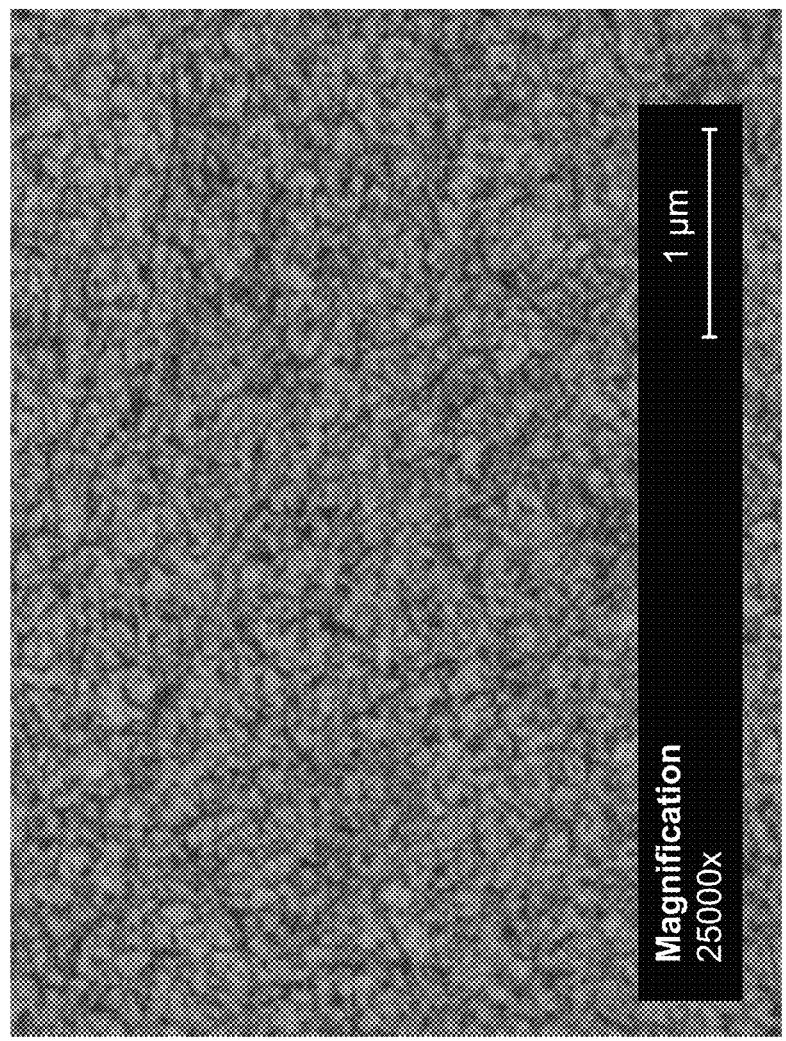
Figure 12C:
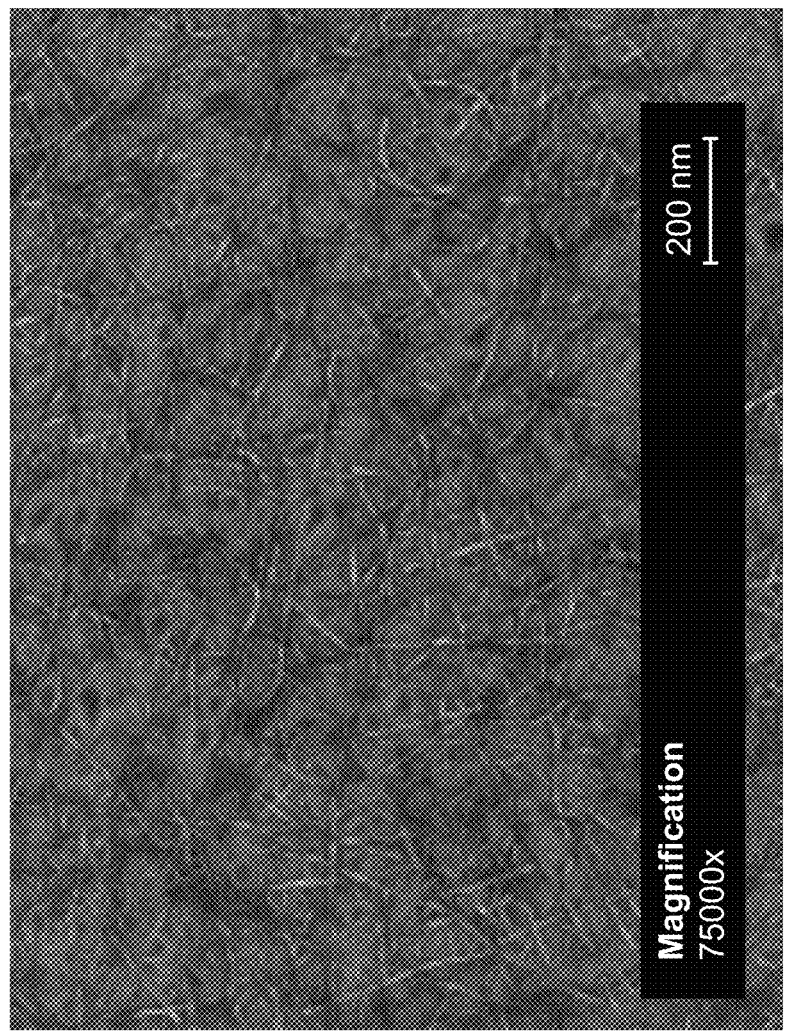

FIGS. 12A-12C are SEM images of an exemplary nanotube fabric layer at different magnifications (1201, 1202, and 1203 respectively) prepared according to the methods of the present disclosure. The nanotube fabric layer depicted in FIGS. 12A-12C was rendered from an application solution with an optical density of 19.71 and an ammonium nitrate salt concentration of 25 ppm. These parameters resulted in substantially no rafting within the nanotube fabric layer (1201, 1202, 1203). Analysis of the entire nanotube fabric layer showed that the fabric layer was substantially free of rafted bundles of nanotube elements.

Example 6

Figure 13A:
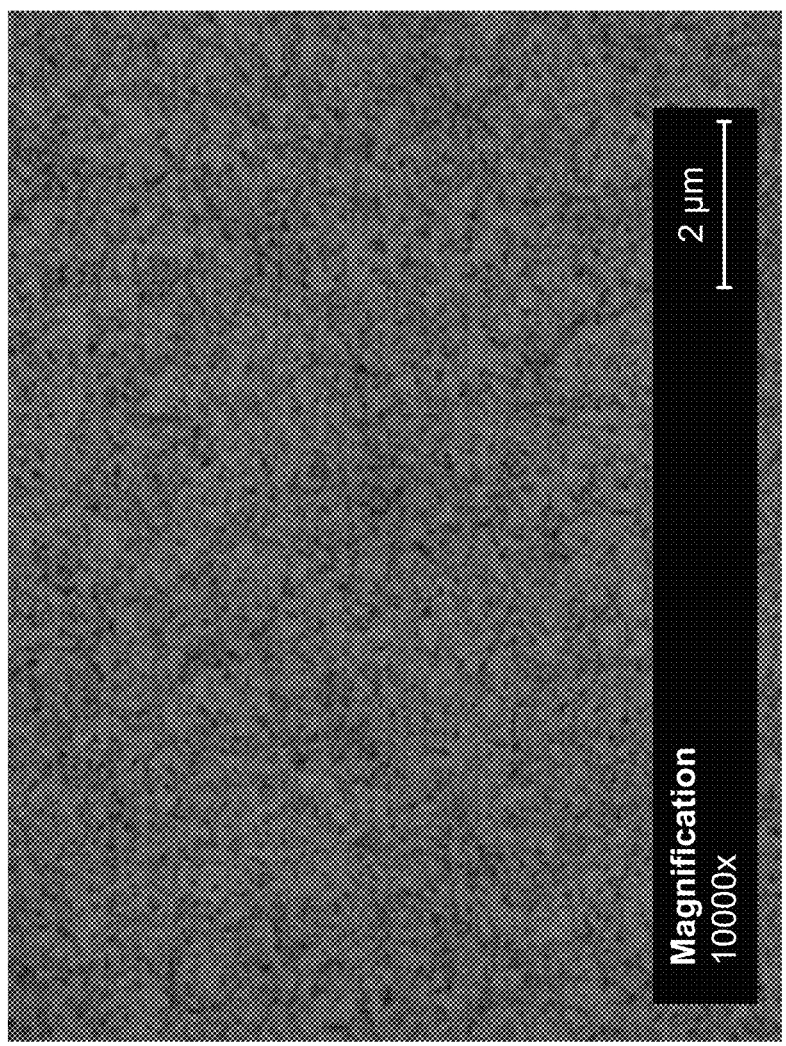
FIGS. 13A-13C are SEM images (at increasing magnifications) of an exemplary nanotube fabric layer formed according to the methods of the present disclosure which exhibits substantially no rafting.
Figure 13B:
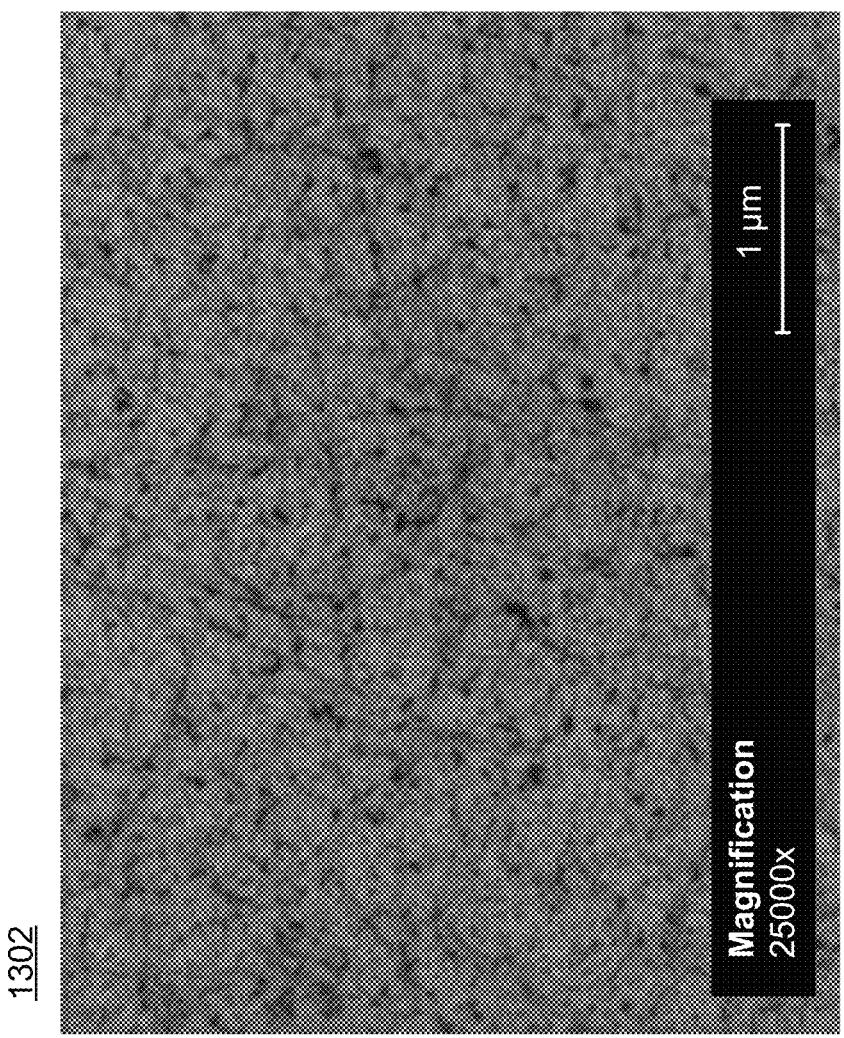
Figure 13C:
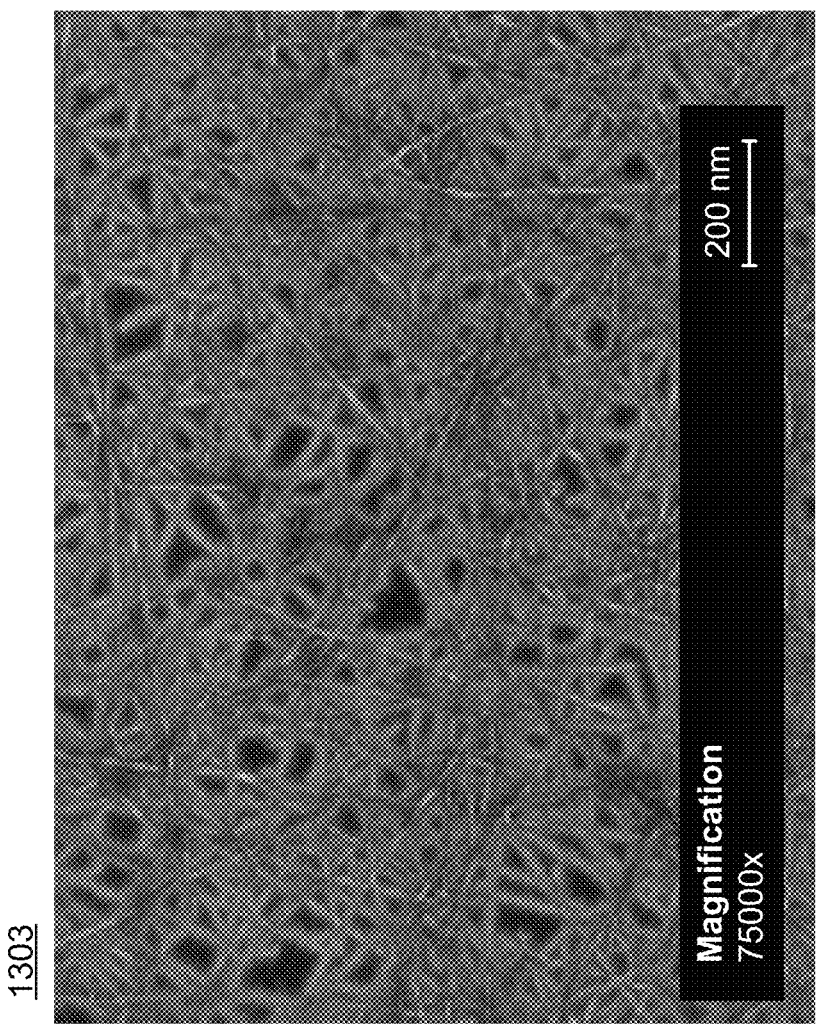

FIGS. 13A-13C are SEM images of an exemplary nanotube fabric layer at different magnifications (1301, 1302, and 1303 respectively) prepared according to the methods of the present disclosure. The nanotube fabric layer depicted in FIGS. 13A-13C was rendered from an application solution with an optical density of 10.02 and an ammonium nitrate salt concentration of 27 ppm. These parameters resulted in substantially no rafting within the nanotube fabric layer (1301, 1302, 1303). Analysis of the entire nanotube fabric layer showed that the fabric layer was substantially free of rafted bundles of nanotube elements.

Example 7

Figure 14A:
FIGS. 14A-14C are SEM images (at increasing magnifications) of an exemplary nanotube fabric layer formed according to the methods of the present disclosure which exhibits approximately 13.1% rafting.
Figure 14B:
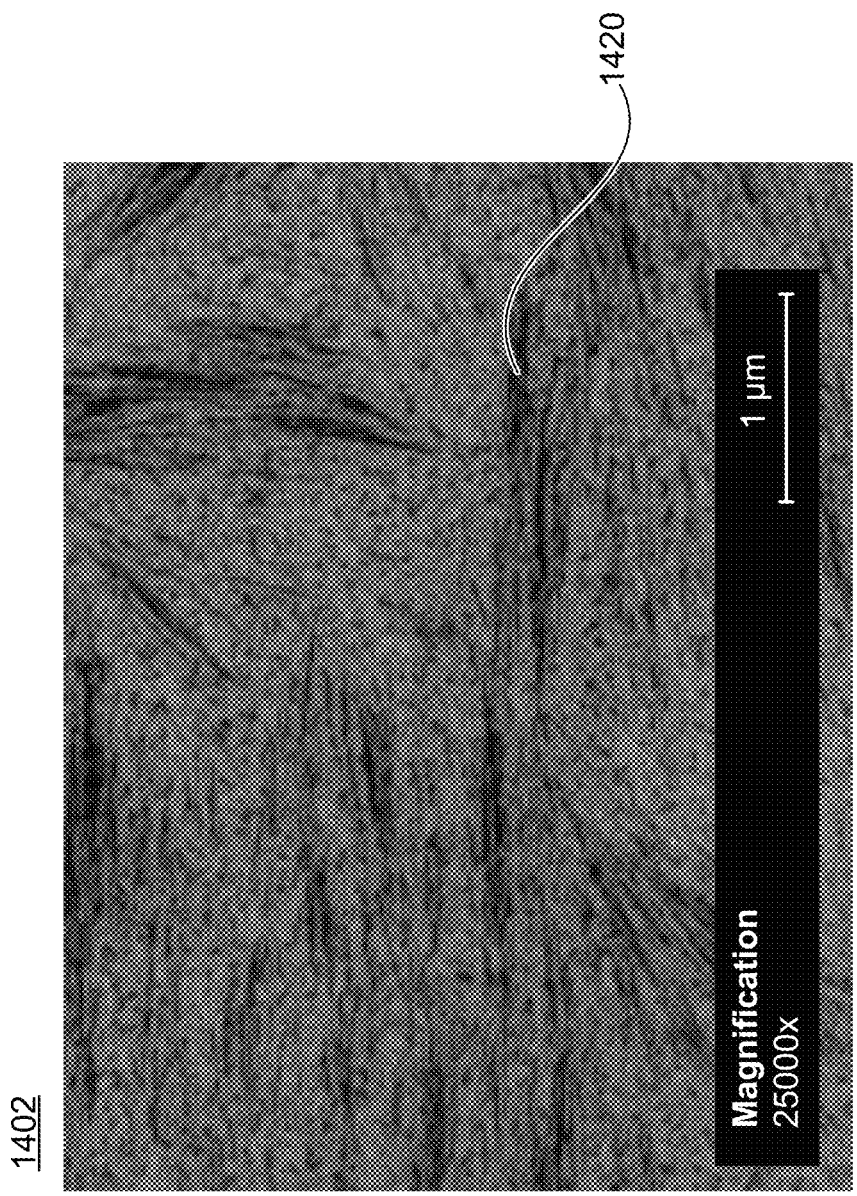
Figure 14C:
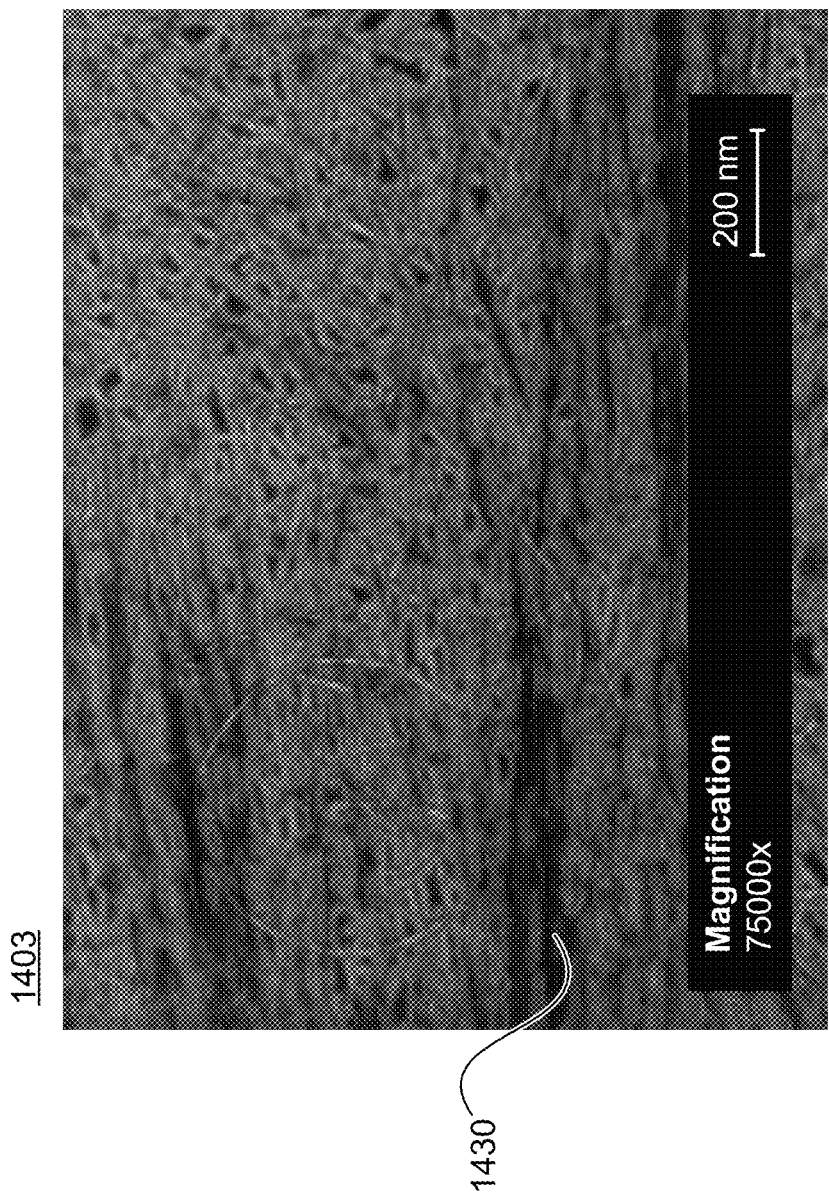

FIGS. 14A-14C are SEM images of an exemplary nanotube fabric layer at different magnifications (1401, 1402, and 1403 respectively) prepared according to the methods of the present disclosure. The nanotube fabric layer depicted in FIGS. 14A-14C was rendered from an application solution with an optical density of 9.4 and an ammonium nitrate salt concentration of 2.5 ppm. These parameters resulted in a moderate degree of rafting within the nanotube fabric layer (1401, 1402, 1403). Analysis of the entire nanotube fabric layer showed that approximately 13.1% of the fabric (by area) was comprised of rafted bundles of nanotube elements. These rafted bundles of nanotube elements are evident in FIG. 14A (1410), FIG. 14B (1420), and FIG. 14C (1430).

Example 8

Figure 15A:
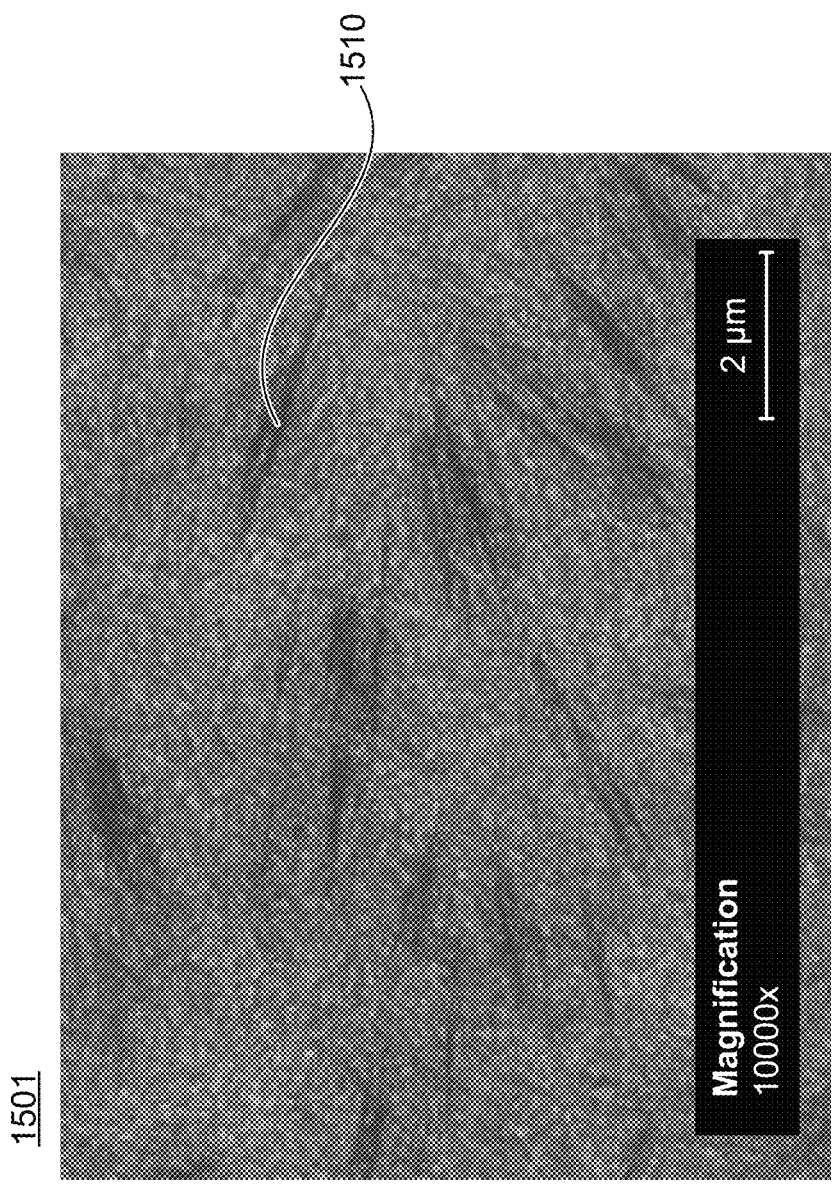
FIGS. 15A-15C are SEM images (at increasing magnifications) of an exemplary nanotube fabric layer formed according to the methods of the present disclosure which exhibits approximately 10.0% rafting.
Figure 15B:
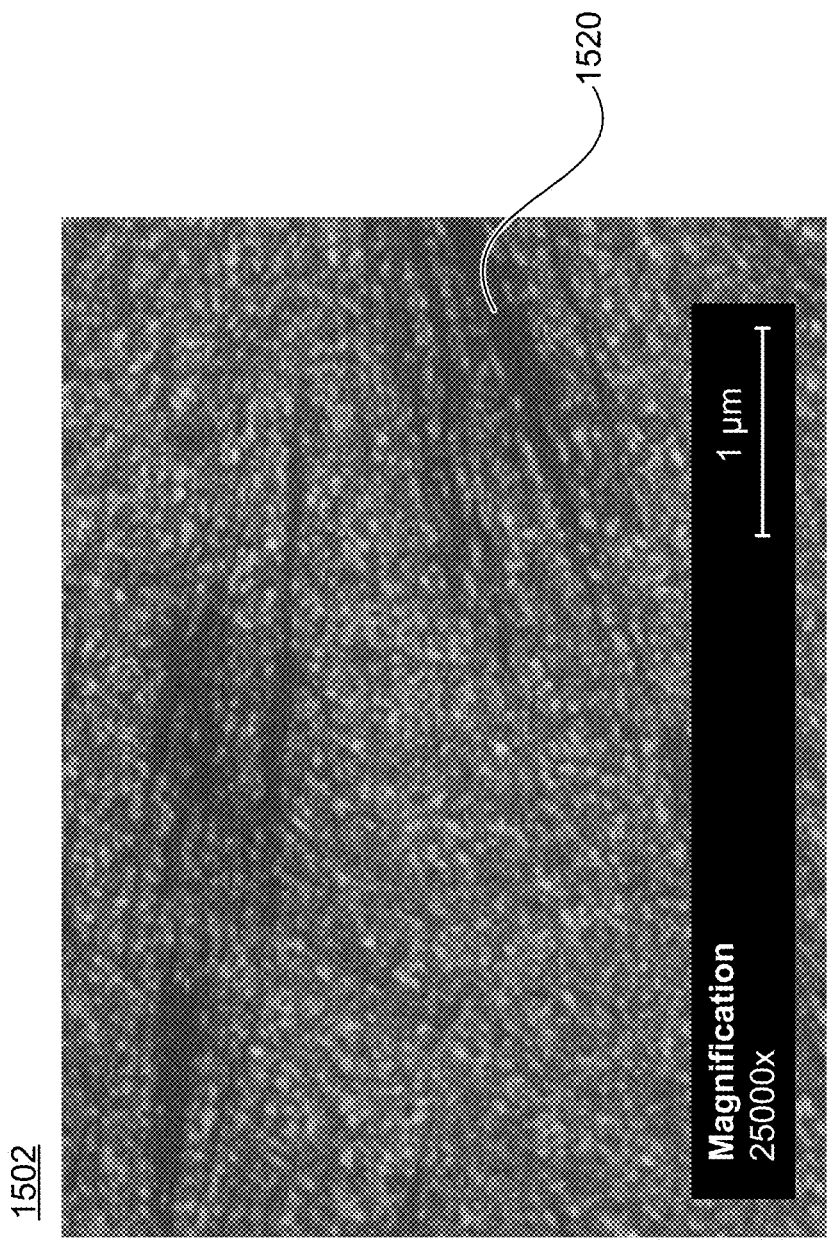
Figure 15C:
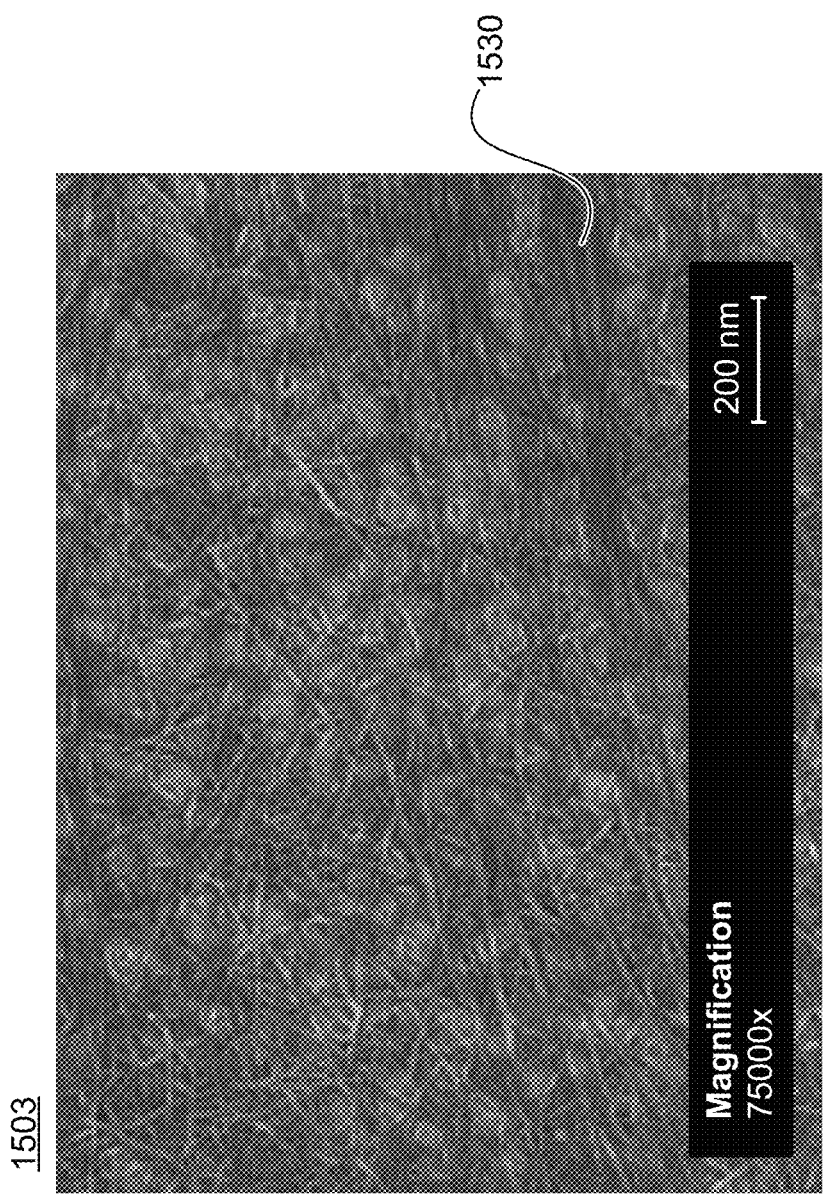

FIGS. 15A-15C are SEM images of an exemplary nanotube fabric layer at different magnifications (1501, 1502, and 1503 respectively) prepared according to the methods of the present disclosure. The nanotube fabric layer depicted in FIGS. 15A-15C was rendered from an application solution with an optical density of 33.9 and an ammonium nitrate salt concentration of 33 ppm. These parameters resulted in a moderate degree of rafting within the nanotube fabric layer (1501, 1502, 1503). Analysis of the entire nanotube fabric layer showed that approximately 10.0% of the fabric (by area) was comprised of rafted bundles of nanotube elements. These rafted bundles of nanotube elements are evident in FIG. 15A (1510), FIG. 15B (1520), and FIG. 15C (1530).

Example 9

Figure 16A:
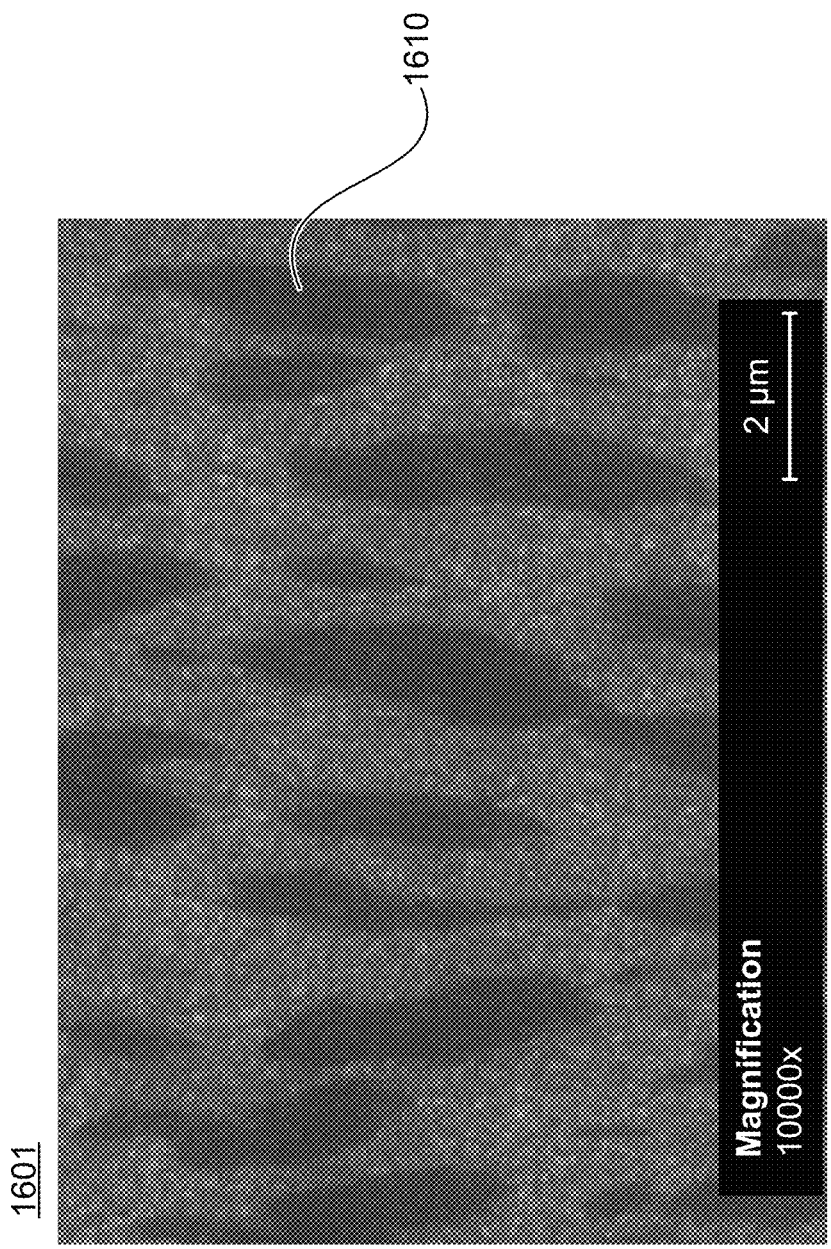
FIGS. 16A-16C are SEM images (at increasing magnifications) of an exemplary nanotube fabric layer formed according to the methods of the present disclosure which exhibits approximately 35.0% rafting.
Figure 16B:
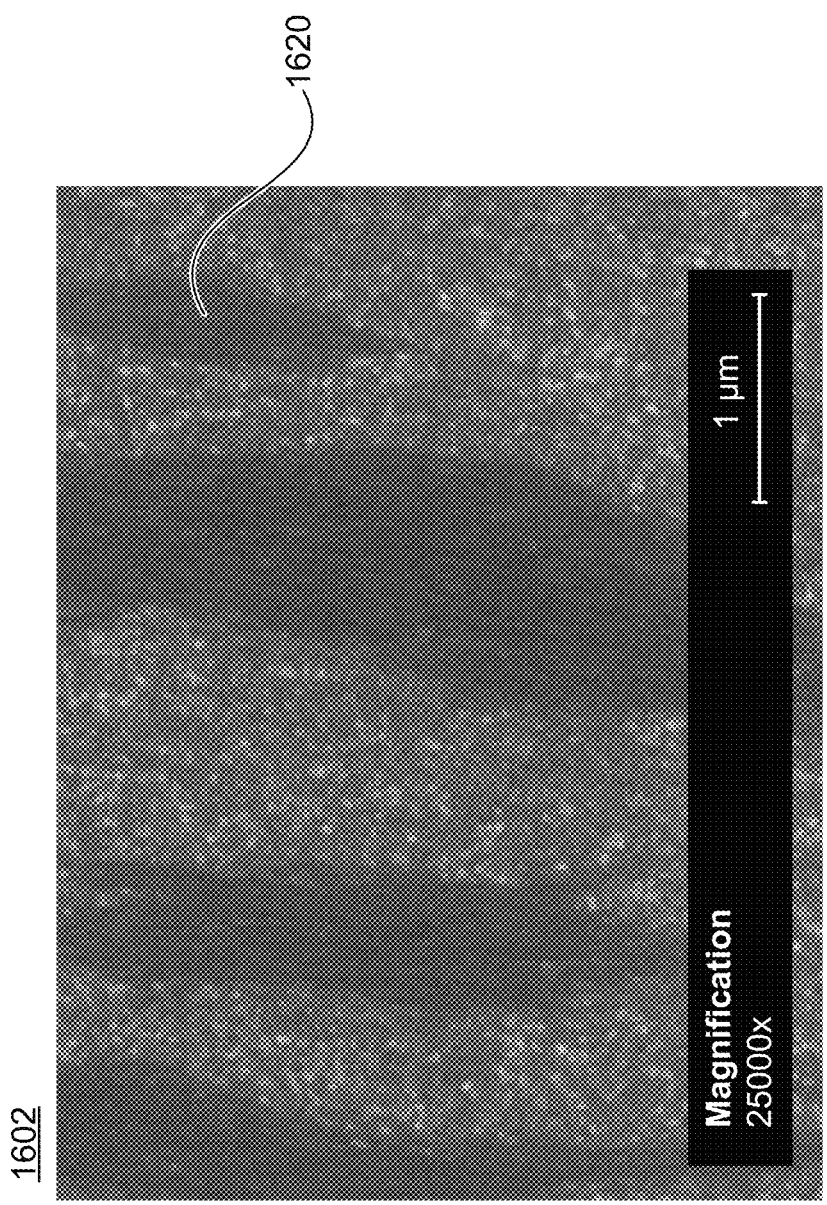
Figure 16C:
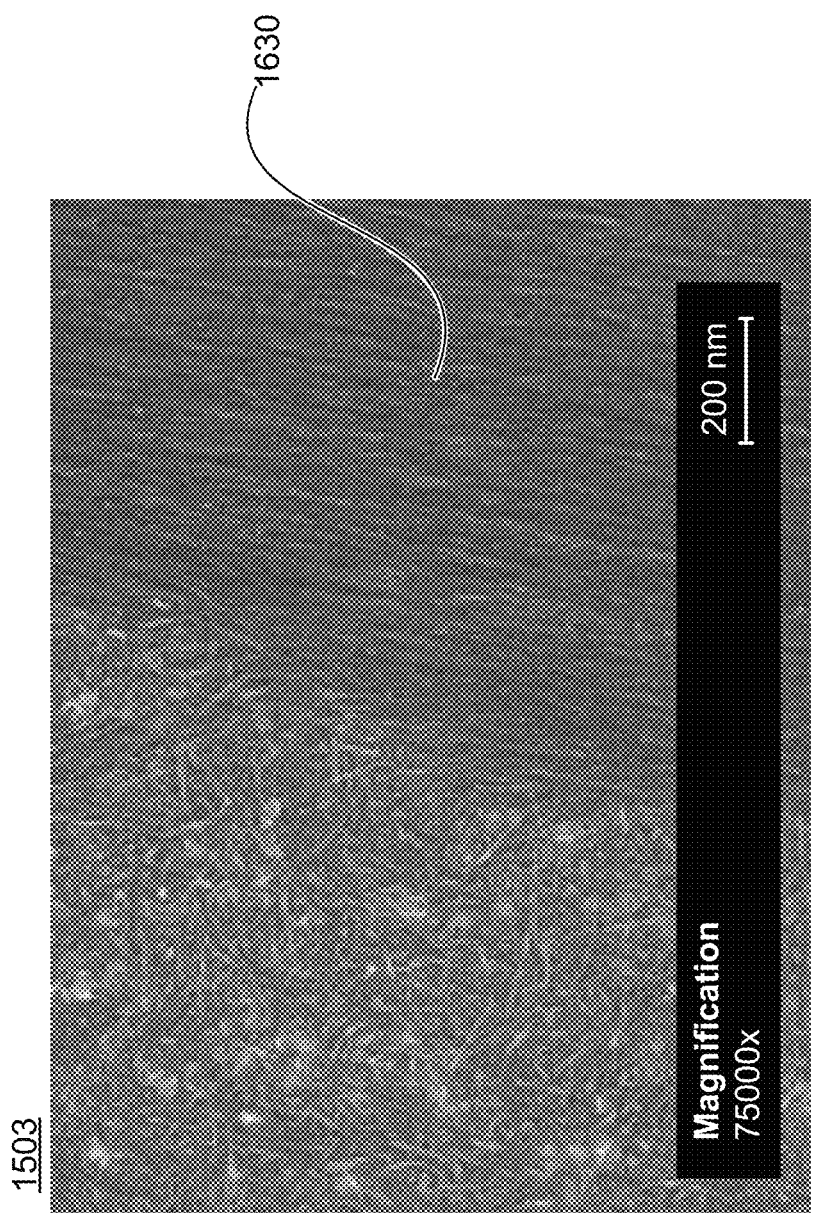

FIGS. 16A-16C are SEM images of an exemplary nanotube fabric layer at different magnifications (1601, 1602, and 1603 respectively) prepared according to the methods of the present disclosure. The nanotube fabric layer depicted in FIGS. 16A-16C was rendered from an application solution with an optical density of 33.9 and an ammonium nitrate salt concentration of 7.5 ppm. These parameters resulted in a high degree of rafting within the nanotube fabric layer (1601, 1602, 1603). Analysis of the entire nanotube fabric layer showed that approximately 35.0% of the fabric (by area) was comprised of rafted bundles of nanotube elements. These rafted bundles of nanotube elements are evident in FIG. 16A (1610), FIG. 16B (1620), and FIG. 16C (1630).

We have described multiple techniques to control the porosity and/or density of a nanotube fabric. The techniques also can be said to control the positioning of the nanotubes within the fabric, to control the positions of gaps within the nanotube fabric, and to control the concentration of the nanotubes within the fabric. For example, these techniques can provide low porosity, high density fabrics. Further, the techniques can be described as controlling the gaps of nanotubes within the nanotube fabric. Thus, we have disclosed techniques to create devices sized to and smaller than the current lithography limits (for example, less than or equal to about 20 nm). Low porosity, high density fabrics also can be created by, for example, filling gaps in the nanotube film with additional nanotube elements. In other embodiments, a high density fabric can be created by applying a physical force to the fabric. Further, the density or porosity of the fabric can be controlled to create low density and highly porous nanotube fabrics, if so desired.

Further, the methods of the present disclosure are useful for any application using nanotube fabrics wherein the concentration of the individual nanotube elements within the fabric or the dimensions of gaps within the fabric are required to fit within a preselected tolerance.

Nanotube Fabrics with Controlled Surface Roughness and Degree of Rafting

In the previous sections, the use of ionic species within a nanotube application solution has been described as a means of controlling the degree of rafting within a nanotube fabric formed from that nanotube application solution. As discussed above, by controlling the concentration levels of these ionic species within a nanotube application solution—as well as controlling the nanotube density with a nanotube application solution—the degree of rafting within a nanotube fabric can be selected. In general, as discussed in detail above, a higher concentration of an ionic species within a nanotube application solution will tend to discourage rafting within a nanotube fabric formed from such a solution, and a lower concentration of ionic species within a nanotube fabric will tend to promote rafting.

The present disclosure will now go into more detail with respect to the specific ionic species that can be used to control or select the degree of rafting within a nanotube fabric, different nanotube formulations used to form nanotube fabrics, how ionic species concentration levels are selected for with respect to different nanotube formulations, and the characterization of specific nanotube formulations with respect to different ionic species to select a range of concentration values suited for a particular application for a given nanotube formulation and selected ionic species.

The present disclosure will also now describe how fabric roughness—that is the planarity of the surface of a nanotube fabric—can be controlled or selected for by using preselected concentrations of a particular ionic species within a specific nanotube formulation used to form that nanotube fabric. As will be discussed in more detail below, highly rafted fabrics, in general, will tend to be smoother than fabrics with a very low degree or essentially no rafting. However, in certain applications, a highly rafted fabric can be undesirable. For example, highly rafted nanotube fabrics will tend to have higher switching voltages (that is, the voltage required to adjust the resistivity of a nanotube fabric from a first state to a second state). Highly rafted fabrics will also tend to be denser than fabrics with a low degree of rafting, requiring more individual nanotube elements for a given volume of fabric. As certain applications—for example, but not limited to, certain types of two-terminal nanotube switching elements—require smooth nanotube fabrics with a low degree of rafting, the present disclosure provides methods for characterizing a nanotube formulation for a given ionic species. According to the methods of the present disclosure, this characterization, in certain applications, provides a nanotube formulation roughness curve, which plots the expected roughness of a nanotube fabric formed with a given nanotube formulation against the concentration level of a given ionic species. As will be discussed in detail below with respect to FIG. 22 and illustrated within examples 10-23, such a nanotube formulation roughness curve can be used to select a utilization range of a specific ionic species concentration for a given nanotube formulation that will provide, for example, a relatively smooth nanotube fabric with a low degree of rafting. Methods and parameters for measuring and quantifying both the degree of rafting within a nanotube fabric and the degree of surface roughness (or smoothness) within a nanotube fabric will also be discussed below.

Within certain applications, the surface roughness of a nanotube fabric and the degree of rafting within a nanotube fabric can have an effect on the electrical and physical properties of the nanotube fabric or within a device employing the nanotube fabric. For example, within two terminal nanotube switching devices (discussed in detail within the incorporated references), the degree of rafting within the nanotube fabric used within a device can influence the switching voltage, resistance, and adjustable resistance range of that device. Further, the surface roughness of a nanotube fabric used within two terminal nanotube switching devices can also impact the uniformity of the distance between the top and bottom electrodes, which can, in certain embodiments, affect how the devices function and potentially limit the scalability of the devices. The surface roughness of a nanotube fabric can also significantly impact how other material layers applied over the nanotube fabric form, creating differences in both electrical and physical characteristics of devices using these nanotube fabrics. To this end, the methods of the present disclosure can, in certain aspects, be used to form engineered nanotube fabrics wherein the surface roughness as well as the degree of rafting can be reliably controlled by first characterizing a nanotube formulation and then using that characterization to adjust the nanotube formulation such that, when deposited, it forms a nanotube fabric with the a desired surface roughness and degree of rafting, as required by the needs of a particular application.

Within the present disclosure, the term "nanotube formulation" is used to describe nanotube application solutions—that is a plurality of nanotube elements suspended within a liquid medium capable of being deposited to form a nanotube fabric—with a selected set of parameters. Such parameters can include, but are not limited to, the type of nanotube or nanotubes used within the application solution, the nanotube wall type (e.g., single walled, double walled, or multi-walled), the type and degree of functionalization (or lack thereof) of the nanotube elements, the lengths and length distribution of the nanotube elements, the degree to which the nanotube elements are straight or kinked, the density of the nanotube elements within solution, the purity of the application solution (e.g., level of metallic impurities), the chirality of the nanotube elements, and the liquid medium used. As will be discussed in detail below according to the methods of the present disclosure, nanotube fabrics formed from two different nanotube formulations can exhibit different degrees of rafting and roughness for a given concentration of ionic species. That is to say, a given concentration of a specific ionic species in a first exemplary nanotube formulation may produce a smooth fabric with a significant degree of rafting while the same concentration of that ionic species in a second exemplary nanotube formulation (with different parameters than the first) may produce a rough fabric with a very low degree of rafting. As such, the present disclosure provides methods for determining a utilizable range for a selected ionic species within a particular nanotube formulation, with this utilizable range corresponding to a desired roughness/smoothness parameter range and degree of rafting range within a nanotube fabric as fits the needs of a selected application. It should be noted that such ranges are selected as best fits the needs of a particular application in which a nanotube fabric is used. For example, some applications might require a very rough fabric with a very low degree of rafting, while other application might require a relatively smooth fabric with a low degree of rafting. The present disclosure further provides methods for adjusting the concentration levels of an ionic species within a nanotube formulation into this utilizable range prior to forming a nanotube fabric such as to realize the desired properties within the fabric with respect to smoothness/roughness and the degree of rafting.

It should be noted that while previous discussions of controlling rafting within nanotube fabrics (in particular, examples 1 through 9), exemplary ionic species concentration thresholds of 10 and 20 ppm as mass of nitrogen atom in the nitrate anion of the ammonium nitrate were used to select for highly rafted fabrics and fabrics with a low degree of rafting, respectively, the present disclosure is not limited in this regard. Indeed, the present disclosure up to this point (including examples 1 through 9) has been directed at a range of exemplary nanotube formulations all utilizing the same type of nanotube (detailed in FIGS. 20A and 20B, and described in more detail within the discussion of those figures below) and one particular exemplary ionic species (ammonium nitrate salt). And while, as described in detail above, within examples 1-9 concentrations of ammonium nitrate salt below 10 ppm as mass of nitrogen (or ~0.71 mM ammonium nitrate) provided fabrics with a relatively high degree of rafting and concentrations of ammonium nitrate salt above 20 ppm as mass of nitrogen (or ~1.43 mM ammonium nitrate) provided fabrics with a relatively low degree of rafting, these specific concentration levels could be different for nanotube formulations using different types of nanotubes (such as those shown in FIGS. 20A-20D, for example) and certainty for different ionic species within the nanotube formulations. As will be shown and discussed in more detail below, the utilizable range for a specific ionic species can vary significantly depending on the particular nanotube formulation in which it is used. To this end, the methods of the present disclosure provide methods for both determining this range for a given ionic species within a given nanotube formulation and using that range to form nanotube fabrics with desired smoothness/roughness and degree of rafting parameters.

Figure 17A:
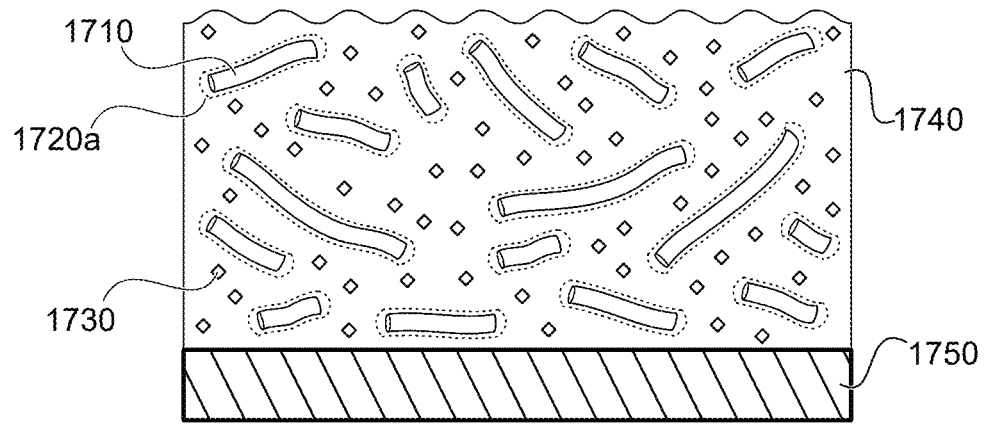
FIG. 17A is a diagram illustrating three steps within a nanotube deposition process using a nanotube formulation with a relatively high ionic species concentration level.
Figure 17A:
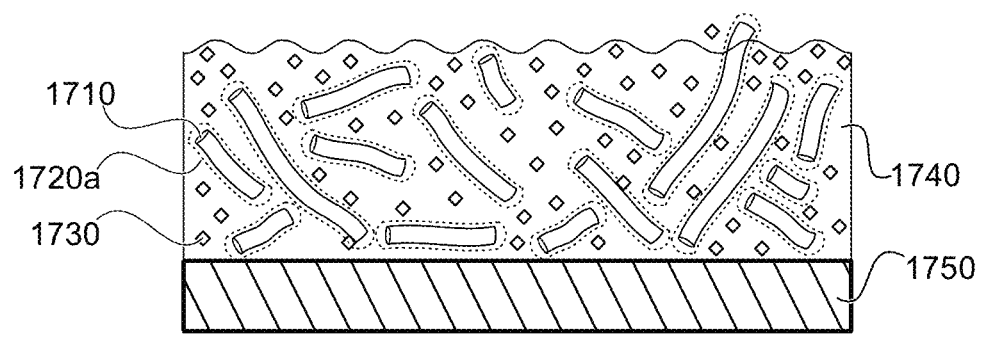
Figure 17A:
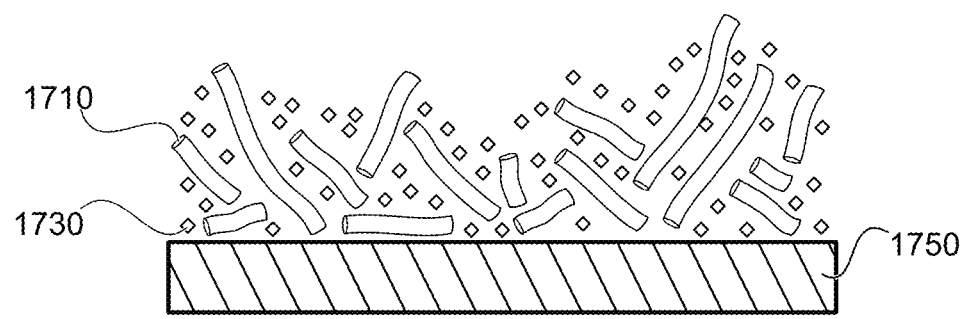
Figure 17B:
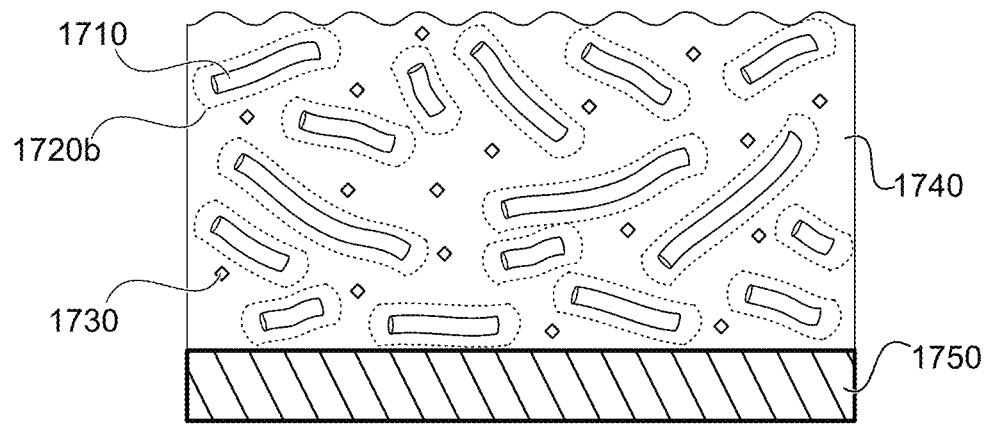
FIG. 17B is a diagram illustrating three steps within a nanotube deposition process using a nanotube formulation with a relatively low ionic species concentration level.
Figure 17B:
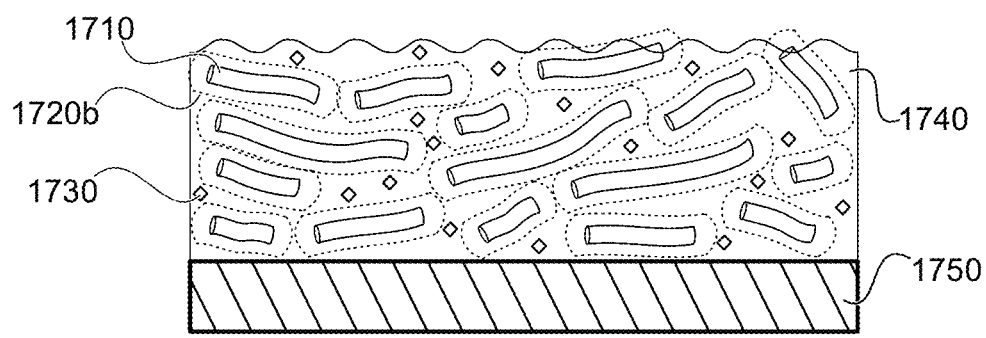
Figure 17B:
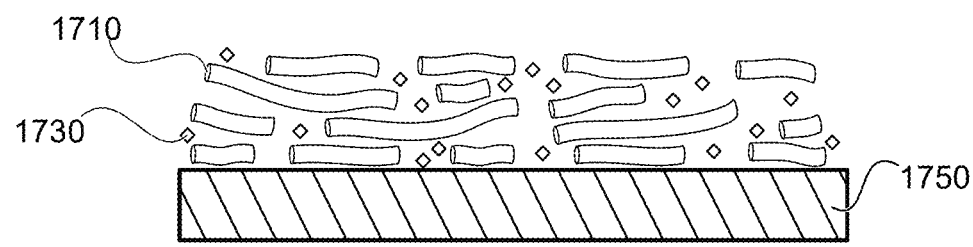

FIGS. 17A and 17B each illustrate three steps in an exemplary nanotube fabric deposition operation (1701-1703 and 1704-1706, respectively) wherein an exemplary nanotube formulation is being deposited over a material layer 1750 to form a nanotube fabric. Within both exemplary operations of FIGS. 17A and 17B, the nanotube formulation being deposited includes nanotube elements 1710 and ionic species elements 1730 suspended in liquid medium 1740. It should be noted that the nanotube formulation used in the exemplary operation of FIG. 17A is intended to be the same nanotube formulation used in exemplary operation of FIG. 17B, however the nanotube formulation within the exemplary operation of FIG. 17A has been adjusted to have a significantly higher concentration level of ionic species elements 1730 as compared with the concentration level of ionic species elements 1730 in the nanotube formulation within the exemplary operation of FIG. 17B.

It should be noted that exemplary nanotube deposition operations detailed in FIGS. 17A and 17B are intended as simplified functional examples used to illustrate the methods of the present disclosure. For clarity, the relative shapes, sizes, positions, and quantities of nanotube elements 1710 and ionic species elements 1730 have been greatly simplified for ease of explanation purposes. That is, operations detailed in FIGS. 17A and 17B are intended only to be used to illustrate a relevant mechanism of nanotube fabric formation with respect to ionic species concentration levels within a nanotube formulation. As such, no realistic values for nanotube size or type, actual concentration levels of either nanotube elements or ionic species, or the type of ionic species is intended or should be inferred.

Looking now to first process step 1701 of FIG. 17A, a nanotube formulation has been deposited over material layer 1750. This deposition process could be a spin coating operation, for example, as described above with respect to U.S. Pat. No. 7,334,395, but the methods of the present disclosure are not limited in this regard. After initial deposition of the nanotube formulation, a significant volume of liquid medium 1740 remains present such that nanotube elements 1710 remain suspended in solution with freedom to move with respect to each other.

Each nanotube element 1710 within process steps 1701-1703 is surrounded by a dashed line 1720a, which indicates the repulsion distance of each nanotube element 1710 with respect to other nanotube elements within the nanotube formulation. According to the methods of the present disclosure, within certain applications the concentration level of an ionic species (represented in FIGS. 17A and 17B as ionic species elements 1730) within a nanotube formulation directly affects this repulsion distance 1720a in FIG. 17A, as well as repulsion distance 1720b as detailed in FIG. 17B (discussed further below). Functional groups on the nanotube elements provide an electrostatic repulsion force, which can, in certain applications, keep nanotube elements within solution from coming close together. Without wishing to be bound by theory, the present disclosure submits that, in certain applications, a relatively high concentration level of an ionic species within a nanotube formulation will tend to significantly limit repulsion distance 1720a around nanotube elements 1710. Within such applications, ionic species within the solution will screen the functional groups on the nanotube elements from each other, significantly limiting the effective repulsion distance (represented by dashed lines 1720a and 1720b). Similarly, as detailed in process steps 1704-1706 of FIG. 17B, a relatively low concentration level of ionic species within a nanotube formulation will tend to result in a relatively large repulsion distance 1720b around nanotube elements 1710. As will be described in detail below, the methods of the present disclosure manage this repulsion distance (1720a and 1720b, in FIGS. 17A and 17B, respectively) by adjusting the concentration level of ionic species in a nanotube formulation into an utilizable range, to realize nanotube fabrics with a desired surface roughness and a desired degree of rafting. Further, it should be noted that in certain applications the type of ionic species used within a nanotube formulation as well as the way an ionic species crystallizes will affect the roughness of a nanotube fabric. Ionic species that form larger crystals (1730 in FIGS. 17A and 17B), for example, will have a greater impact on how nanotube elements compact on a substrate surface as compared with ionic species that from smaller crystals.

Looking now to second process step 1702, an intermediate step of the exemplary nanotube fabric deposition process of FIG. 17A is shown. Within process step 1702, a significant volume of liquid medium 1740 has been removed (via, for example, but not limited to, a spin coating operation). As a result of this decreased volume, nanotube elements 1710 are forced closer together. However, due to the significantly limited repulsion distance 1720a present in the exemplary operation of FIG. 17A, the nanotube elements are able to move close together and will tend to fit tightly together in a relatively irregular, haphazard arrangement as their freedom of movement is reduced due to the decreased volume of the liquid medium 1740.

It should be noted that within both exemplary processes detailed in FIGS. 17A and 17B, the concentration level of ionic species within each nanotube formulation increases between the first and second process steps (1701 and 1702, respectively, for FIG. 17A, and 1704 and 1705, respectively, for FIG. 17B). While not shown in FIGS. 17A and 17B for sake of clarity, within certain applications, this increase in ionic species concentration can significantly reduce the repulsion distance (1720a and 1720b) of the nanotube elements within the partially dried nanotube formulation. As such, in these certain applications, there exists a temporal component to the fabric deposition process with respect to the degree of rafting within and the smoothness/roughness of a nanotube fabric formed from that process. Typically, within such a drying process (as is shown in FIGS. 17A and 17B), once nanotube elements become organized (as shown in process steps 1702 and 1705), they will tend to stay organized as the remaining liquid medium is removed. As such, according to the methods of the present disclosure, it should be noted that in certain applications, the method and speed at which a nanotube formulation is deposited over a material layer and dried can have an effect on the surface roughness of a nanotube fabric being formed.

Looking to final process step 1703 of FIG. 17A, substantially all of liquid medium 1740 has been removed and nanotube elements 1710 have been formed into a nanotube fabric over the surface of material layer 1750. As described above, due to the low repulsion distance 1720a caused by the high concentration of ionic species 1730 within the nanotube formulation, nanotube elements 1710 are able to fit together tightly in an irregular arrangement. This irregular, haphazard arrangement results in the surface of this nanotube fabric being significantly rough, as is detailed within process step 1703.

Looking now to first process step 1704 of FIG. 17B, a nanotube formulation has again been deposited over material layer 1750. It should be noted that number, size, and portion of nanotube elements 1710 in first process step 1704 of FIG. 17B are identical to those shown in first process step 1701 of FIG. 17A. The difference between the exemplary operations of FIG. 17A (process steps 1701-1703) and 17B (process steps 1704-1706) is that the nanotube formulation within the exemplary operation of FIG. 17B has a significantly lower concentration of ionic species elements 1730, as compared with the nanotube formulation of FIG. 17A. As a result, the repulsion distance 1720b around nanotube elements 1710 in FIG. 17B is significantly greater than the repulsion distance 1720a within the exemplary operation of FIG. 17A. As detailed within process steps 1705 and 1706 (and described in more detail below), this increased repulsion distance 1720b results in nanotube elements 1710 forming into a relatively regular and organized arrangement, resulting in a smoother nanotube fabric as compared with the fabric formed by the exemplary operation of FIG. 17A.

Looking now to second process step 1705 of FIG. 17B, a significant volume of liquid medium 1740 has been removed resulting an intermediate structure wherein nanotube elements 1710 are forced closer together due to the reduced volume, similar to process step 1702 of FIG. 17A. Unlike within process step 1702 of FIG. 17A, however, the increased repulsion distance 1720b limits the movement of the nanotube elements 1710 and prevents them from forming into a tight arrangement (as happen in process step 1702), forcing them into a more organized arrangement.

Looking now to final process step 1706 of FIG. 17B, substantially all of liquid medium 1740 has been removed and nanotube elements 1710 have been formed into a nanotube fabric over the surface of material layer 1750 (similar to process step 1703 of FIG. 17A). As described above, however, due to the significantly large repulsion distance 1720b caused by the relatively low concentration of ionic species 1730 within the nanotube formulation, nanotube elements 1710 are kept further apart during the fabric formation process and, as a result, rendered into a more organized and regular arrangement. This organized, regular arrangement results in the surface of the nanotube fabric formed by the exemplary process of FIG. 17B being significantly smoother that the fabric resulting from the exemplary process of FIG. 17A, as is detailed within process step 1703. As is discussed previously within the present application (notably within examples 1-9, above), within certain applications, this ordered regular arrangement can result in nanotube elements 1710 forming into rafts as liquid medium 1740 is removed.

Figure 18A:
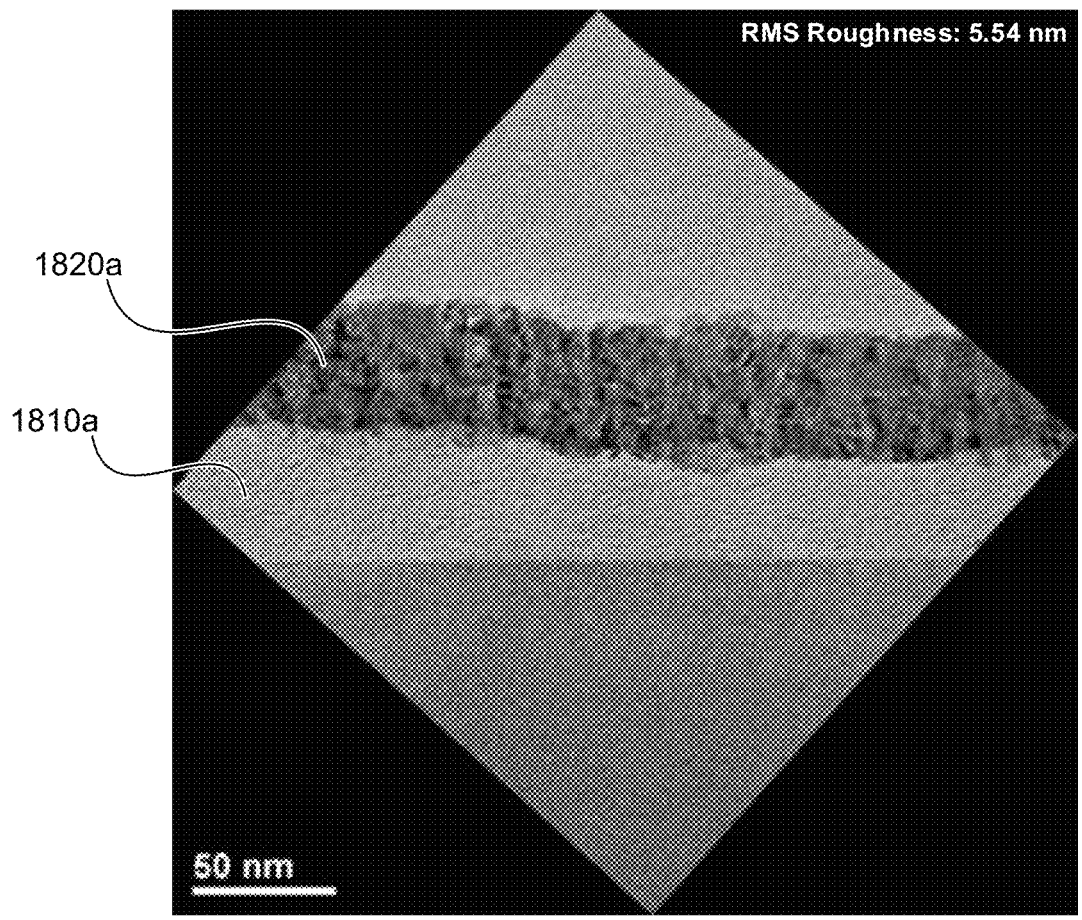
FIG. 18A is an TEM image of a cross-section of a nanotube fabric with a relatively high surface roughness.
Figure 18B:
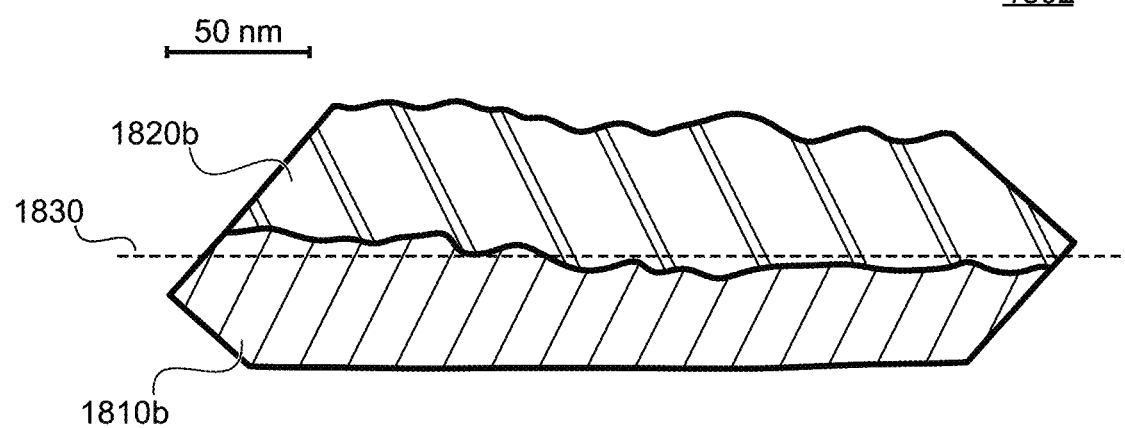
FIG. 18B is a line drawing of the TEM image of FIG. 18A.

FIGS. 18A and 18B are a TEM image and a line drawing, respectively, of a cross-section of a nanotube fabric, formed according to the methods of the present disclosure, with a relatively high surface roughness. This relatively rough nanotube fabric (1810a in FIG. 18A and 1810b in FIG. 18B) is analogous to the nanotube fabric shown in process step 1703 of FIG. 17A and has been shown here to detail an example of a nanotube fabric with a relatively rough surface.

Looking to FIG. 18A, nanotube fabric 1810a is formed over a substrate material layer from a nanotube formulation with a relatively high concentration level of ionic species (methods used to determine both high and low concentration levels for a given ionic species within a particular nanotube formulation will be discussed in detail below with respect to FIG. 22 and shown within examples 10-23). A conductive layer 1820a is then formed over nanotube fabric 1810a. FIG. 18B illustrates both of these material layers with a line drawing such that the surfaces of both material layers can be more easily seen. Within FIG. 18B, nanotube fabric layer 1810b represents nanotube fabric layer 1810a shown in the TEM image of FIG. 18A, and, similarly, conductive layer 1820b represents conductive layer 1820a shown in the TEM image of FIG. 18A. Horizontal surface line 1830 is included in the line drawing of FIG. 18B to provide a reference for the relative surface roughness of nanotube fabric 1810a/1810b. As can be seen in FIG. 18B, the actual surface of nanotube fabric 1810b varies significantly above and below horizontal surface line 1830. Further, the RMS roughness of nanotube fabric 1810a has been calculated to be 5.54 nm by analyzing an AFM image of the same fabric using methods that will be described in detail with respect to examples 10-23 and FIG. 27 below.

Figure 19A:
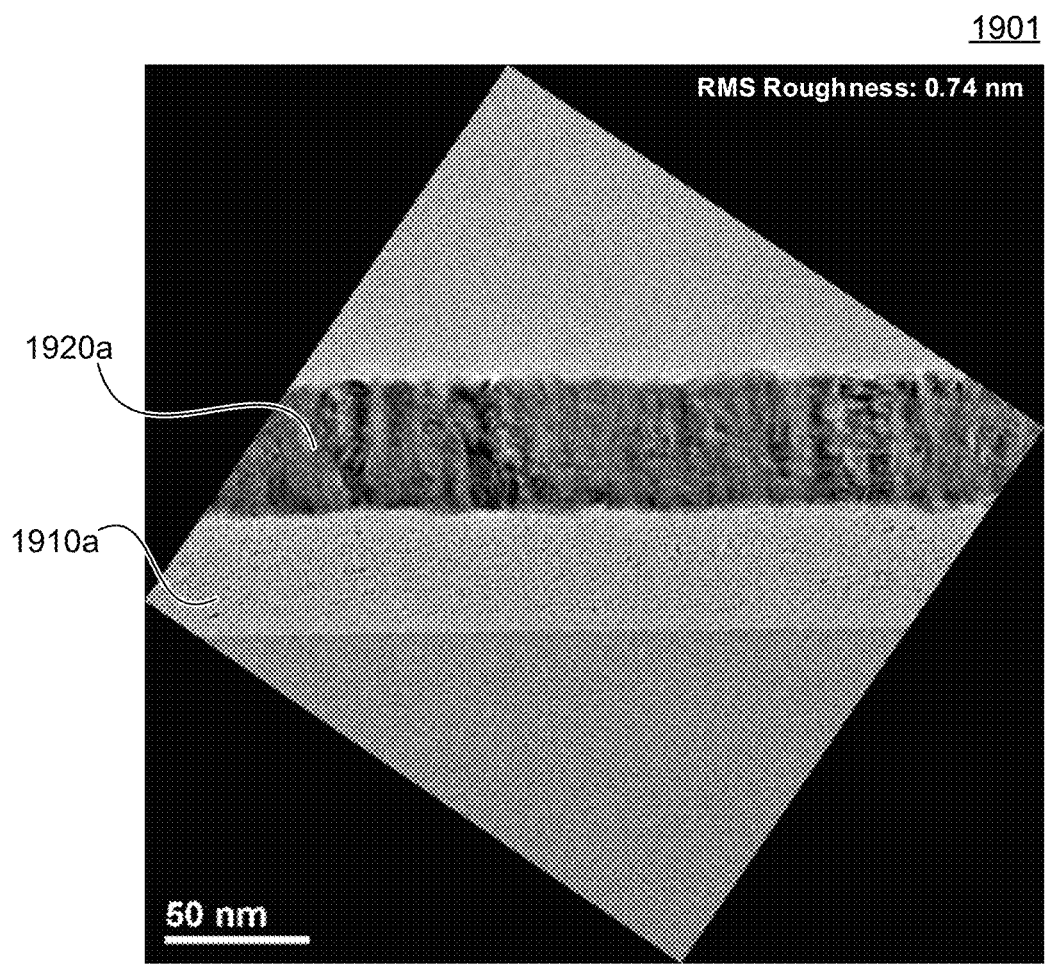
FIG. 19A is an TEM image of a cross-section of a nanotube fabric with a relatively low surface roughness.
Figure 19B:
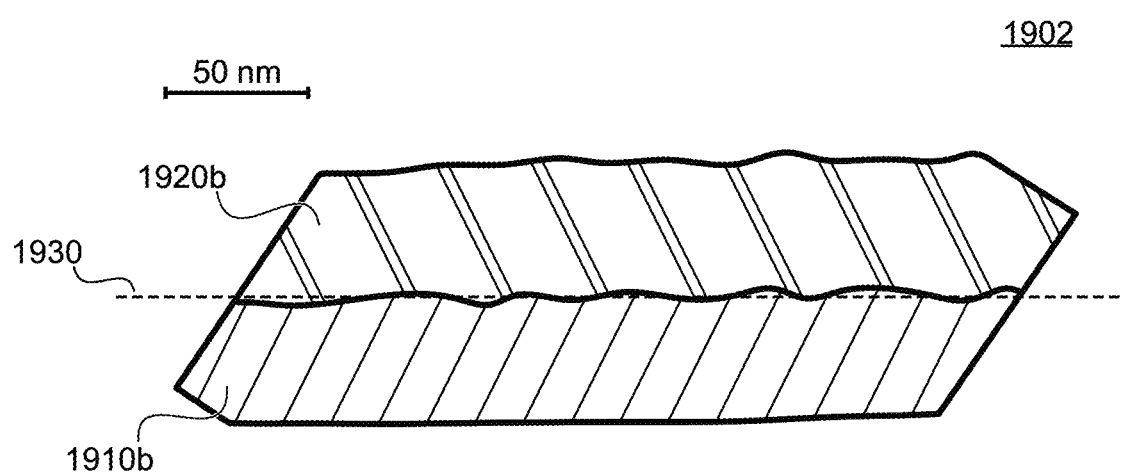
FIG. 19B is a line drawing of the TEM image of FIG. 19A.

FIGS. 19A and 19B are a TEM image and a line drawing, respectively, of a cross-section of a nanotube fabric, formed according to the methods of the present disclosure, with a relatively low surface roughness. This relatively smooth nanotube fabric (1910a in FIG. 19A and 1910b in FIG. 19B) is analogous to the nanotube fabric shown in process step 1706 of FIG. 17B and has been shown here to detail an example of a nanotube fabric with a relatively smooth surface.

Looking to FIG. 19A, nanotube fabric 1910a is formed over a substrate material layer from a nanotube formulation with a relatively low concentration level of ionic species (methods used to determine both high and low concentration levels for a given ionic species within a particular nanotube formulation will be discussed in detail below with respect to FIG. 22 and then shown within examples 10-23). A conductive layer 1920a is then formed over nanotube fabric 1910a. FIG. 19B illustrates both of these material layers with a line drawing such that the surfaces of both material layers can be more easily seen. Within FIG. 19B, nanotube fabric layer 1910b represents nanotube fabric layer 1910a shown in the TEM image of FIG. 19A, and, similarly, conductive layer 1920b represents conductive layer 1920a shown in the TEM image of FIG. 19A. Horizontal surface line 1930 is included in the line drawing of FIG. 19B to provide a reference for the relative surface roughness of nanotube fabric 1910a/1910b. As can be seen in FIG. 19B, the actual surface of nanotube fabric 1910b does not vary significantly above or below horizontal surface line 1930, especially as compared to FIG. 18B. Further, the RMS roughness of nanotube fabric 1910a has been calculated to be 0.74 nm by analyzing an AFM image of the same fabric using methods that will be described in detail with respect to examples 10-23 and FIG. 27 below and is significantly less than the roughness calculated for the nanotube fabric 1810a of FIG. 18A.

As described above, the parameters of a particular nanotube formulation can greatly affect the concentration levels of a given ionic species required to promote or discourage rafting within a nanotube fabric formed from that formulation and also the surface roughness of that fabric. That is to say, as will be shown in detail below, a particular nanotube formulation, as defined by the present disclosure, and a given ionic species will be associated with a specific nanotube formulation roughness curve, that curve defined by the different parameters of the nanotube formulation itself. One of the significant parameters of a nanotube formulation that can significantly affect the shape of a nanotube formulation roughness curve is the type of nanotube used in the formulation. To this end, FIGS. 20A-20F are TEM images providing examples of the different types of nanotubes used within the examples of the present disclosure.

Figure 20A:
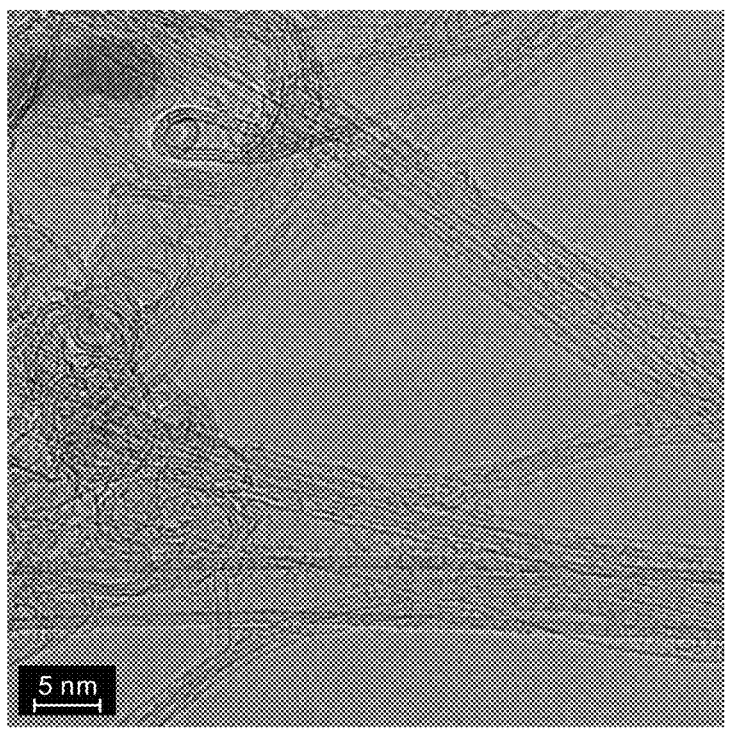
FIGS. 20A and 20B are first and second TEM images, respectively, of a first exemplary type of nanotube.
Figure 20B:
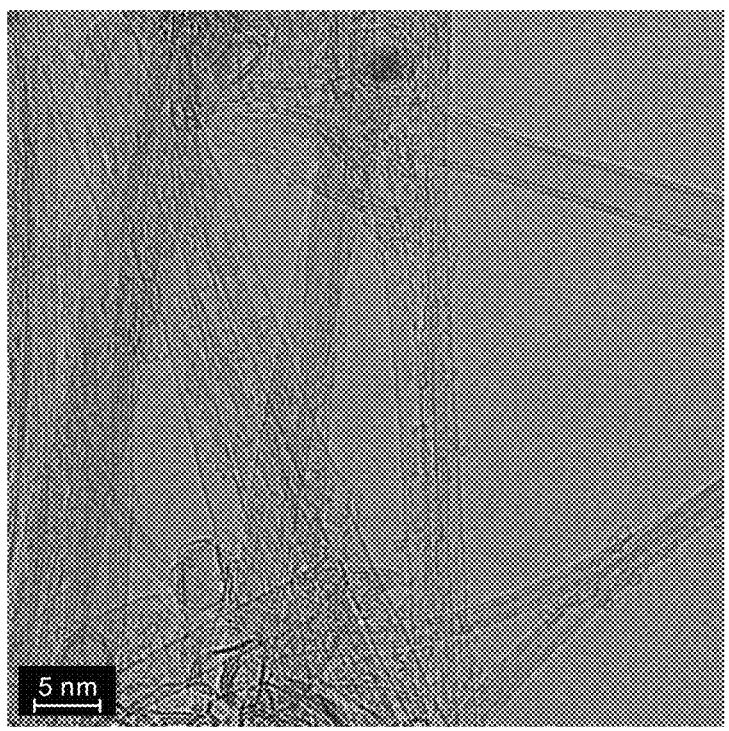

Looking to FIGS. 20A and 20B, a first exemplary type of nanotube is shown in SEM images 2001 and 2002, respectively. This first exemplary type of nanotube is used in examples 1-9 above. The nanotubes shown in FIGS. 20A and 20B are predominately double-walled carbon nanotubes, that are relatively long and straight (that is, have few bends, kinks or curves). This first exemplary type of nanotube had a median length of 290 nm and a 95th percentile length of 810 nm. As described above with respect to examples 1-9, nanotubes of this type were functionalized and purified, then formed into nanotube formulations as described above. As detailed above with respect to examples 1-9, the nanotube formulations using this nanotube type and ammonium nitrate salt as an ionic species, generally, tended to raft below ionic species concentration levels of 10 ppm and had lower incidences of rafting with ionic species concentration levels above 20 ppm. Although, it can also be seen from the data with examples 1-9 that the density of nanotube within each nanotube formulation, also had an effect on the degree of rafting. It should be noted that examples 1-9 do not characterize or quantify the surface roughness of any of the fabrics generated. Examples 10-23 have been included in the present disclosure to provide examples and data for different formulations in terms of surface roughness.

Figure 20C:
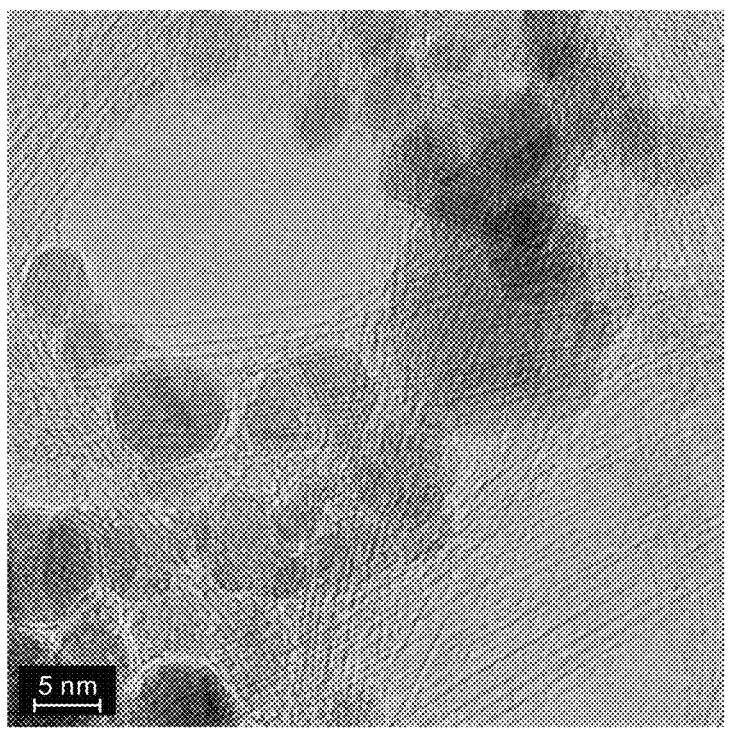
FIGS. 20C and 20D are first and second TEM images, respectively, of a second exemplary type of nanotube.
Figure 20D:
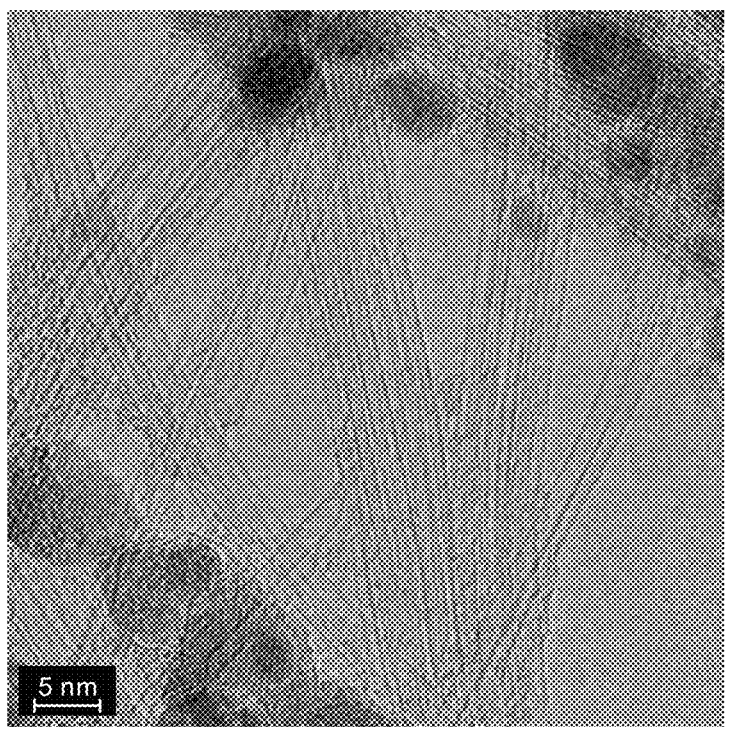

Looking now to FIGS. 20C and 20D, a second exemplary type of nanotube is shown in SEM images 2003 and 2004, respectively. This second exemplary type of nanotube is used within nanotube formulation "B" as described within examples 10-16, discussed in detail below. The nanotubes shown in FIGS. 20C and 20D are predominately singled-walled carbon nanotubes that are significantly shorter that the first exemplary nanotube type (FIGS. 20A and 20B) but longer than the third exemplary nanotube type (FIGS. 20E and 20F, discussed below) and straight (that is, have few bends, kinks or curves). This second exemplary type of nanotube had a median length of 187 nm and a 95th percentile length of 494 nm. As described within the discussion of examples 10-16, nanotubes of this type were functionalized and purified (via methods described within the discussion of FIG. 23A below) and formed into nanotube formulations. Formulations using this type of nanotube were then tested with ammonium nitrate salt ($NH_4NO_3$) in examples 11-13 to realize nanotube formulation roughness curve 2610 in FIG. 26A and tetramethyl ammonium formate (TMA Fm) in examples 14-16 to realize nanotube formulation roughness curve 2620 in FIG. 26B. The results of these curves (2610 and 2620) will be described in detail within the discussion of FIGS. 26A and 26B below.

Figure 20E:
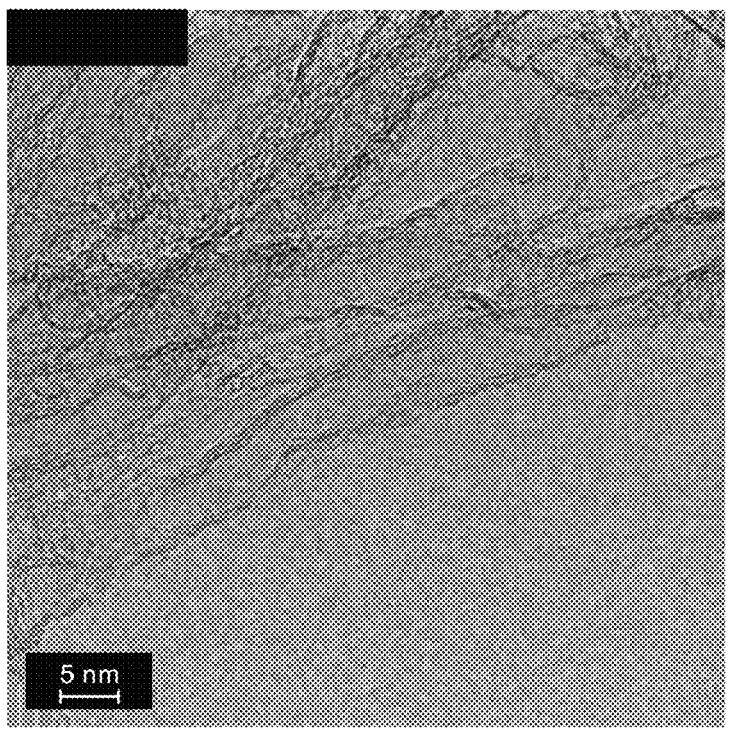
FIGS. 20E and 20F are first and second TEM images, respectively, of a third exemplary type of nanotube.
Figure 20F:
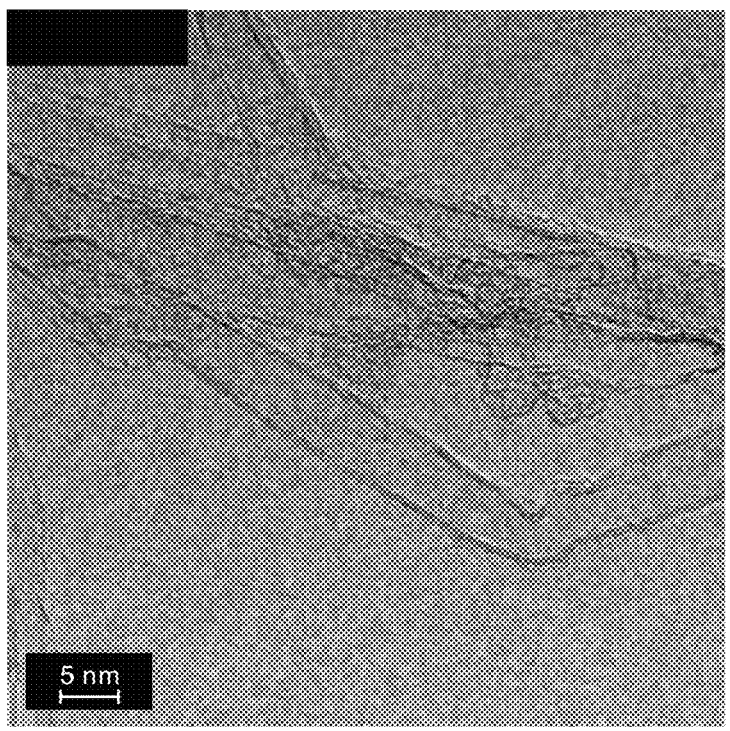

Looking now to FIGS. 20E and 20F, a third exemplary type of nanotube is shown in SEM images 2005 and 2006, respectively. This third exemplary type of nanotube is used within nanotube formulation "C" as described within examples 17-23, discussed in detail below. The nanotubes shown in FIGS. 20E and 20F are predominately multi-walled carbon nanotubes, each of which has a plurality of kinks and bends, and are significantly short as compared to the first and second exemplary type of nanotubes shown in FIGS. 20A and 20B and used within examples 1-9 and FIGS. 20C and 20D and used within examples 10-16. This second exemplary type of nanotube had a median length of 132 nm and a 95th percentile length of 260 nm. As described within the discussion of examples 17-23, nanotubes of this type were functionalized and purified (via methods described within the discussion of FIG. 23A below) and formed into nanotube formulations. Formulations using this type of nanotube were then tested with ammonium nitrate salt ($NH_4NO_3$) in examples 18-20 to realize nanotube formulation roughness curve 2630 in FIG. 26C and tetramethyl ammonium formate (TMA Fm) in examples 21-23 to realize nanotube formulation roughness curve 2640 in FIG. 26D. The results of these curves (2630 and 2640) will be described in detail within the discussion of FIGS. 26C and 26D below.

As described in above, while examples 1-9 described above use ammonium nitrate salt as an ionic species to adjust and control rafting in nanotube formulations, the methods of the present disclosure are not limited in this regard. Indeed, as discussed above, ionic species, as defined by the present disclosure, can include, but are not limited to, ammonium salts, nitrate salts, ammonium nitrate salts, ammonium formate, ammonium acetate, ammonium carbonate, ammonium bicarbonate, ionic organic species, ionic polymers, and inorganic salts. Further, cations well suited for use with the methods of the present disclosure include, but are not limited to: ammonium; all quaternary ammonium functionalities (e.g., tetraalkylammoniums such as, but not limited to, tetramethylammonium, tetraethylammonium, tetrapropylammonium, and dimethyldiethylammonium); acids of all primary, secondary, and tertiary aliphatic amines; acids of cylic amines (such as, but not limited to, piperidinium and pyrrolidinium); Cylic, aromatic quartenary amines (such as, but not limited to, imidazolium and pyridinium); and short chain alkyl phosphonium ions. Further, anions well suited for use with the methods of the present disclosure include, but are not limited to: bases of all soluble organic acids containing only nitrogen (N), oxygen, carbon (C), and hydrogen (H); simple soluble aliphatic carboxylic acids (such as, but not limited to, carbonate, formate, acetate, and proprionate); non-zwitterionic complex organic acids (such as, but not limited to, aromatic acids such as benzoate); nitrate; and phosphate. For certain applications wherein electronic fabrication cleanroom standards are not required (for example, but not limited to, nanotube fabrics used for material coatings), inorganic ionic species can be used with the methods of the present disclosures. Such nonvalent inorganic ionic species include, but are not limited to, cations of sodium, calcium, potassium, and magnesium and anions of chloride, bromide, sulfate, nitrate, and carbonate.

To this end, FIG. 21 provides a table 2100 of cations and anions which can be used to form a plurality of ionic species well-suited for use with the methods of the present disclosure. It should be noted that this table is intended to provide a list of exemplary ionic species and the methods of the present disclosure should not be limited to this list. As described by the present disclosure, each of these ionic species can result in a different nanotube formulation roughness curve for a given nanotube formulation. As such, the present disclosure provides methods for characterizing nanotube formulations to generate nanotube formulation roughness curves (as described within the discussion of FIG. 24 below) for a specific ionic species used within a specific nanotube formulation.

As previously discussed, the earlier sections of the present disclosure as well as examples 1-9 describe methods for controlling the degree of rafting within a nanotube fabric. The present disclosure now describes methods for not only controlling the degree of rafting within a nanotube fabric but also for selecting the surface roughness of the nanotube fabric at the same time. As has been described above and will be shown within examples 10-23, the generation of a nanotube formulation roughness curve for a given nanotube formulation and ionic species allows for control (via adjustment of the ionic species concentration level) of the surface roughness of a nanotube fabric and the degree of rafting within a nanotube fabric.

Figure 22:
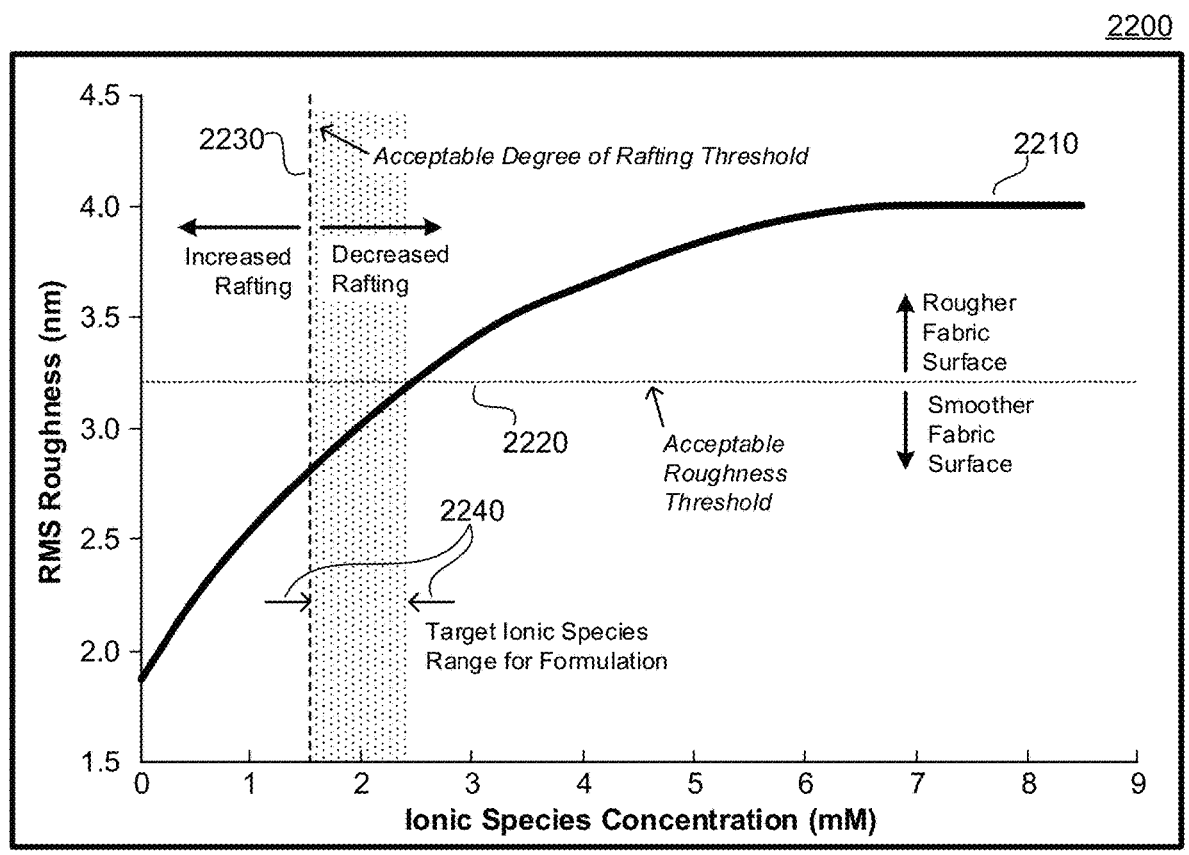
FIG. 22 is a labeled example of a nanotube formulation roughness curve.

FIG. 22 is a labeled example of a nanotube formulation roughness curve 2200 intended to illustrate how such a curve can be used to adjust the ionic species concentration of a nanotube formulation to produce a nanotube fabric with a desired surface roughness and degree of rafting. It should be noted that the exemplary nanotube formulation roughness curve 2200 of FIG. 22 as well as nanotube formulation roughness curves detailed in the discussions of examples 10-23 (FIGS. 26A-26D) are targeted at providing relatively smooth nanotube fabrics with a low degree of rafting. However, the methods of the present disclosure are not limited in this regard. As will be described below, the selection of utilizable range within a nanotube formulation roughness curve will be dependent on the needs and requirements of a specific application. For example, certain applications might require a highly rafted fabric. Other applications might require a very rough fabric. As will be shown below, the requirements of a specific application are used to set threshold values, which are then used to define a utilizable range 2240 within a nanotube formulation roughness curve. This utilizable range 2240 then provides a target ionic species concentration level zone on the curve indicative of concentration values that will provide a nanotube fabric that meets the given requirements.

Looking now to FIG. 22, curve 2200 plots the concentration of the selected ionic species in millimoles (mM) on the x-axis and the RMS roughness value in nanometers (nm) of a nanotube fabric formed with a nanotube formulation at a given concentration on the y-axis. In practice, such a nanotube formulation roughness curve is generated experimentally by forming a plurality of identical nanotube formulations, adjusting the ionic species concentration level in each of these nanotube formulations to a different value, forming a nanotube fabric with each of the differently adjusted nanotube formulations, and then measuring the RMS roughness of and degree of rafting within each of the resulting nanotube fabrics. This method of generating a nanotube formulation roughness curve for a given nanotube formulation and ionic species is detailed in FIG. 24 and described in more detail in the discussion of that figure below. The nanotube formulation roughness curves of FIGS. 26A-26D (2610, 2620, 2630, and 2640), which plot the results of examples 10-23 to realize four different nanotube formulation roughness curves, were each created using four data points realized experimentally in this manner. However, the methods of the present disclosure are not limited in this regard. Indeed, any number of data points can be used to produce a nanotube formulation roughness curve, including, but not limited to, 2, 3, 4, 5, 10, 15, 20, 50, or 100. This is to say, the number of data points generated and used to create a nanotube formulation roughness curve is only limited by the specific needs of an application.

Looking back now to FIG. 22, curve 2210 is imagined to be plotted through a number of experimentally obtained data points. As curve 2210 is intended as an illustrative example, no actual data was used to generate this curve. However, the nanotube formulation roughness curves of FIGS. 26A-26D provide curves generated through real experimentally obtained data. A horizontal line 2220 is drawn through curve 2210 and is indicative of the acceptable roughness threshold for a selected application. As indicated by the arrows on the plot, any points on the curve above this line 2220 will have a surface roughness greater than this selected threshold, and any point on the curve below this line with have a roughness lower than this threshold. Similarly, a vertical line 2230 is drawn through curve 2210 and is indicative of the acceptable degree of rafting threshold for a selected application. As indicated by the arrows on the plot, any points to the left of this line 2230 will have a degree of rafting higher than this threshold, and any points to the right of this line 2230 will have a degree of rafting lower than this threshold. The points on the curve 2210 that cross these two threshold lines (2220 and 2230) define a utilizable range 2240 within the nanotube formulation roughness curve 2200. By adjusting an ionic species concentration level within a nanotube formulation to within this utilizable range 2240, nanotube fabrics can be formed with the surface roughness and degree of rafted required for a selected application.

As is detailed within exemplary nanotube formulation curve 2200, lower concentrations of ionic species within a nanotube formulation generally tend to result in nanotube fabrics with smoother surfaces and a higher degree of rafting, while higher concentrations of ionic species within a nanotube formulation generally tend to result in nanotube fabrics with rougher surfaces and a low degree of rafting. Within certain applications (for example, but not limited to, two-terminal nanotube switching devices, as described in U.S. Pat. No. 7,781,862 described above), it can be advantageous to use nanotube fabrics that are both relatively smooth and exhibit a low degree of rafting. The exemplary utilizable range 2240 of nanotube formulation roughness curve 2200 is selected to meet such a design requirement. However, as described above, the methods of the present disclosure are not limited in this regard. Indeed, in certain applications, wherein, for example, a very rough fabric is required, utilization zone 2240 could be drawn to define points on curve 2210 which fell above horizontal line 2220.

It should also be noted, that in certain applications a nanotube formulation roughness curve can be calculated once for a given nanotube formulation and ionic species combination, and then reused for operations using nanotube formulations with the same parameters. For example, within a large scale manufacturing operation wherein the parameters of a nanotube formulation could be reliably controlled and the methods for depositing that nanotube formulation also well-known and controlled, a nanotube formulation roughness curve could be produced experimentally a single time on an initial nanotube formulation, and then the resulting utilization range used on all subsequent builds of nanotube formulations with matching parameters used within the process. In this way, the methods of the present disclosure can be used to provide design parameters for a large scale manufacturing process that includes the large scale production of nanotube fabrics with a controlled and repeatable surface roughness and degree of rafting characteristics.

Figure 23A:
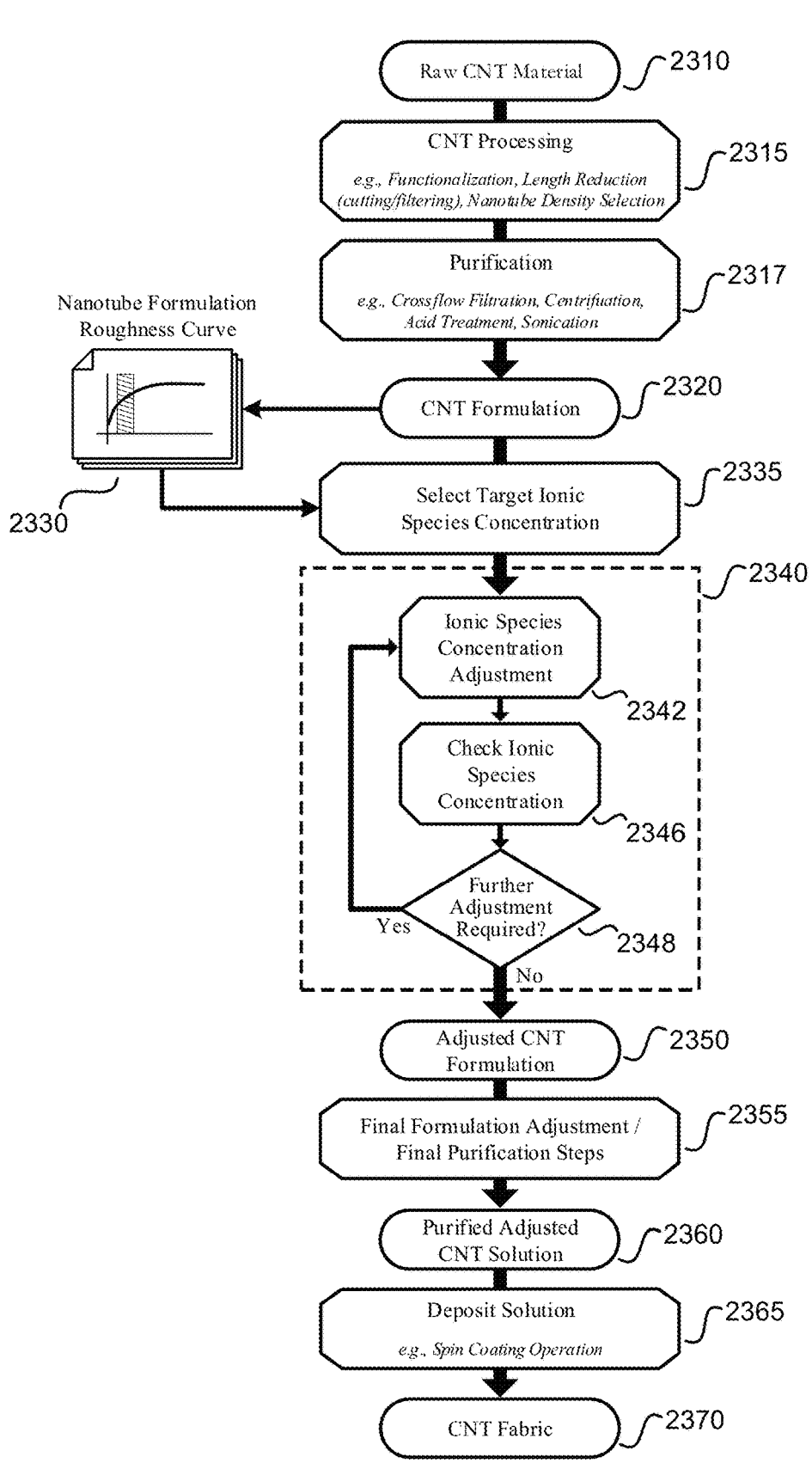
FIG. 23A is a flow chart detailing a method for producing a carbon nanotube (CNT) fabric with a preselected surface roughness and degree of rafting according to the methods of the present disclosure.

FIG. 23A is a flow chart detailing a method 2301 for producing a carbon nanotube (CNT) fabric with a preselected surface roughness and degree of rafting according to the methods of the present disclosure. The method begins with process step 2310 wherein Raw CNT Material is selected. As described above with respect to FIGS. 20A-20F, different types of nanotubes (for example, but not limited to, single walled, double walled, multiwalled, long, short, straight, kinked, metallic, semiconducting, and mixtures thereof) are selected as best befits the needs of a particular application. Within first process step 2310, the type or types of nanotube required is selected and produced in the required quantity.

In next process step 2315, the selected Raw CNT Material 2310 is processed and suspended in a liquid medium to form an initial nanotube application solution. Carbon nanotube (CNT) raw materials normally come in come in a solid non-solubilized form. They do not readily form stable, non-precipitating suspensions in typical solvating media, such as water, alcohols, esters, and ethers. In order to integrate the manufacturing of nanotube devices with existing semiconductor facilities, it is often necessary to prepare a spin- or spray-coatable nanotube solution or dispersion before use. For example, a nanotube powder has to be suspended, dispersed, solvated, or mixed in a liquid medium or solvent, so as to form a nanotube solution or dispersion. In some cases, this liquid medium could be water (including, but not limited to, distilled water or deionized water). In other cases, this liquid medium could be a non-aqueous solvent, such as, but not limited to, ethyl lactate, dimethyl sulfoxide (DMSO), monomethyl ether, 4-methyl-2 pentanone, N-methylpyrrolidone (NMP), t-butyl alcohol, methoxy propanol, propylene glycol, ethylene glycol, gamma-butyrolactone, benzyl benzoate, salicylaldehyde, tetramethyl ammonium hydroxide, and esters of alpha-hydroxy carboxylic acids. In other embodiments, the liquid medium may contain or be predominantly a non-halogenated solvent. To this end, CNT Processing step 2315 can include, but is not limited to, functionalizing of the nanotube elements, selecting the nanotube density of the application solution (via, for example, cutting of the nanotube elements and/or filtering operations), selecting the length distribution of the nanotube elements, and adjusting the pH level within the solution. Examples of such nanotube processing operations can be found in U.S. Pat. No. 9,634,251 and U.S. patent application Ser. No. 14/033,158 (now published as US2015/0086771), both of which are hereby included by reference in their entirety.

In a next processing step 2317, the initial nanotube application solution is purified using one or more purification steps to realize Carbon Nanotube (CNT) Formulation 2320. Purification process step 2317 can include one or more purification operation such as, but not limited to, a cross-flow filtration (CFF) process, a vacuum filtration process, sonication, a depth filter process, centrifugation, treatments of certain chemicals, and/or any combinations thereof. Dependent on the needs of a particular application, such purification processes can be effective in producing highly pure nanotube formulations—that is, formulations substantially free of surfactants, metallic impurities, other additives etc. Methods for purifying nanotube application solutions are described in U.S. Pat. Nos. 9,650,732 and 10,069,072, both of which are hereby included by reference in their entirety.

It should be noted that CNT Processing step 2315 and Purification step 2317 can be, in certain applications, be performed together, simultaneously, or have steps interspersed. That is, within such applications raw CNT materials 2310 may first go through a processing step (a functionalization step, for example), then go through a purification step (acid treatment, for example), then go through a second process step (length adjustment, for example), followed by a second purification step (a cross-flow filtration process, for example). Additionally, some treatments to an initial CNT application solution can serve as both a CNT Processing step 2315 and a Purification step 2317 (acid treatment or filtering, for example). As such, while FIG. 23A depicts these two process steps (2315 and 2317) as being performed separately and in a sequence, this is done solely for ease of explanation and the methods of the present disclosure should not be limited in this regard. Indeed, as discussed above, the processing of raw CNT materials and the purification of those materials can be performed within a plurality of individual process steps performed in any order or even simultaneously.

Further, in certain applications, volumes of ionic species material can be introduced to the initial application solution during CNT Processing process step 2315 and Purification process step 2317. Within such applications, CNT Formulation 2320 includes non-zero concentration levels of one or more ionic species immediately subsequent to process steps 2315 and 2317. In some applications, this "preloaded" ionic species material is introduced into the initial application solution as part of the ionic species concentration level adjustment process (introducing a desired ionic species at an initial concentration level, for example). In other applications, the introduction of ionic species material at this point in the process (process steps 2315 and 2317) will simply be an effect of the processing or purification processes used. In either case, as described below, the methods of the present disclosure are well suited to either adjust the concentration level of the preloaded ionic species to a desired target level (in the case wherein the preloaded ionic species is of a desired type for a given application) or remove the preloaded ionic species and replace it with a different ionic species type (in the case wherein the preloaded ionic species is of an undesired type for a given application).

Within the next several process steps the ionic species concentration level of CNT Formulation 2320 is adjusted according to the methods of the present disclosure such that the ionic species concentration level falls within the utilization range as required by the specific needs of the application in which the nanotube fabric being formed will be used. The adjustment process first starts by either generating Nanotube Formulation Roughness curve 2330 for CNT Formulation 2320 or by using such a curve that has been previously generated for CNT Formulation 2320 (as described above). Within process step 2335, the utilization range obtained from Nanotube Formulation Roughness Curve 2330 is used to select a target ionic species concentration level. Within sub-method 2340, the ionic species concentration level of CNT Formulation 2320 is adjusted (using one or more cycles) to this target value to realize Adjusted CNT Formulation 2350.

Sub-method 2340 includes a plurality of process steps, which—dependent on the needs of a particular application—can be repeated multiple times. In some applications, a first ionic species type is removed (all or in part) from CNT Formulation 2320 in a first operation, then a second ionic species type is added in a second operation such that the second ionic species type is present in Adjusted CNT Formulation 2350 at the target concentration. In other applications, CNT Formulation 2320 is substantially devoid of ionic species (having an ionic species concentration of essentially zero) immediately subsequent to CNT Processing step 2315 and Purification steps 2317, and sub-method 2340 used (in a single iteration or within multiple iterations) to add in a selected ionic species to the target concentration level. In still other applications, CNT Formulation 2320 will have the desired ionic species present at some initial concentration level immediately subsequent to CNT Processing step 2315 and Purification steps 2317, and sub-method 2340 used (within a single iteration or within multiple iterations) to either raise or lower this initial concentration level to the target concentration level.

Sub-method 2340 first includes process step 2342 wherein the concentration level of ionic species within the CNT Formulation 2320 is adjusted. Process step 2346 then determines the new concentration level of ionic species present in the nanotube formulation subsequent to this adjustment process. Finally, process step 2348 determines if further adjustment of the ionic species concentration level is required. If more adjustment is needed, sub-method 2340 begins again with process step 2342. This loop continues until the selected ionic species with CNT Formulation 2320 has a concentration level within an acceptable range of the target concentration level, at which point CNT formulation 2320 has been sufficiently adjusted to realize Adjusted CNT Formulation 2350. Methods for adjusting the ionic species concentration level (that is, process step 2342) are described within the discussions of FIGS. 23B-23D below and include, but are not limited to, cross-flow filtration processes, ion exchange processes, dialysis, and chemical treatment.

In a next process step 2355, adjusted CNT formulation 2355 is processed through one or more final formulation adjustment steps (such as, but not limited to, the addition of surfactants or molecular additives as described in U.S. Pat. No. 9,634,251) and final purification steps to realize Purified Adjusted CNT Solution 2360. In next process step 2365, Purified Adjusted CNT Solution 2360 is deposited (via, for example, but not limited to, a spin coating operation) to form CNT Fabric 2370. As Purified Adjusted CNT Solution 2360 has an ionic species concentration level corresponding to a selected surface roughness parameter and/or a selected degree of rafting, CNT Fabric 2370 will exhibit these properties. In this way, the present disclosure provides a method for forming a nanotube fabric with a selected surface roughness and degree of rafting.

Figure 23B:
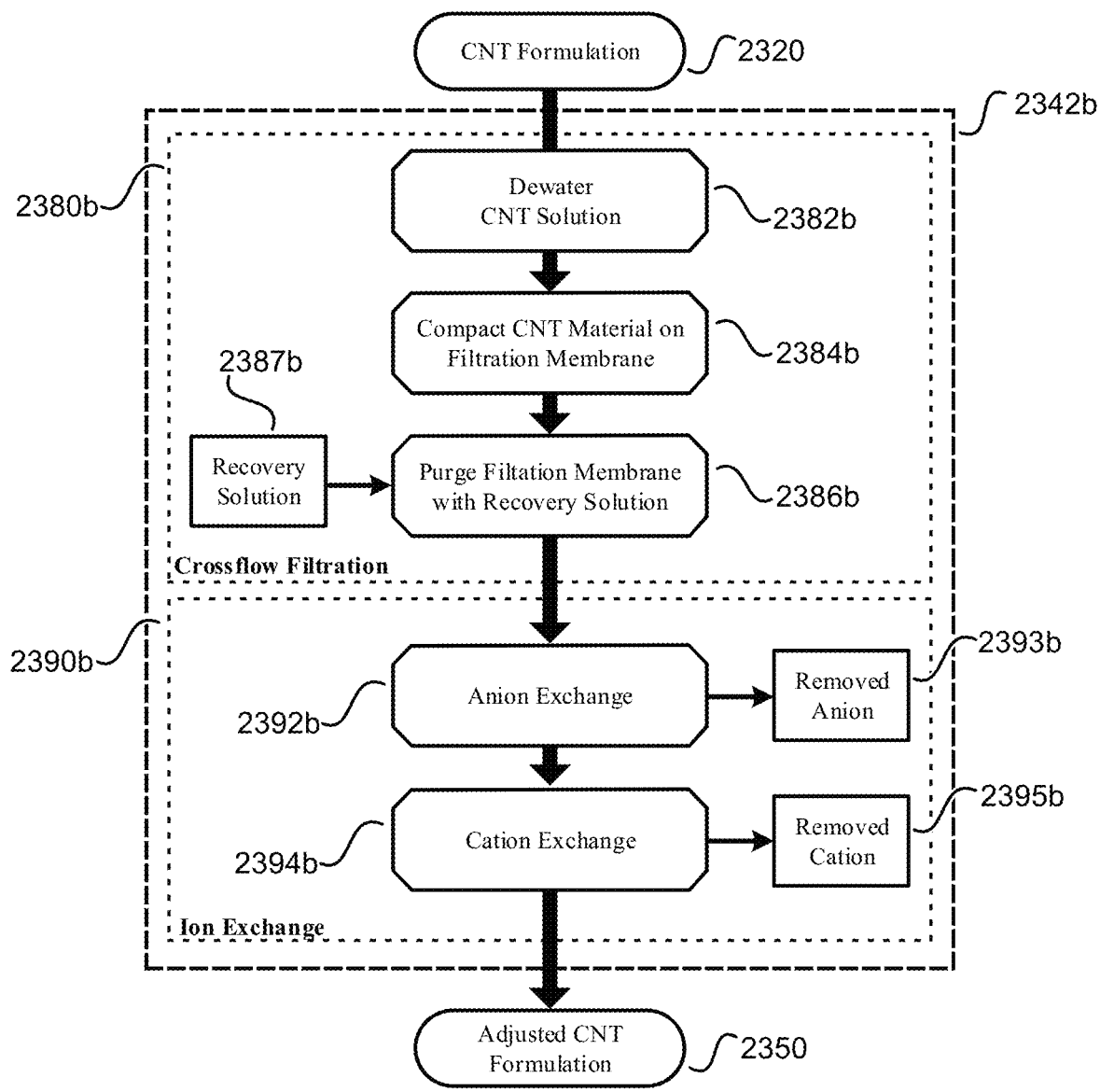
FIG. 23B is a flow chart depicting a first exemplary ionic species adjustment process according to the methods of the present disclosure, which is imagined to be designed to reduce the ionic species concentration level of a CNT formulation to a very low or substantially zero value.

FIG. 23B is a flow chart 2302 depicting a first exemplary Ionic Species Adjustment Process 2342b according to the methods of the present disclosure, which is imagined to be designed to reduce the ionic species concentration level of CNT Formulation 2320 to a very low or substantially zero value. First exemplary Ionic Species Adjustment Process 2342b is intended to be an expanded and more detailed version of process step 2342 in FIG. 23A (as are second and third exemplary Ionic Species Adjustment Processes 2342c within FIG. 23C and 2342d within FIG. 23D, respectively, discussed further below), which takes CNT Formulation 2320 and adjusts the ionic species concentration level within that formulation to realize Adjusted CNT Formulation 2350, as described above with respect to FIG. 23A.

First exemplary Ionic Species Adjustment Process 2342b is comprised of two sub-processes: a Crossflow Filtration sub-process 2380b and an Ion Exchange sub-process 2390b. Crossflow Filtration process 2380b is first used to remove a significant volume of ionic species from CNT Formulation 2320. Then, Ion Exchange sub-process 2390b is used to further reduce the concentration level of the remaining ionic species within the nanotube formulation (as described within the discussion of FIG. 23A above). In this way, the concentration of ionic species present within CNT Formulation 2320 is adjusted to a very low or substantially zero level.

It should be noted that within FIG. 23B, Crossflow Filtration sub-process 2380b and Ion Exchange sub-process 2390b are depicted, for ease of explanation, as each being performed only a single time. However, as described above within the discussion of FIG. 23A, the methods of the present disclosure are not limited in this regard. Indeed, in some applications Crossflow Filtration sub-process 2380b could be performed multiple times prior to the start of Ion Exchange sub-process 2390b. Similarly, Ion Exchange sub-process 2390b could also be, within certain applications, performed multiple times subsequent to the conclusion of one or more Crossflow Filtration sub-process 2380b iterations. Further, the entire Ionic Species Adjustment process 2342b could be, within certain applications, looped and performed multiple times (as is depicted in FIG. 23A) to achieve a desired ionic species concentration level.

As depicted in FIG. 23B, Crossflow Filtration sub-process 2380b is comprised of a plurality of sub-process steps. CNT Formulation 2320 is first dewatered in sub-process step 2382b such that the CNT material within the formulation is compacted onto a filtration membrane in process step 2384b. In this way, a significant volume—or in some cases, substantially all—of any ionic species material present within CNT Formulation 2320 is separated from the CNT material, as the ionic species material passes through the filter membrane while the CNT material is compacted onto the filter membrane. In a next sub-process step 2386b, the filtration membrane is purged with Recovery Solution 2387b. As Crossflow Filtration sub-process 2380b is intended to reduce the concentration level of ionic species within CNT Formulation 2320, Recovery Solution 2387b is selected to be a low-salt containing material, such as, but not limited to, deionized water. In this way, the compacted CNT material is recovered back into a formulation with a significantly lower ionic species concentration as compared to CNT formulation 2320. As described above, Crossflow Filtration sub-process 2380b can be performed a single time, as is depicted in FIG. 23B, or repeated once or more to further reduce the ionic species concentration level present in CNT Formulation 2320.

Looking now to Ion Exchange sub-process 2390b, the ionic species concentration level of CNT Formulation 2320 is further reduced subsequent to the concentration reduction performed by Crossflow Filtration sub-process 2380b. Within certain applications, Ion Exchange sub-process 2390b comprises a series of individual ion exchange steps, each of which flow CNT Formulation 2320 through a resin column containing a specific type of ion exchange resin. These ion exchange steps can target the removal of a specific ion (for example, but not limited to, $FE^{2+}$ or $CA^{2+}$) or a broad category of ions (for example, but not limited to, all anions or all cations). In certain applications, a mixed bed ion exchange can also be used to remove both anions and cations within a single process step.

As first exemplary Ionic Species Adjustment process 2342b is imagined to be focused on reducing ionic species concentration levels, it is imagined that Anion Exchange sub-process step 2392b first removes substantially all anions present within the formulation using, for example, an $OH^-$ charged column. Subsequently, Cation Exchange sub-process step 2394b then removes substantially all cations present within the formulation using, for example, a $H^+$ charged column. As described above, Ion Exchange sub-process 2390b can be performed a single time, as is depicted in FIG. 23B, or repeated once or more to further reduce the ionic species concentration level present in CNT Formulation 2320. Further, while FIG. 23B depicts Anion Exchange sub-process step 2392b being performed prior to Cation Exchange sub-process step 2394b, the methods of the present disclosure are not limited in this regard. Indeed, as described above, in certain applications Cation Exchange sub-process step 2394b could be performed prior to Anion Exchange sub-process step 2392b. Further, in certain applications both the cation exchange and anion exchange sub-process steps could be performed together using a mixed bed ion exchange process.

In this way, a significant volume (or in, some cases, substantially all) of ionic species present in CNT Formulation 2320 can be removed using a combination of Crossflow Filtration sub-process 2380b and Ion Exchange sub-process 2390b, resulting in Adjusted CNT Formulation 2350, which, within this particular ionic species adjustment process example 2302, has a very low (or substantially zero) concentration level of ionic species.

It should be noted that while first exemplary Ionic Species Adjustment Process 2342b is depicted as first using a Crossflow Filtration sub-process 2380b followed by a subsequent Ion Exchange sub-process 2390b, the methods of the present disclosure are not limited in this regard. Indeed, in certain applications an ionic species adjustment process targeted at reducing ionic species concentration within a CNT formulation could include only Crossflow Filtration sub-process step 2380b (performed once or multiple times) or only Ion Exchange sub-process step 2390b (performed once or multiple times). Further, within certain applications such an ionic species adjustment process could perform Ion Exchange sub-process 2390b (performed once or multiple times) prior to Crossflow Filtration sub-process step 2380b (performed once or multiple times).

Figure 23C:
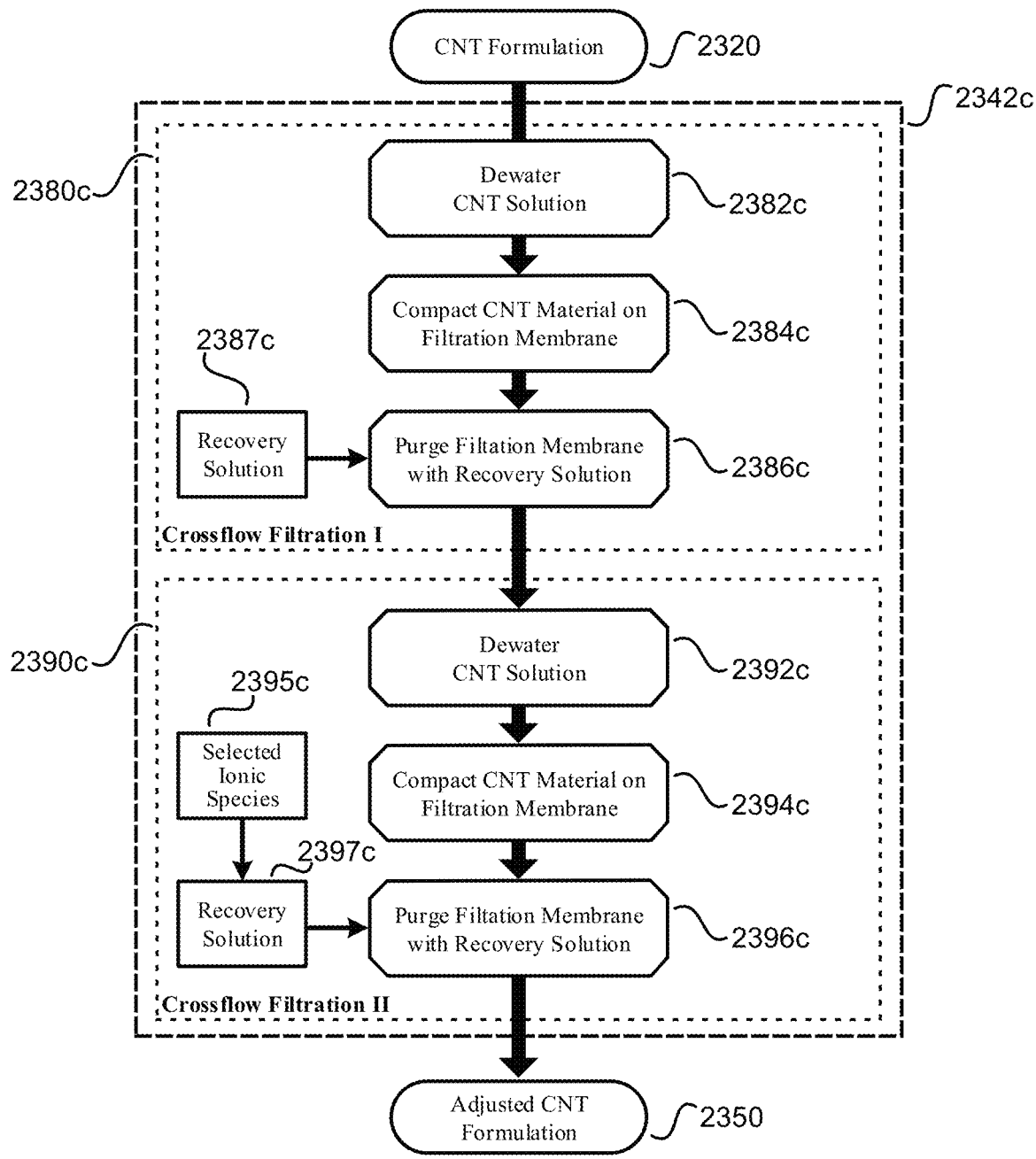
FIG. 23C is a flow chart depicting a second exemplary ionic species adjustment process according to the methods of the present disclosure, which is imagined to be designed to substantially remove a first type of ionic species from a CNT formulation and replace it with a second type of ionic species at a selected concentration level.

FIG. 23C is a flow chart 2303 depicting a second exemplary Ionic Species Adjustment Process 2342c according to the methods of the present disclosure, which is imagined to be designed to substantially remove a first type of ionic species from CNT Formulation 2320 and replace it with a second type of ionic species at a selected concentration level. Second exemplary Ionic Species Adjustment Process 2342c is intended to be an expanded and more detailed version of process step 2342 in FIG. 23A (as are first and third exemplary Ionic Species Adjustment Processes 2342b within FIG. 23B and 2342d within FIG. 23D, respectively), which takes CNT Formulation 2320 and adjusts the ionic species concentration level within that formulation to realize Adjusted CNT Formulation 2350, as described above with respect to FIG. 23A.

Second exemplary Ionic Species Adjustment Process 2342c is comprised of two sub-processes: a first Crossflow Filtration sub-process 2380c ("Crossflow Filtration I") and a second Crossflow Filtration sub-process 2390c ("Crossflow Filtration II"). First Crossflow Filtration sub-process 2380c is first used to remove a significant volume of a first ionic species from CNT Formulation 2320. This first ionic species is imagined to be present with CNT Formulation 2320 subsequent to CNT Processing 2315 and Purification 2317 steps of FIG. 23A and to be undesired within Adjusted CNT Formulation 2350. Then, second Crossflow Filtration sub-process 2390b is used to introduce a second ionic species type into CNT Formulation 2320 at the target concentration level (as determined in process step 2335 in FIG. 23A). In this way, the concentration level of an undesired ionic species is significantly lowered (or, in certain applications, made essentially zero) within CNT Formulation 2320 and a desired ionic species is introduced into CNT Formulation 2320 and adjusted to the preselected target level (as determined in process step 2335 in FIG. 23A).

It should be noted that within FIG. 23C, both first Crossflow Filtration sub-process 2380c and second Crossflow Filtration sub-process 2390c are depicted, for ease of explanation, as each being performed only a single time. However, as described above within the discussion of FIG. 23A, the methods of the present disclosure are not limited in this regard. Indeed, in some applications first Crossflow Filtration sub-process 2380c could be performed multiple times prior to the start of second Crossflow Filtration sub-process 2390c. Similarly, second Crossflow Filtration sub-process 2390c could also be, within certain applications, performed multiple times subsequent to the conclusion of one or more first Crossflow Filtration sub-process 2380c iterations.

As depicted in FIG. 23C, first Crossflow Filtration sub-process 2380c is comprised of a plurality of sub-process steps. CNT Formulation 2320 is first dewatered in sub-process step 2382c such that the CNT material within the formulation is compacted onto a filtration membrane in process step 2384c. In this way, a significant volume—or in some cases, substantially all—of any ionic species material present within CNT Formulation 2320 is separated from the CNT material, as the ionic species material passes through the filter membrane while the CNT material is compacted onto the filter membrane. In a next sub-process step 2386c, the filtration membrane is purged with Recovery Solution 2387c. As first Crossflow Filtration sub-process 2380c is intended to reduce the concentration level of ionic species within CNT Formulation 2320, Recovery Solution 2387c is selected to be a low-salt containing material, such as, but not limited to, deionized water. In this way, the compacted CNT material is recovered back into a formulation with a significantly lower ionic species concentration as compared to CNT formulation 2320. As described above, first Crossflow Filtration sub-process 2380c can be performed a single time, as is depicted in FIG. 23C, or repeated once or more to further reduce the ionic species concentration level present in CNT Formulation 2320.

Second Crossflow Filtration sub-process 2390c is comprised of a plurality of sub-process steps, similar to those discussed above with respect to first Crossflow Filtration sub-process 2380c. Subsequent to processing through first Crossflow Filtration sub-process 2380c, CNT Formulation 2320 (at list point exhibiting a very low or zero ionic species concentration level) is again dewatered in sub-process step 2392c such that the CNT material within the formulation is compacted onto a filtration membrane in process step 2394c. In a next sub-process step 2396c, the filtration membrane is purged with Recovery Solution 2397c. As second Crossflow Filtration sub-process 2390c is intended to introduce a desired ionic species at the target ionic species concentration level (as determined within process step 2335 of FIG. 23A) into CNT Formulation 2320, Recovery Solution 2397c is preloaded with a selected volume of the Selected Ionic Species 2395c prior to process step 2396c. In this way, the compacted CNT material is recovered back into a formulation with along with a volume of ionic species selected to provide the target concentration level within the formulation. As described above, second Crossflow Filtration sub-process 2390c can be performed a single time, as is depicted in FIG. 23C, or repeated once or more to further reduce the ionic species concentration level present in CNT Formulation 2320.

In this way, a significant volume (or in, some cases, substantially all) of an undesired ionic species present in CNT Formulation 2320 can be removed and a desired ionic species added at a selected concentration level using a combination of Crossflow Filtration sub-processes (2380c and 2390c), resulting in Adjusted CNT Formulation 2350, which, within this particular ionic species adjustment process example 2303, has a concentration level of desired ionic species set at a desired target level (as determined by process step 2335 in FIG. 23A).

It should be noted that while second exemplary Ionic Species Adjustment Process 2342c is depicted as using two separate Crossflow Filtration sub-processes (first Crossflow Filtration sub-process 2380c followed by a second Crossflow Filtration sub-process 2390c), the methods of the present disclosure are not limited in this regard. Indeed, in certain applications the removal of a first undesired ionic species and the introduction of a second desired ionic species into a CNT formulation could be performed within a single crossflow filtration process. In such an operation, sub-process steps analogous to process step 2382c and 2384c (dewatering of the CNT formulation and compacting of the CNT material onto a filter membrane) could be used to first remove an undesired ionic species from the system, and then sub-process steps analogous to 2395c, 2397c, and 2396c (purging the filter membrane with a recovery solution preloaded with a selected volume of a second desired ionic species) could be used to introduce a desired ionic species into the system immediately subsequent to removing the first undesired ionic species. The depiction of these two sub-process steps as separate Crossflow Filtration sub-processes (2380c and 2390c) in FIG. 23C is done purely for ease of explanation, and the present disclosure should not be limited in this regard.

Figure 23D:
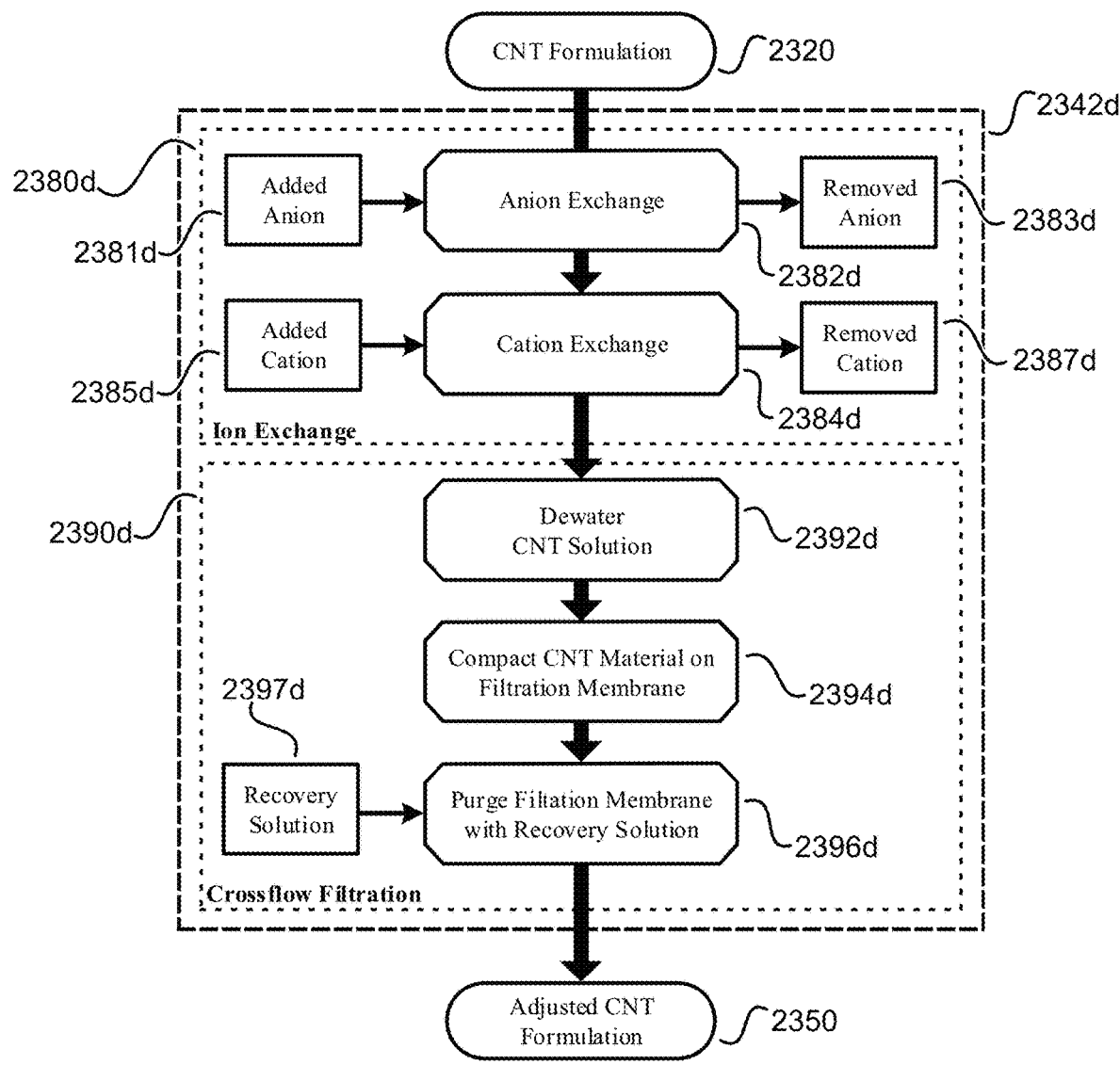
FIG. 23D is a flow chart depicting a third exemplary Ionic Species Adjustment Process according to the methods of the present disclosure, which is imagined to be designed to first exchange an undesired first type of ionic species within a CNT Formulation with a desired second type of ionic species and then lower the concentration level of that second type of ionic species within the formulation to a desired target level.

FIG. 23D is a flow chart 2304 depicting a third exemplary Ionic Species Adjustment Process 2342d according to the methods of the present disclosure, which is imagined to be designed to first exchange an undesired first type of ionic species within CNT Formulation 2320 with a desired second type of ionic species (using Ion Exchange sub-process 2380d), and then lower the concentration level of that second type of ionic species within the formulation to a desired target level (using Crossflow Filtration sub-process 2390d). Third exemplary Ionic Species Adjustment Process 2342d is intended to be an expanded and more detailed version of process step 2342 in FIG. 23A (as are first and second exemplary Ionic Species Adjustment Processes 2342b within FIG. 23B and 2342c within FIG. 23C, respectively), which takes CNT Formulation 2320 and adjusts the ionic species concentration level within that formulation to realize Adjusted CNT Formulation 2350, as described above with respect to FIG. 23A.

Third exemplary Ionic Species Adjustment Process 2342d is comprised of two sub-processes: an Ion Exchange sub-process 2380d and a Crossflow Filtration sub-process 2390d. Ion Exchange sub-process 2380d is first used to replace a first ionic species present within CNT Formulation 2320 with a second ionic species. Crossflow Filtration sub-process 2390d is then used, in a subsequent sub-process step to reduce the concentration level of the second ionic species within the CNT formulation. Within the present example, this first ionic species is imagined to be present with CNT Formulation 2320 subsequent to CNT Processing 2315 and Purification 2317 steps of FIG. 23A and to be undesired within Adjusted CNT Formulation 2350, while the second ionic species is imagine to be the desired ionic species, with a target concentration value determined in process step 2335 of FIG. 23A. In this way, the concentration level of an undesired ionic species is significantly lowered (or, in certain applications, made essentially zero) within CNT Formulation 2320 and a desired ionic species is introduced into CNT Formulation 2320 and adjusted to the preselected target level (as determined in process step 2335 in FIG. 23A).

It should be noted that within FIG. 23D, Ion Exchange sub-process 2380d and Crossflow Filtration sub-process 2390d are depicted, for ease of explanation, as each being performed only a single time. However, as described above within the discussion of FIG. 23A, the methods of the present disclosure are not limited in this regard. Indeed, in some applications Ion Exchange sub-process 2380d could be performed multiple times prior to the start of Crossflow Filtration sub-process 2390d. Similarly, Crossflow Filtration sub-process 2390d could also be, within certain applications, performed multiple times subsequent to the conclusion of one or more Ion Exchange sub-process 2380d iterations.

As depicted in FIG. 23D, Ion Exchange sub-process 2380d is comprised of a plurality of sub-process steps. Within certain applications, Ion Exchange sub-process 2380b comprises a series of individual ion exchange steps, each of which flow CNT Formulation 2320 through a resin column containing a specific type of ion exchange resin. These ion exchange steps can target the removal of a specific ion (for example, but not limited to, $FE^{2+}$ or $CA^{2+}$) or a broad category of ions (for example, but not limited to, all anions or all cations). In certain applications, a mixed bed ion exchange can also be used to remove both anions and cations within a single process step.

As Ion Exchange sub-process 2380d within third exemplary Ionic Species Adjustment process 2342d is imagined to be focused on replacing a first undesired specific ionic species with a second desired specific ionic species within CNT Formulation 2320, it is imagined that Anion Exchange sub-process step 2382d uses a resin column charged with the desired anion 2381d of the second ionic species to first exchange the undesired anion components 2383d within CNT Formulation 2320 in a first operation. Subsequently, Cation Exchange sub-process step 2384d then uses a resin column charged with the desired cation 2385d of the second ionic species to exchange the undesired cation components 2387d within CNT Formulation 2320. As described above, Ion Exchange sub-process 2380d can be performed a single time, as is depicted in FIG. 23D, or repeated once or more to further exchange more of the desired ionic species material with the undesired ionic species material within CNT Formulation 2320. Further, while FIG. 23D depicts Anion Exchange sub-process step 2382d being performed prior to Cation Exchange sub-process step 2384d, the methods of the present disclosure are not limited in this regard. Indeed, as described above, in certain applications Cation Exchange sub-process step 2384d could be performed prior to Anion Exchange sub-process step 2382d. Further, in certain applications both the cation exchange and anion exchange sub-process steps could be performed together using a mixed bed ion exchange process.

Looking now to Crossflow Filtration sub-process 2390d, the ionic species concentration level of CNT Formulation 2320 is reduced subsequent to the ionic species exchange operation performed by Ion Exchange sub-process 2380d. Crossflow Filtration sub-process 2390d is comprised of a plurality of sub-process steps. CNT Formulation 2320 is first dewatered in sub-process step 2392d such that the CNT material within the formulation is compacted onto a filtration membrane in process step 2394d. In this way, a significant volume of the desired ionic species material present within CNT Formulation 2320 can be separated from the CNT material, as the ionic species material passes through the filter membrane while the CNT material is compacted onto the filter membrane. In a next sub-process step 2396*d*, the filtration membrane is purged with Recovery Solution 2397*d*. As Crossflow Filtration sub-process 2390*d* is intended to reduce the concentration level of ionic species within CNT Formulation 2320, Recovery Solution 2397*d* is selected to be a low-salt containing material, such as, but not limited to, deionized water. In this way, the compacted CNT material is recovered back into a formulation with a significantly lower ionic species concentration as was present within the formulation at the conclusion of Ion Exchange sub-process 2380*d*. As described above, Crossflow Filtration sub-process 2390*d* can be performed a single time, as is depicted in FIG. 23D, or repeated once or more to further reduce the ionic species concentration level present in CNT Formulation 2320.

In this way, a significant volume (or in, some cases, substantially all) of an undesired ionic species present in CNT Formulation 2320 can be removed and a desired ionic species added at a selected concentration level using a combination of an Ion Exchange sub-process 2380*d* and a Crossflow Filtration sub-process 2390*d*, resulting in Adjusted CNT Formulation 2350, which, within this particular ionic species adjustment process example 2304, has a concentration level of desired ionic species set at a desired target level (as determined by process step 2335 in FIG. 23A).

It should be noted that while third exemplary Ionic Species Adjustment Process 2342*d* is depicted as first using an Ion Exchange sub-process 2380*d* followed by a subsequent Crossflow Filtration sub-process 2390*d*, the methods of the present disclosure are not limited in this regard. Indeed, in certain applications an ionic species adjustment process targeted at exchanging one type ionic species for another within a CNT formulation could include only Ion Exchange sub-process step 2380*d* (performed once or multiple times). Within such applications, Ion Exchange sub-process step 2380*d* could be set up, for example, such that the concentration level of the second ionic species within CNT Formulation 2320 is already at the target level (as determined by process step 2335 in FIG. 23A) at the conclusion of the sub-process, and no further concentration level adjustment required.

FIGS. 23B, 23C, and 23D are provided within the present disclosure and have been described in detail above in order to illustrate three different exemplary ionic species concentration adjustment processes (2302, 2303, and 2304, respectively) suitable for use within the nanotube fabric formation method detailed within FIG. 23A. Specifically, these three exemplary adjustment processes (2302, 2303, 2304) are intended as non-limiting examples of process step 2342 within FIG. 23A. It should be noted that a nanotube fabric formation process according to the method detailed in FIG. 23A could include one or more of these exemplary ionic species adjustment processes or variations of these exemplary ionic species adjustment processes as best befits the needs of a particular application. It is preferred, therefore, that the present disclosure not be limited to the specific examples presented herein.

Figure 24:
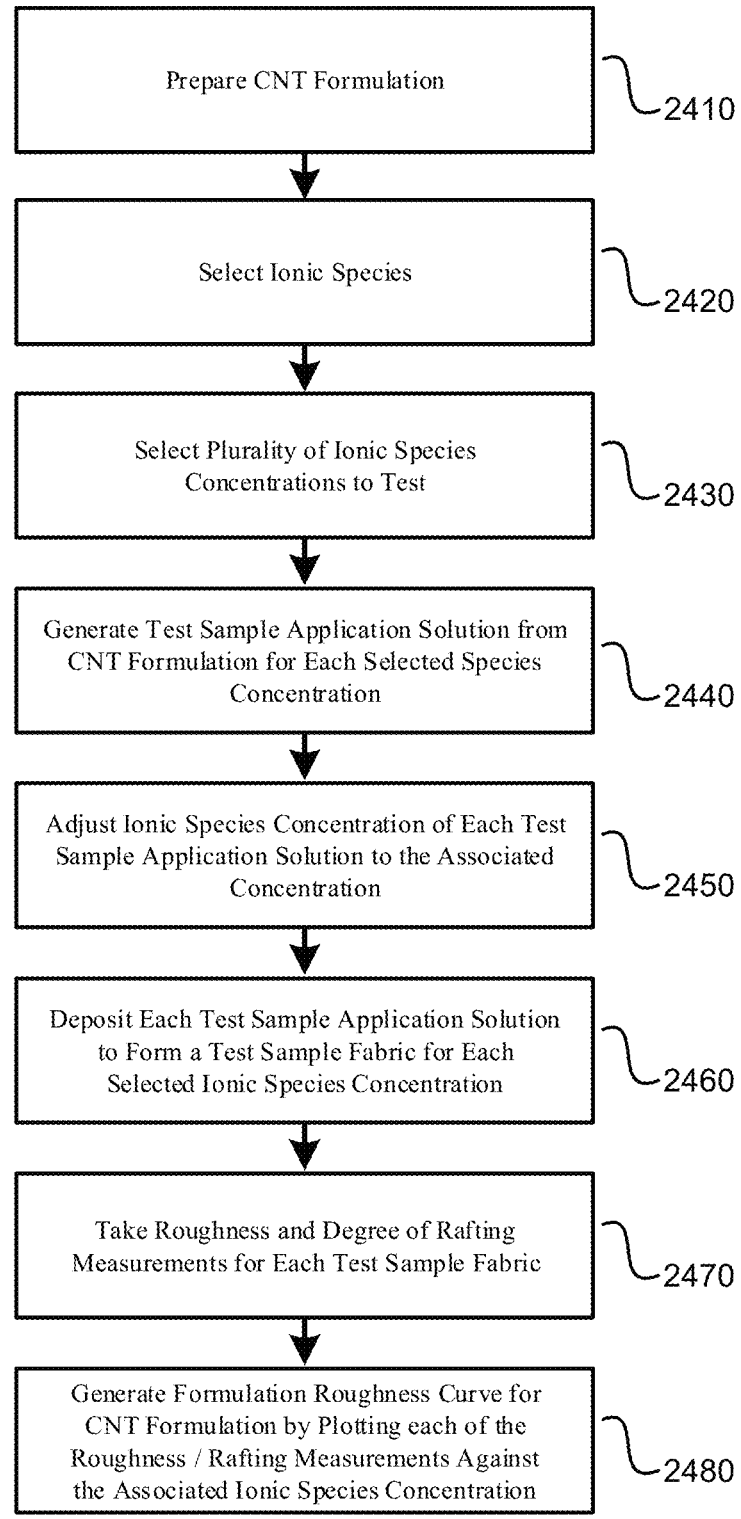
FIG. 24 is a flow chart detailing a method according to the present disclosure for generating a nanotube formulation roughness curve for a particular nanotube formulation with a selected ionic species.

FIG. 24 is a flow chart detailing a method according to the present disclosure for generating a nanotube formulation roughness curve for a particular nanotube formulation with a selected ionic species (as is required, for example, within process step 2335 of FIG. 23A). In first method step 2410, a CNT Formulation is prepared with the properties required (e.g., nanotube type, nanotube density, functionalization parameters, etc.) for a given application, according to the methods described in detail above (for example, CNT Formulation 2320 within FIG. 23A). In a next method step 2420, the type of ionic species to be used to control either or both the surface roughness of a nanotube fabric or the degree of rafting within a nanotube fabric formed with this CNT formulation is selected. As described above (for example, with respect to the discussion of FIG. 21 above), a plurality of ionic species are well suited for controlling or otherwise selecting surface roughness and/or degree of rafting within a nanotube fabric according to the methods of the present disclosure. As will be described below, the method of FIG. 24 characterizes this CNT formulation with respect to the selected ionic species to realize a CNT formulation roughness curve (for example, 2330 in FIG. 23A) for the particular CNT formulation and ionic species that can be used to select a concentration level of the ionic species within the CNT formulation to realize a nanotube fabric with desired surface roughness and degree of rafting properties.

Within next method step 2430, a plurality of test ionic species concentration levels are selected to test. As described within the discussion of FIG. 22, these test concentration levels will be used to generate data points to form the nanotube formulation roughness curve. The test concentration levels should be selected to provide a range of surface roughness values and degrees of rafting within nanotube fabrics formed from CNT formulations using the test ionic species concentration values. Within the exemplary nanotube formulation roughness curves of FIGS. 26A-26D, four test ionic species concentration levels were used to generate four data points to define the curves (e.g., 2210 in FIG. 22). However, the methods of the present disclosure are not limited in this regard. Indeed, any number of data points can be used to produce a nanotube formulation roughness curve, including, but not limited to, 2, 3, 4, 5, 10, 15, 20, 50, or 100. This is to say, the number of data points generated and used to create a nanotube formulation roughness curve is only limited by the specific needs of an application.

Within next method step 2440, the CNT Formulation prepared in method step 2410 is used to produce a plurality of identical test samples for each of the test ionic species concentration levels selected in method step 2430. In next method step 2850, the concentration level of the selected ionic species (selected in method step 2420) within each of the CNT Formulation test samples is adjusted—using, for example, the methods described in detail within FIGS. 23A-23D above—to one of the ionic species concentration test levels selected in method step 2430. In this way, a plurality of CNT formulations is created, with each CNT formulation exhibiting a different ionic species concentration level according to plurality of test ionic species concentration levels selected in method step 2430.

In next method step 2460, each of the adjusted CNT formulation samples is deposited (by, for example, a spin coating operation) to form a test sample nanotube fabric for each of the plurality of test ionic species concentration levels selected in method step 2430. Methods for forming nanotube fabrics from CNT formulations have been described in detail above and are also disclosed in more detail within the incorporated references. In next method step 2870, each of the test sample nanotube fabrics is analyzed to quantify both the surface roughness of the fabric (measured as the RMS roughness within examples 10-23) and degree of rafting (measured as the standard deviation of the positional orientation of nanotube elements within examples 10-23). Within next method step 2480, these measured values (each set associated with one of the plurality of ionic species concentration levels selected in method step 2430) are used to generate a nanotube formulation roughness curve, as described within the discussion of FIG. 22 above. As discussed in detail above, according to the methods of the present disclosure, this nanotube formulation roughness curve can then be used to define a utilizable range corresponding to a desired set of parameters (with respect to surface roughness and degree of rafting) within a nanotube fabric, and this utilizable range then used to aid in the selection of a target ionic species concentration level to be used within a nanotube fabric formation process (e.g., FIG. 23A).

Within method step 2470 of FIG. 24, the surface roughness of a plurality of test nanotube fabrics is quantified. Within examples 10-23 of the present disclosure (discussed in detail below), an image analysis tool (Gwyddion version 2.50) was used to analyze AFM images of the sample nanotube fabrics generated. Gwyddion is a modular program (available online at the time of the writing of this disclosure) for SPM (scanning probe microscopy) data visualization and analysis and is primarily intended for the analysis of height fields obtained by scanning probe microscopy techniques. Within examples 10-23, the AFM images were collected using a Veeco Instruments, Inc. D3100 AFM using a Nanosensors™ PointProbe® Plus Non-Contact/Tapping Mode—High Resonance Frequency (PPP-NHC) probe with a scan size of 2.5 um with 512 points per line in tapping mode. The directionality measurements within examples 10-23 were performed using similar visual analysis tools on SEM images of sample nanotube fabrics. For these directionality measurements, an FEI XL30 TMP scanning electron microscope was used to collect images at 10 kV with a spot size of 3 and a working distance of 5 mm.

It should be noted that a plurality of analysis tools and techniques are presently available for analyzing and quantifying the roughness or smoothness of a material layer at a nanoscopic level (that is, on the order of a nanometer) as well as for analyzing the directionality of high aspect ratio nanoscopic elements within a material layer. Such tools and techniques are well known to those skilled in the art. It is preferred, therefore, that the methods of the present disclosure not be limited to the particular analysis and quantification methods/tools used within the examples of the present disclosure with respect to method step 2470 of FIG. 24, as these methods and tools are intended purely as non-limiting examples.

FIG. 25 is a table 2500 summarizing the data and results presented in examples 10-23, with each row listing the parameters used for and results taken from each example, as indicated in the first column ("Example #"). Within each of examples 10-23, a sample nanotube fabric was formed using the method detailed in FIG. 23A in order to provide data points for at least one of four nanotube fabric roughness curve (FIGS. 26A-26D) according to the method of FIG. 24. The particular CNT formulation, type of ionic species, and the ionic species concentration level used within each example is listed within the second, third, and fourth columns of table 2500, respectively. Further, for the resulting nanotube fabric of each example, the RMS surface roughness and the standard deviation of the positional orientation of the nanotube elements within the fabric (indicative of the degree of rafting within the fabric) are listed in the fifth and sixth columns of table 2500, respectively. Finally, the relevant figures documenting the test data produced within each example are listed in the seventh column of table 2500.

Figure 26A:
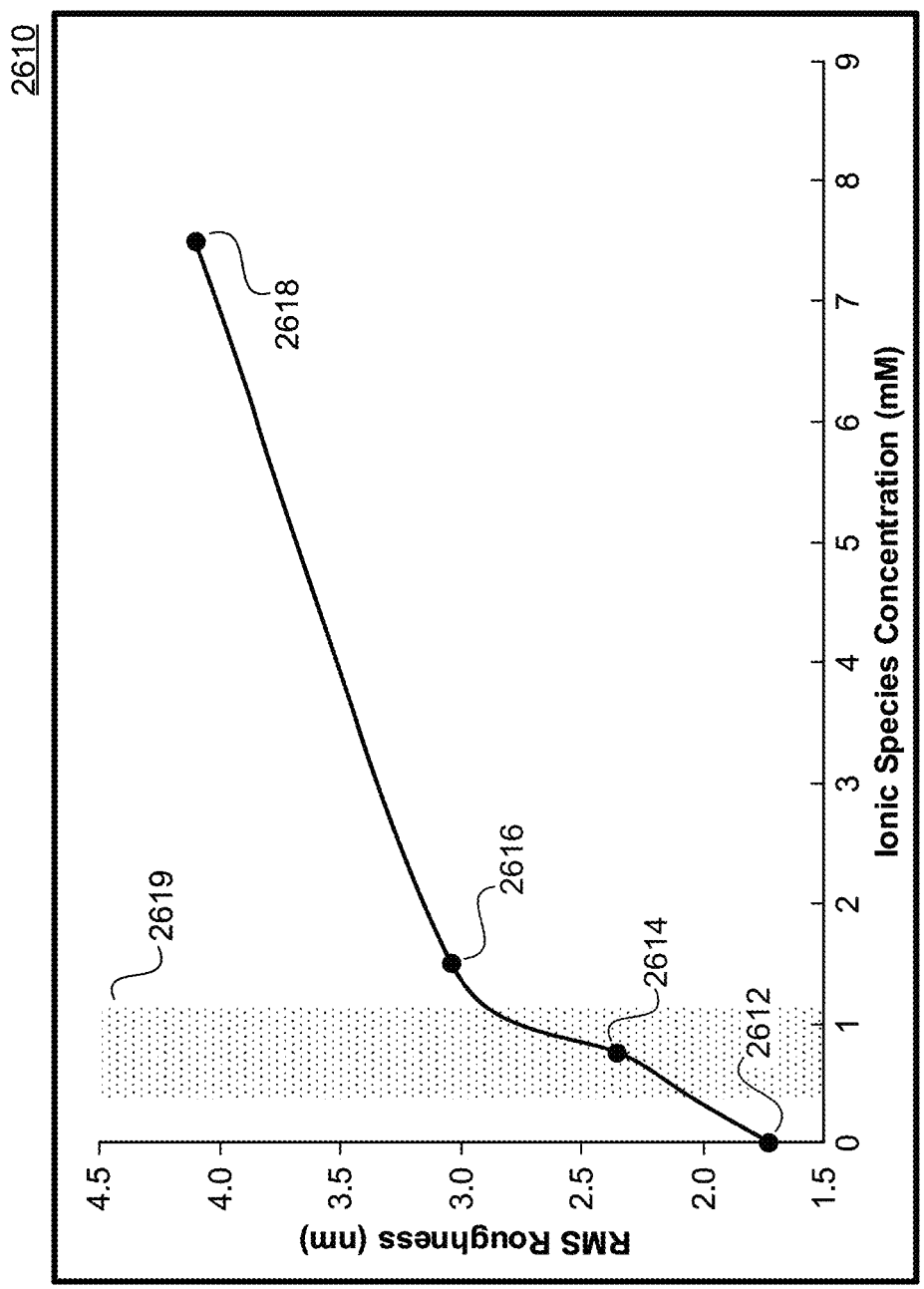
FIG. 26A is a nanotube formulation roughness curve according to the methods of the present disclosure corresponding to nanotube formulation "B" (as defined within the present disclosure) used with ammonium nitrate ($NH_4NO_3$) as an ionic species.
Figure 26B:
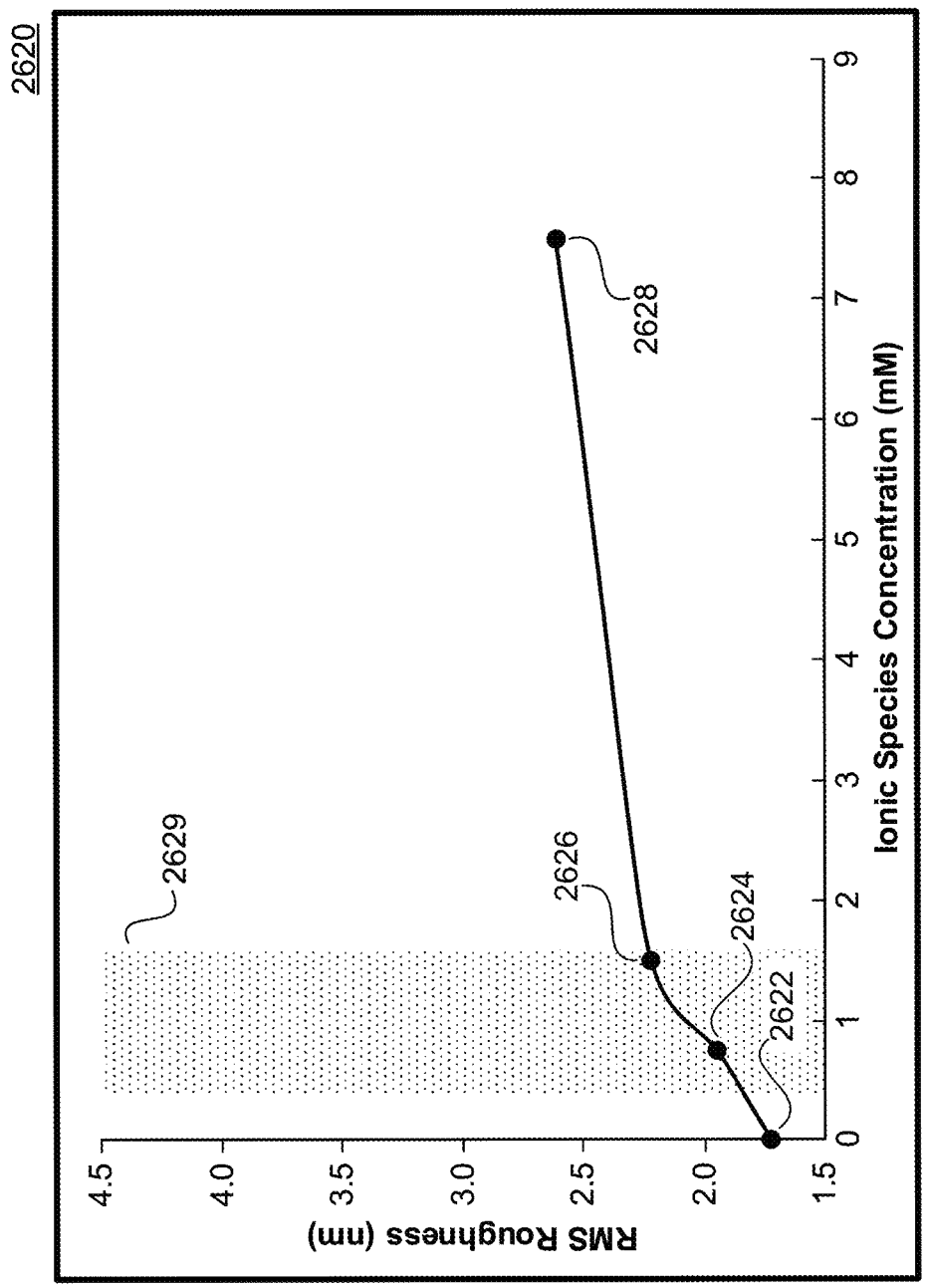
FIG. 26B is a nanotube formulation roughness curve according to the methods of the present disclosure corresponding to nanotube formulation "B" (as defined within the present disclosure) used with tetramethyl ammonium formate (TMA Fm) as an ionic species.
Figure 26C:
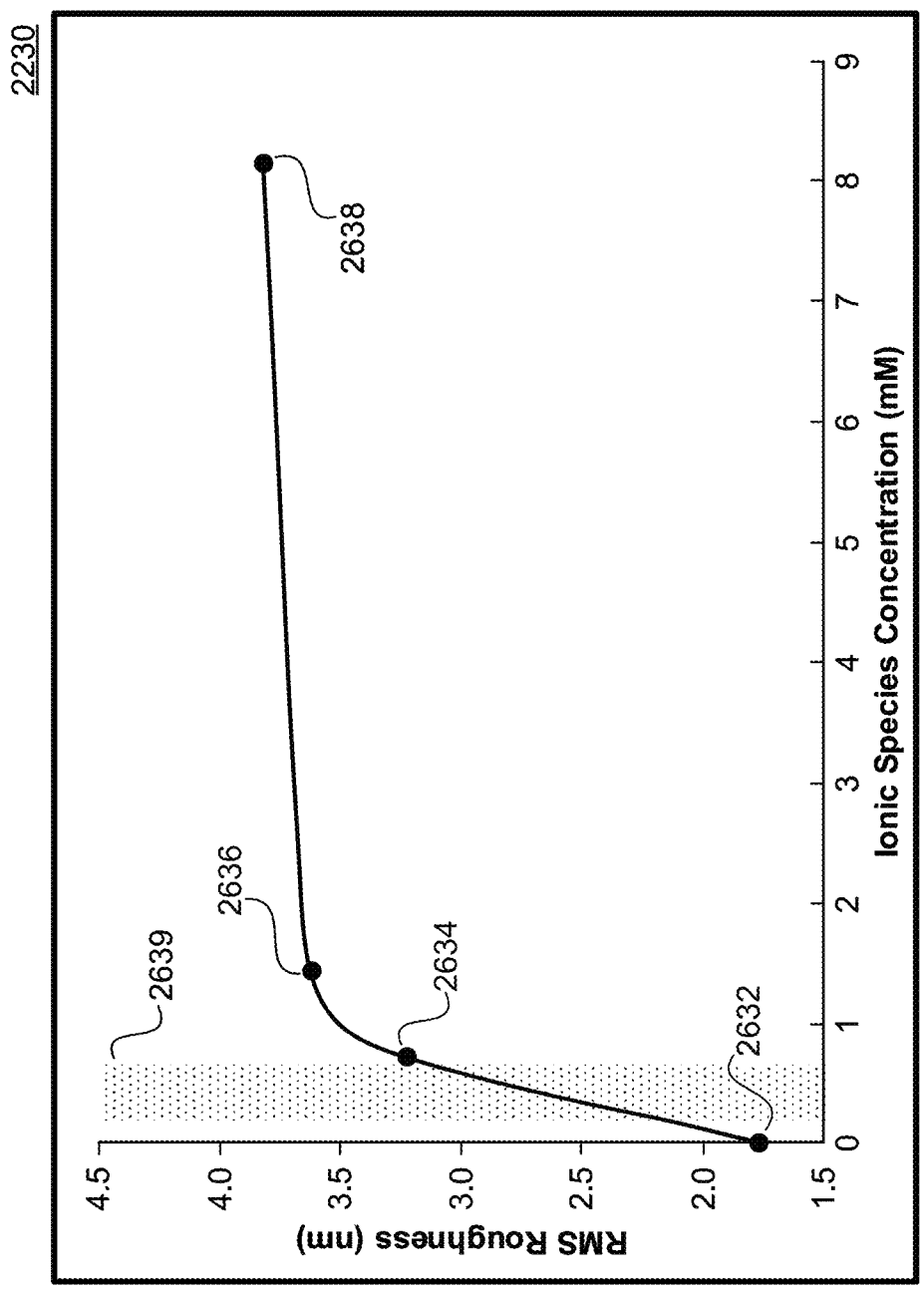
FIG. 26C is a nanotube formulation roughness curve according to the methods of the present disclosure corresponding to nanotube formulation "C" (as defined within the present disclosure) used with ammonium nitrate ($NH_4NO_3$) as an ionic species.
Figure 26D:
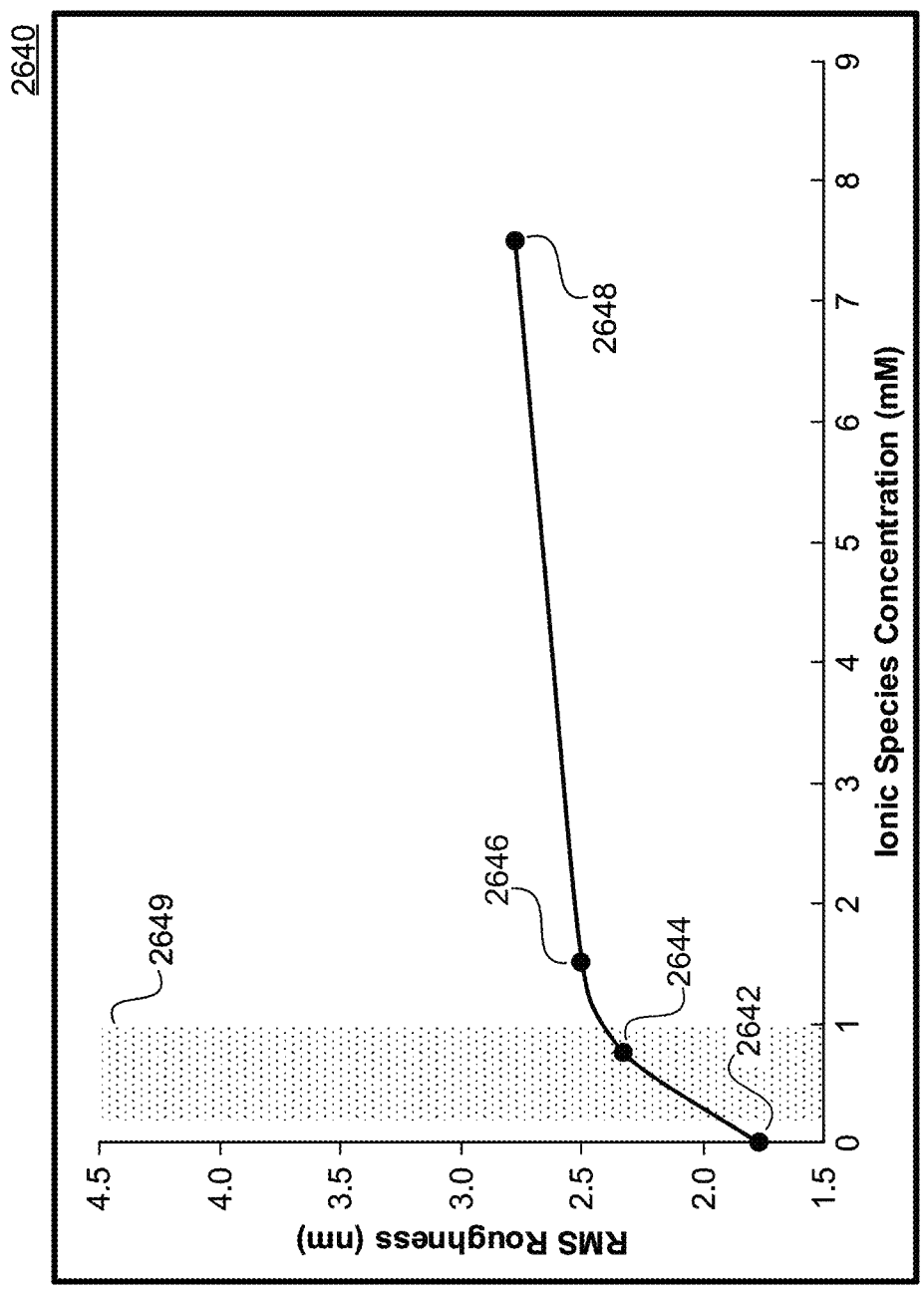
FIG. 26D is a nanotube formulation roughness curve according to the methods of the present disclosure corresponding to nanotube formulation "C" (as defined within the present disclosure) used with tetramethyl ammonium formate (TMA Fm) as an ionic species.

As summarized in table 2500, within examples 10-23, two nanotube formulations were used ("B" and "C"), each with two types of ionic species (ammonium nitrate and tetramethyl ammonium formate) to form a plurality of sample nanotube fabrics which were used to realize four different nanotube fabric roughness curves (FIGS. 26A-26D). As will be discussed below, FIG. 26A is a nanotube fabric roughness curve 2610 which corresponds to nanotube formulation "B" for concentrations of ammonium nitrate ($NH_4NO_3$). FIG. 26B is a nanotube fabric roughness curve 2620 which corresponds to nanotube formulation "B" for concentrations of tetramethyl ammonium formate (TMA Fm). FIG. 26C is a nanotube fabric roughness curve 2630 which corresponds to nanotube formulation "C" for concentrations of ammonium nitrate ($NH_4NO_3$). FIG. 26D is a nanotube fabric roughness curve 2640 which corresponds to nanotube formulation "C" for concentrations of tetramethyl ammonium formate (TMA Fm).

The nanotube elements used within nanotube formulation "B" (used in examples 10-16) were predominately multi-walled carbon nanotubes, which had a significant plurality of kinks and bends and exhibited a median length of 132 nm and a 95th percentile length of 260 nm. The nanotube elements used within nanotube formulation "C" (used in examples 17-23) were predominately singled walled carbon nanotubes, which were relatively straight (that is, have few bends of kinks) and exhibited a median length of 187 nm and a 95th percentile length of 494 nm. Examples of nanotube elements used within nanotube formulation "B" are shown in the TEM images of FIGS. 20C and 20D and discussed above within the discussion of those figures. Examples of nanotube elements used within nanotube formulation "C" are shown in the TEM images of FIGS. 20E and 20F and discussed above within the discussion of those figures.

Both nanotube formulation "B" and nanotube formulation "C" were first realized through the following method. Fifty grams of raw (that is, unfunctionalized) carbon nanotubes (CNTs) of the selected type (as discussed above) were refluxed in microelectronics grade nitric acid. Supplies of raw nanotubes (such as were used in the examples of the present disclosure and depicted in FIGS. 20A-20E) may be purchased commercially from a number of vendors (e.g., Thomas Swan, Nano-C, and Zeon Corporation). The concentration of the nitric acid, the reflux time, and temperature were optimized based on the starting CNT material. For example, CNTs were refluxed in concentrated nitric acid (40%) at 120° C. for 4-14 hours. After the nitric acid reflux step, the CNT suspension in acid was diluted in 0.35 to 3% nitric acid solution (8-16 L) and taken through several passes of cross-flow filtration (CFF). First few passes of CFF (hereinafter called CFF1) may remove the acid and soluble metal salts in the suspension. The pH of the suspension during the CFF1 steps was maintained at 1+/−0.3 by recovering the material in 0.35-3% nitric acid after each step. Typically, five to eleven CFF1 steps were performed. After the CFF1 steps, the retentate was collected in DI water and the pH of the nanotube:DI water suspension was increased to 8+/−0.2 with ammonium hydroxide (concentration 29%) and sonicated. This liquid was taken through another set of CFF passes (hereinafter referred as CFF2). CFF2 may remove the amorphous carbon impurities in the solution. After the CFF2 process, the retentate was collected in DI water and the pH of the nanotube:DI water liquid was adjusted to pH 8+/−0.2 and the solution was sonicated for 120 minutes in a chilled sonicator bath (4-5° C.).

At this step of the process a desired concentration or optical density of the CNT formulation can be achieved by controlling the volume of the DI water used to recover the retentate from the CFF2 membrane. For example if the optical density of the CNT formulation before the last CFF2 step is 2 and the volume is 2 L, then a recovery volume of 1 L can lead to an optical density close to 4 assuming there is negligible loss in optical density through the permeate at this point. Similarly, if the optical density of the CNT formulation before the last CFF2 step is 2 and the volume is 16 L, then a recovery volume of 1 L can lead to a CNT formulation of optical density 32. The concentration of the CNT formulation (optical density) that can be practically achieved is dependent on, but is not limited to, the starting CNT charge used in the reaction, the reaction conditions, number of CFF steps, CFF membrane pore size, CFF membrane surface area, and pH.

Finally, the formulation was centrifuged two or three times at about 70000-100000 g for about 20-30 min each. In certain cases, the pH of the formulation was adjusted to 8+/−0.2 in between the centrifugation passes which may remove residual metal or carbon nanoparticles in the liquid by sedimentation. After the centrifugation step, the supernatant was collected and used as the final purified nanotube formulation. The concentration of the final nanotube application solution depends on the centrifugation conditions used. Typically for a spin coat application, CNT solutions with an optical density of 10-100 measured at 550 nm wavelength and a pH of 7+/−0.5 were used.

Further, within examples 11-16 and 18-23 and, a selected ionic species (ammonium nitrate for examples 11-13 and 18-20, and tetramethyl ammonium formate for examples 14-16 and 21-23) was introduced to the purified nanotube formulation, and the concentration level of the selected ionic species adjusted (as described within the discussion of FIGS. 23A-23D, above) to the selected test concentration level for each example. Within examples 10 and 17, the ionic species concentration was selected to be essentially zero. Within each example, the adjusted nanotube formulation was then spun coat over a silicon dioxide substrate to form a nanotube fabric layer, approximately 20 nm thick. Specifically, four spin coating operations were performed to form the nanotube fabric layers of examples 10-16, and three spin coating operation were performed to form the nanotube fabric layers of examples 17-23.

For all operations, the spin coating operations were as follows. A raw wafer was pre-baked on a 250° C. hot plate for five minutes. After cooling, the wafer was placed in spin-coat tool and underwent a pre-wet step where approximately 3 mL of de-ionized water was dispensed onto the wafer, and then spun for approximately 3 s and slung off at 280 rpm. After this pre-wet step, approximately 3 ml of the adjusted solution was dispensed onto the wafer while the wafer was rotated at 60 rpm. Following this solution dispensing step, the wafer then went through a series of steps with various spin speeds (35-180 rpm) to ensure the solution was spread evenly across the wafer during the spin coat process. Finally, the spin speed was increased up to 2000 rpm for ten seconds. The wafer was placed on a 250° C. hot plate for three and a half minutes between each spin coating operation. After a cool down cycle, the entire process was repeated such as to apply the desired number of coats of the application solution over the wafer.

FIG. 26A shows a nanotube formulation roughness curve 2610 according to the methods of the present disclosure corresponding to nanotube formulation "B" (as defined above) used with ammonium nitrate ($NH_4NO_3$) as an ionic species. The curve shown in nanotube formulation roughness curve 2610 is drawn through four data points: 2612 provided by example 10, 2614 provided by example 11, 2616 provided by example 12, and 2618 provided by example 13. As described above with respect to FIG. 22, a utilization range 2619 is drawn to indicate the range of ionic species concentrations (approximately 0.4 mM-1.1 mM) that will provide a nanotube fabric within the given parameters of an exemplary application used herein. For the nanotube formulation roughness curve 2610 of FIG. 26A, the parameters of this exemplary application are imagined to be a nanotube fabric with an RMS roughness of less than 2.8 nm and a standard deviation of orientation of approximately 20° or higher (representative of a substantially low degree of rafting).

FIG. 26B shows a nanotube formulation roughness curve 2620 according to the methods of the present disclosure corresponding to nanotube formulation "B" (as defined above) used with tetramethyl ammonium formate (TMA Fm) as an ionic species. The curve shown in nanotube formulation roughness curve 2620 is drawn through four data points: 2622 provided by example 10, 2624 provided by example 14, 2626 provided by example 15, and 2628 provided by example 16. As described above with respect to FIG. 22, a utilization range 2629 is drawn to indicate the range of ionic species concentrations (approximately 0.4 mM-1.5 mM) that will provide a nanotube fabric within the given parameters of an exemplary application used herein. For the nanotube formulation roughness curve 2620 of FIG. 26B, the parameters of this exemplary application are imagined to be a nanotube fabric with an RMS roughness of less than 2.2 nm and a standard deviation of orientation of approximately 27° or higher (representative of a substantially low degree of rafting).

FIG. 26C shows a nanotube formulation roughness curve 2630 according to the methods of the present disclosure corresponding to nanotube formulation "C" (as defined above) used with ammonium nitrate ($NH_4NO_3$) as an ionic species. The curve shown in nanotube formulation roughness curve 2630 is drawn through four data points: 2632 provided by example 17, 2634 provided by example 18, 2636 provided by example 19, and 2638 provided by example 20. As described above with respect to FIG. 22, a utilization range 2639 is drawn to indicate the range of ionic species concentrations (approximately 0.1 mM-0.6 mM) that will provide a nanotube fabric within the given parameters of an exemplary application used herein. For the nanotube formulation roughness curve 2630 of FIG. 26C, the parameters of this exemplary application are imagined to be a nanotube fabric with an RMS roughness of less than 3.1 nm and a standard deviation of orientation of approximately 26° or higher (representative of a substantially low degree of rafting).

FIG. 26D shows a nanotube formulation roughness curve 2640 according to the methods of the present disclosure corresponding to nanotube formulation "C" (as defined above) used with tetramethyl ammonium formate (TMA Fm) as an ionic species. The curve shown in nanotube formulation roughness curve 2640 is drawn through four data points: 2642 provided by example 17, 2644 provided by example 21, 2646 provided by example 22, and 2648 provided by example 23. As described above with respect to FIG. 22, a utilization range 2649 is drawn to indicate the range of ionic species concentrations (approximately 0.1 mM-1.0 mM) that will provide a nanotube fabric within the given parameters of an exemplary application used herein. For the nanotube formulation roughness curve 2640 of FIG. 26D, the parameters of this exemplary application are imagined to be a nanotube fabric with an RMS roughness of less than 2.4 nm and a standard deviation of orientation of approximately 27° or higher (representative of a substantially low degree of rafting).

Figure 27:
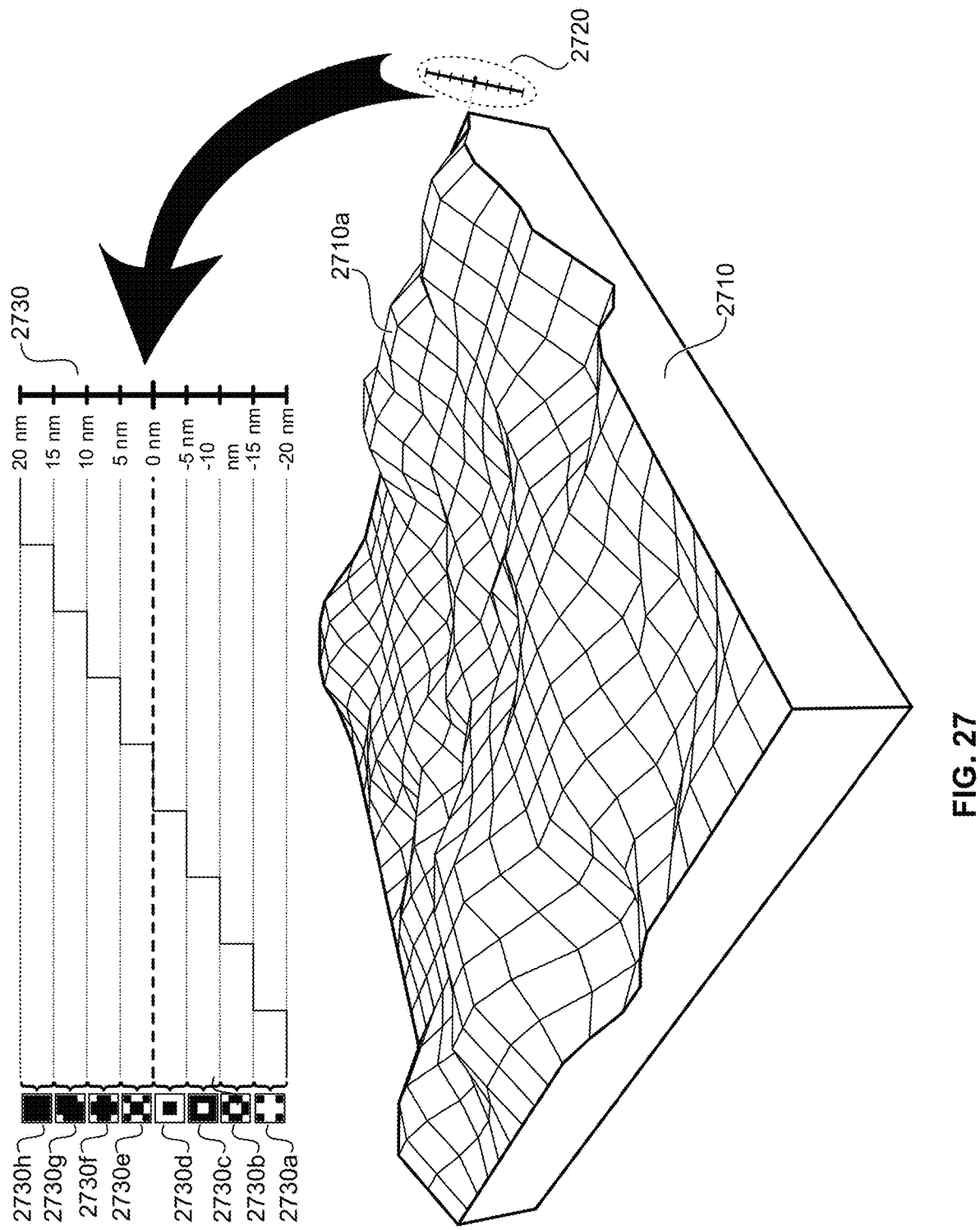
FIG. 27 is a diagram illustrating a material layer height mapping method used to illustrate the surface roughness of nanotube fabrics formed within examples 10-23.

FIG. 27 is a diagram illustrating a material layer height mapping method used to illustrate the surface roughness of nanotube fabrics formed within examples 10-23. This material layer height mapping method was used to produce FIGS. 28B, 29B, 30B, 31B, 32B, 33B, 34B, 35B, 36B, 37B, 38B, 39B, 40B, and 41B, which graphically illustrate a topographical view of AFM images taken of the nanotube fabrics in each of examples 10-23. As described above with respect to method step 2470 of FIG. 24, an AFM image was produced for each of the nanotube fabrics formed in examples 10-23. These AFM images were then visually analyzed, as described above, to realize a 512×512 table of numerical height values for the nanotube fabric surface. The material layer height mapping method illustrated in FIG. 27 then reduced this 512×512 table of height values to a 128×128 table of height values by first organizing the values with the 512×512 table into 4 element (2×2) groups, averaging the four values within each group, then using that average value to represent the four original elements. Each of these averaged values was then quantized (as illustrated in FIG. 27) and assigned a 4×4 pixel tile 2730*a*-2730*f*. These 4×4 pixel tiles 2730*a*-2730*f* were then plotted to graphically represent the surface of each nanotube fabric (e.g., FIG. 28B).

Within FIG. 27, a contoured material layer 2710 is used to represent the sample nanotube fabrics of examples 10-23. Measuring ruler 2720 is used to the indicate the height of the material surface 2710*a* falls above or below nominal surface plane (analogous to horizontal surface line 1830 and horizontal surface line 1930 in FIGS. 18B and 19B, discussed above). This ruler is then used to generate quantization tile map 2730. Within examples 10-23, a range of +/−20 nm above or below the nominal surface plane of the fabric was sufficient to include all of the values measured from the AFM images produced. As such, eight tiles 2720*a*-2730*f* were used to represent 5 nm ranges between −20 nm and 20 nm, as indicated in FIG. 27. In this way, a black line plot that was visually representative of the nanotube fabric surfaces could be realized in order to illustrate differing surface textures of nanotube fabrics within the present disclosure.

It should be noted that the height mapped topographical images of FIGS. 28B, 29B, 30B, 31B, 32B, 33B, 34B, 35B, 36B, 37B, 38B, 39B, 40B, and 41B are intended for visual illustration of comparative nanotube fabric surface textures within the present disclosure only. The RMS roughness measurements within examples 10-23 (summarized within the fifth column of table 2500 in FIG. 25, and used to produce nanotube fabric roughness curves 2610, 2620, 2630, and 2640 in FIGS. 26A, 26B, 26C, and 26D, respectively) were all calculated from visual analysis of the 512×512 AFM images produced for each of the nanotube fabrics within those examples, as is explained in detail with respect above with respect to method step 2870 of FIG. 24.

Example 10

Figure 28A:
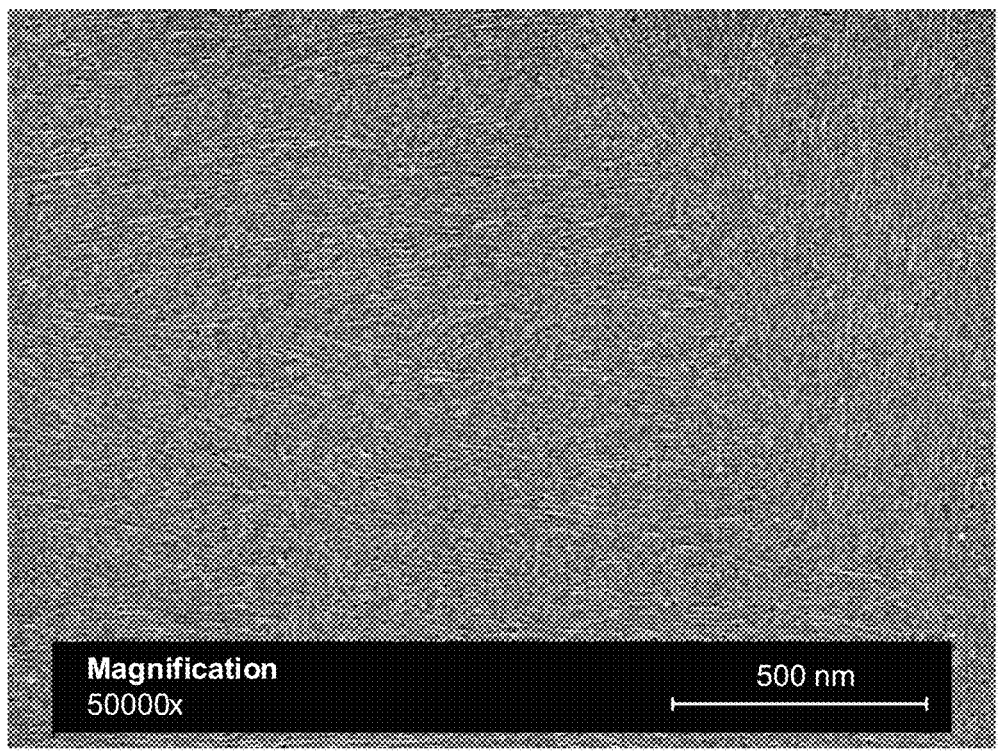
FIG. 28A is an SEM image illustrating the resulting nanotube fabric within example 10 of the present disclosure.
Figure 28B:
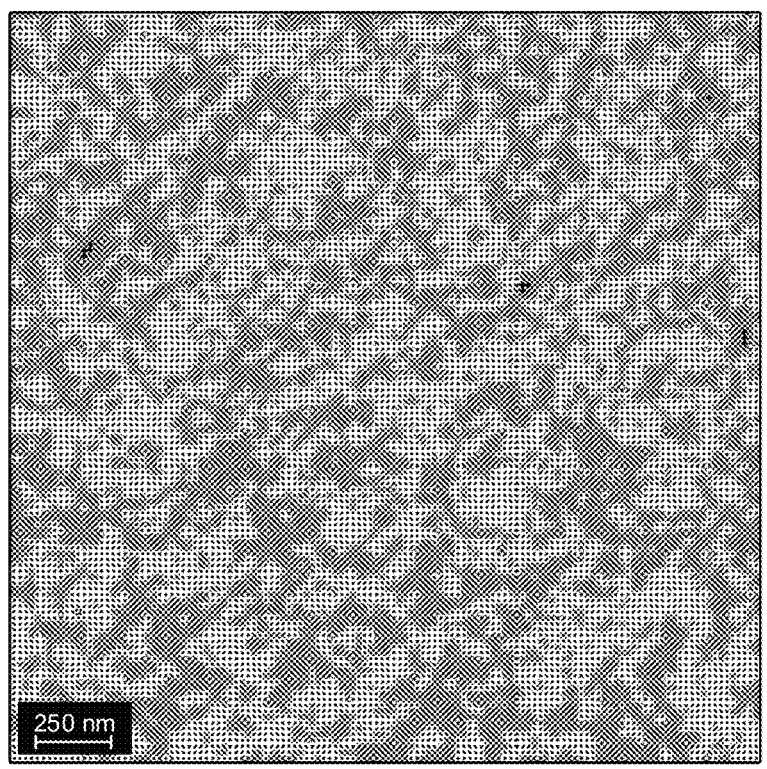
FIG. 28B is a topographical plot of the surface of the resulting nanotube fabric within example 10 of the present disclosure.
Figure 28C:
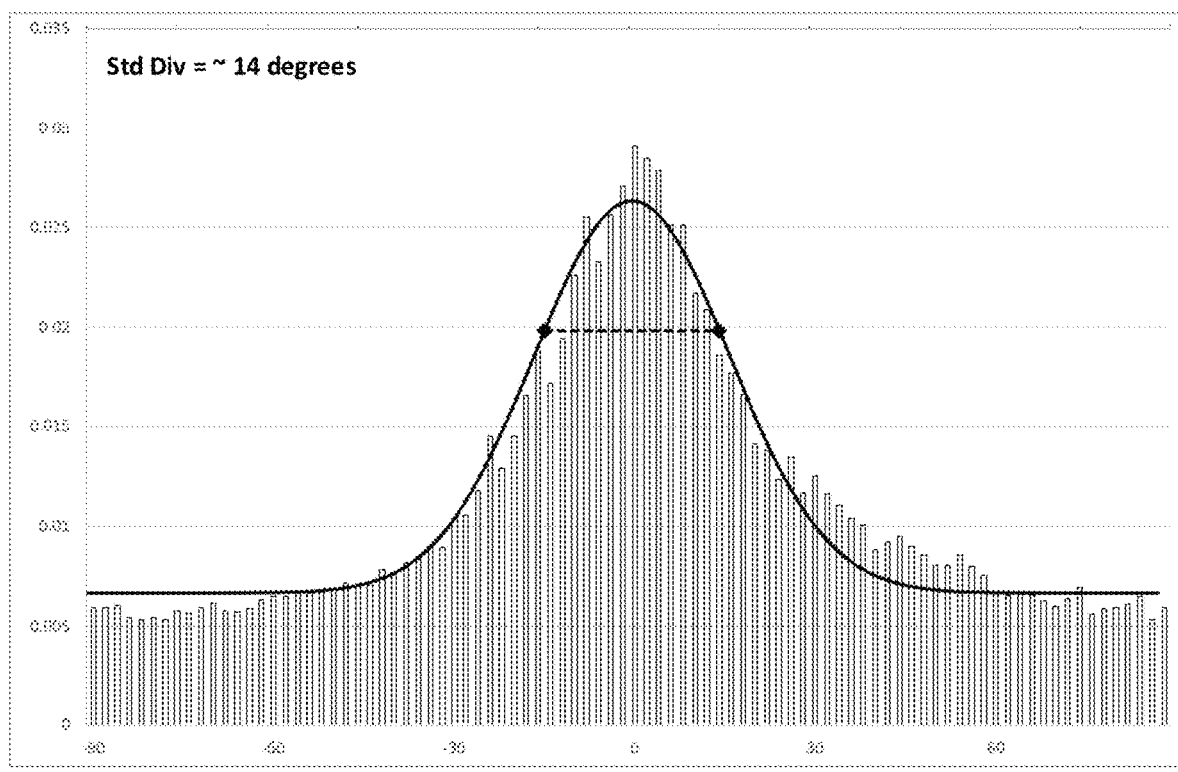
FIG. 28C is a normalized histogram plotting the positional orientation frequency of the nanotube elements within the resulting nanotube fabric within example 10 of the present disclosure.

FIGS. 28A-28C illustrate the surface roughness and degree of rafting within a nanotube fabric produced using the methods of the present disclosure (as described in detail above) in accordance with the parameters of example 10. The nanotube fabric of example 10 was formed by taking a sample of nanotube formulation "B" (formulated as described in detail above), adjusting the nanotube formulation to have an ionic species concentration level of substantially zero (as described in detail with respect to FIGS. 23A-23D above), then performing four spin coating operations of the adjusted nanotube formulation over a silicon wafer (again, as described in detail above) to form a nanotube fabric approximately 20 nm thick. FIG. 28A is an SEM image 2801 illustrating the resulting nanotube fabric, FIG. 28B is a topographical plot 2802 of the surface of the resulting nanotube fabric, and FIG. 28C is a normalized histogram 2803 plotting the positional orientation frequency of the nanotube elements as shown within SEM image 2801. As listed in FIG. 25, the nanotube fabric formed within example 10 has an RMS roughness of 1.72 nm and the standard deviation of the nanotube positional orientation within the fabric was approximately 14° (indicating moderate rafting within the fabric). The measurements from this fabric, formed from nanotube formulation "B" with essentially no ionic species present within the formulation, were used to provide data point 2612 in FIG. 26A and 2622 in FIG. 26B.

Example 11

Figure 29A:
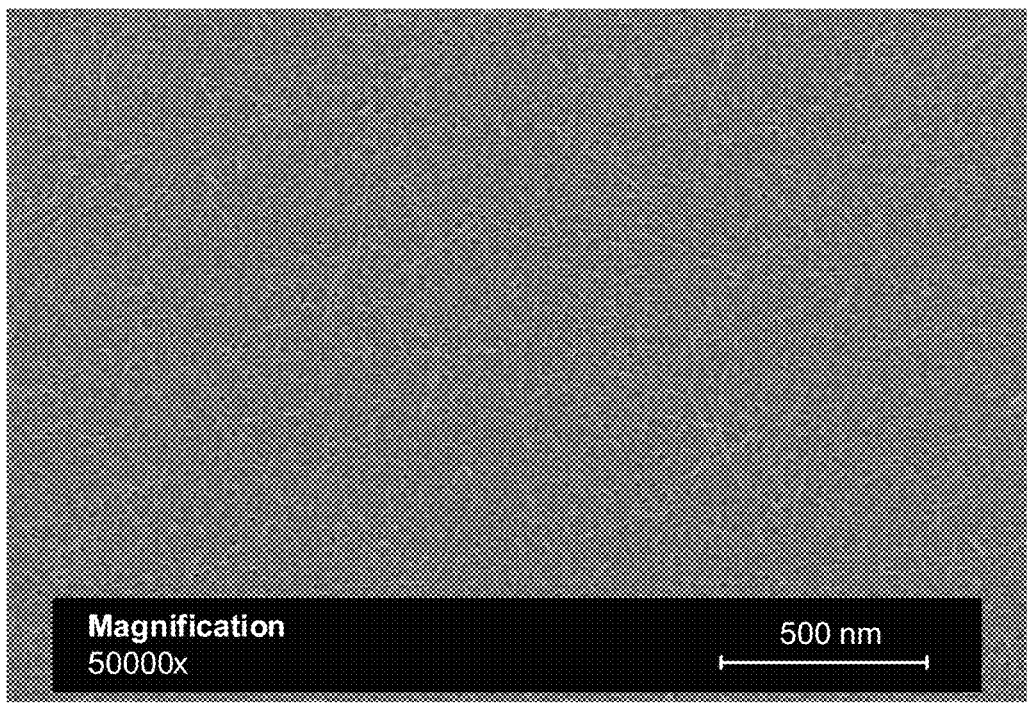
FIG. 29A is an SEM image illustrating the resulting nanotube fabric within example 11 of the present disclosure.
Figure 29B:
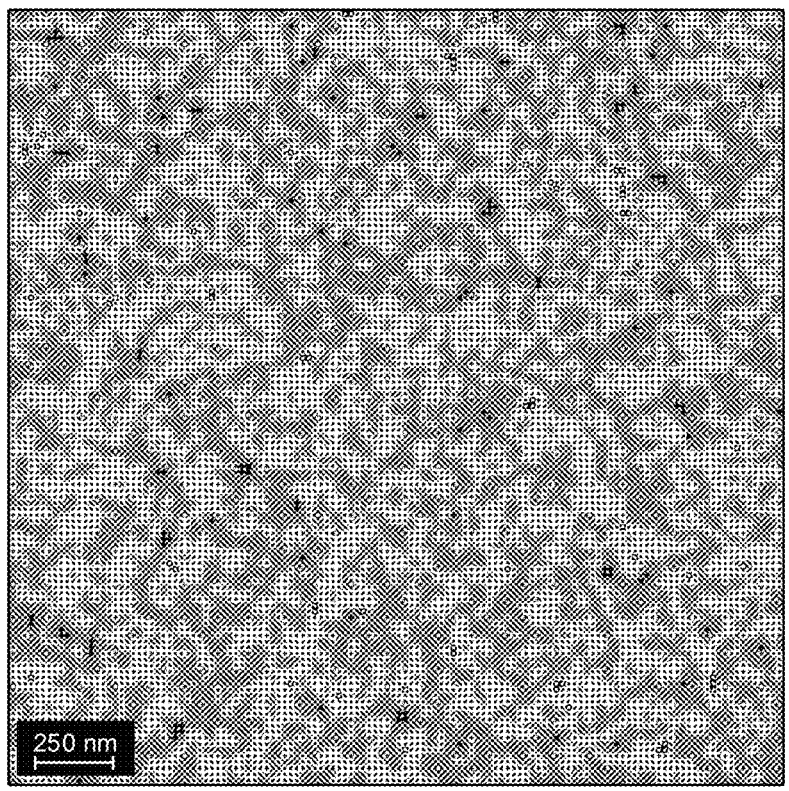
FIG. 29B is a topographical plot of the surface of the resulting nanotube fabric within example 11 of the present disclosure.
Figure 29C:
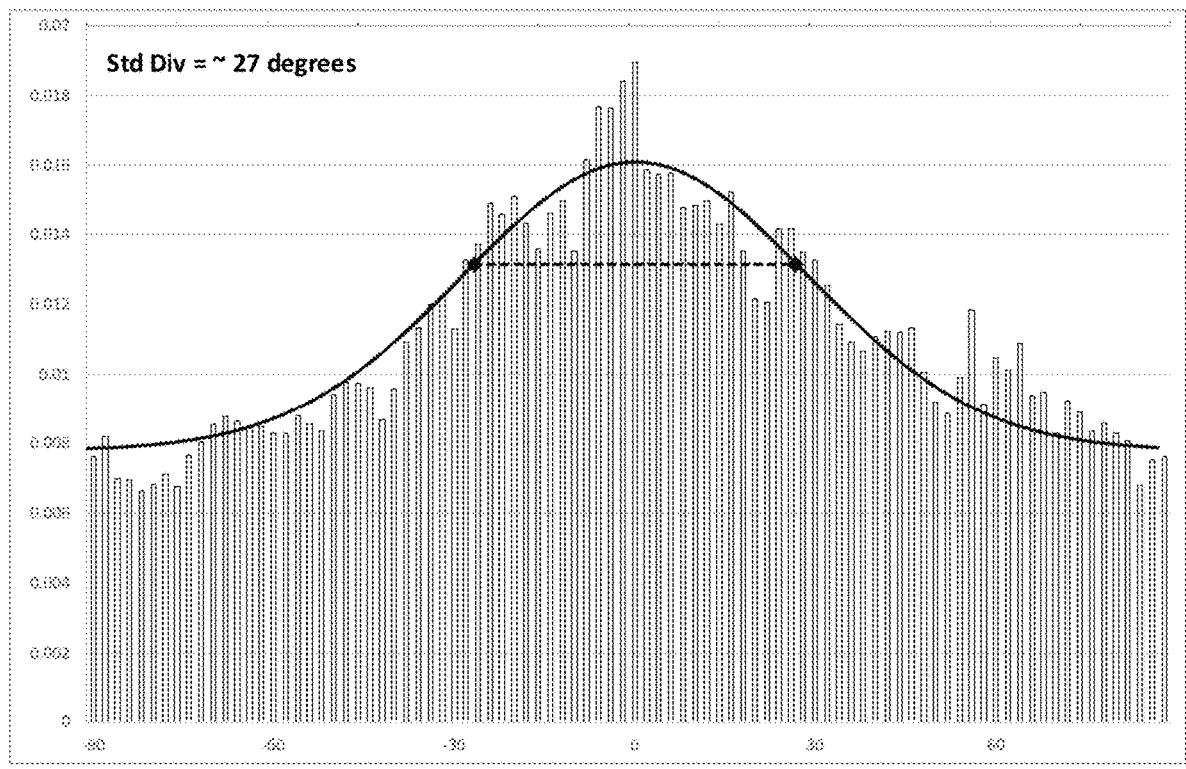
FIG. 29C is a normalized histogram plotting the positional orientation frequency of the nanotube elements within the resulting nanotube fabric within example 11 of the present disclosure.

FIGS. 29A-29C illustrate the surface roughness and degree of rafting within a nanotube fabric produced using the methods of the present disclosure (as described in detail above) in accordance with the parameters of example 11. The nanotube fabric of example 11 was formed by taking a sample of nanotube formulation "B" (formulated as described in detail above), adjusting the nanotube formulation to have an ammonium nitrate ($NH_4NO_3$) concentration level of approximately 0.75 mM (as described in detail with respect to FIGS. 23A-23D above), then performing four spin coating operations of the adjusted nanotube formulation over a silicon wafer (again, as described in detail above) to form a nanotube fabric approximately 20 nm thick. FIG. 29A is an SEM image 2901 illustrating the resulting nanotube fabric, FIG. 29B is a topographical plot 2902 of the surface of the resulting nanotube fabric, and FIG. 29C is a normalized histogram 2903 plotting the positional orientation frequency of the nanotube elements as shown within SEM image 2901. As listed in FIG. 25, the nanotube fabric formed within example 11 has an RMS roughness of 2.36 nm and the standard deviation of the nanotube positional orientation within the fabric was approximately 27° (indicating a moderately low degree of rafting within the fabric). The measurements from this fabric, formed from nanotube formulation "B" with an ammonium nitrate ($NH_4NO_3$) concentration level of approximately 0.75 mM, were used to provide data point 2614 in FIG. 26A.

Example 12

Figure 30A:
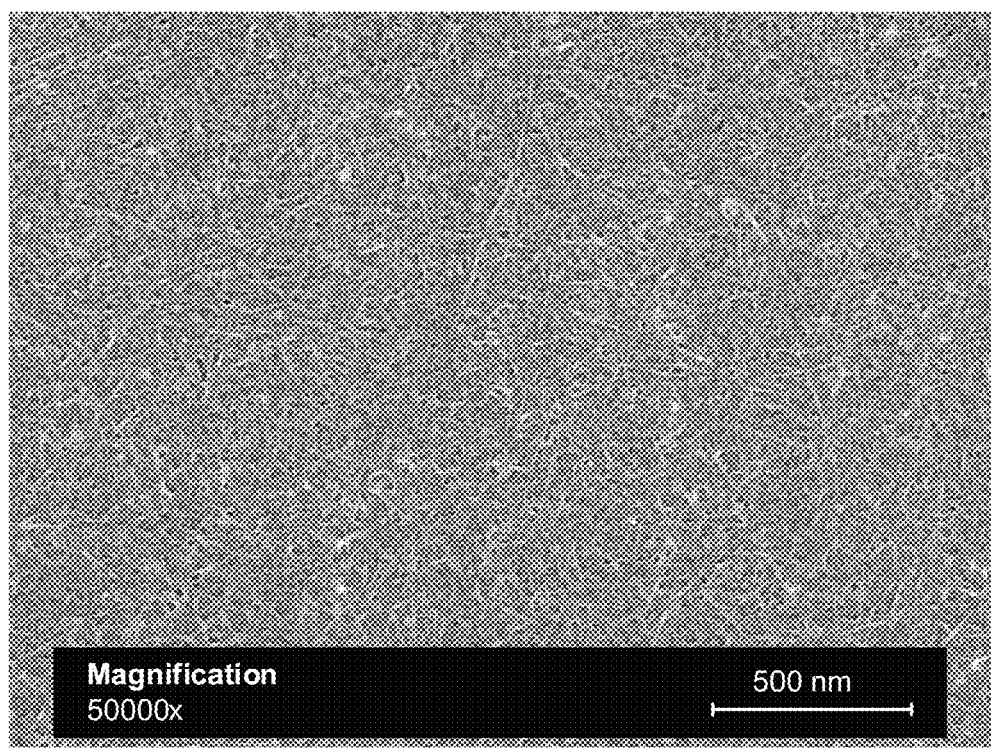
FIG. 30A is an SEM image illustrating the resulting nanotube fabric within example 12 of the present disclosure.
Figure 30B:
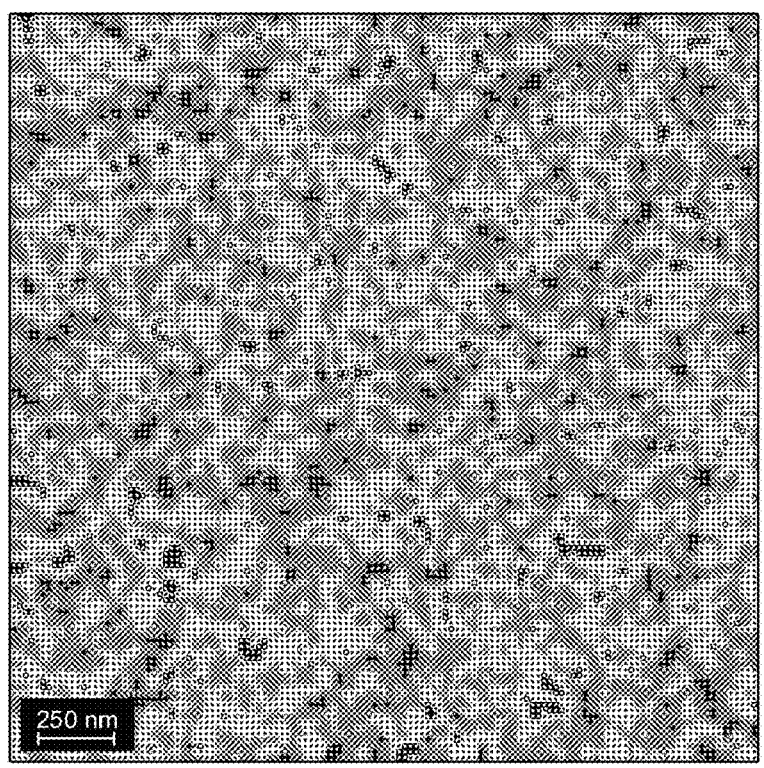
FIG. 30B is a topographical plot of the surface of the resulting nanotube fabric within example 12 of the present disclosure.
Figure 30C:
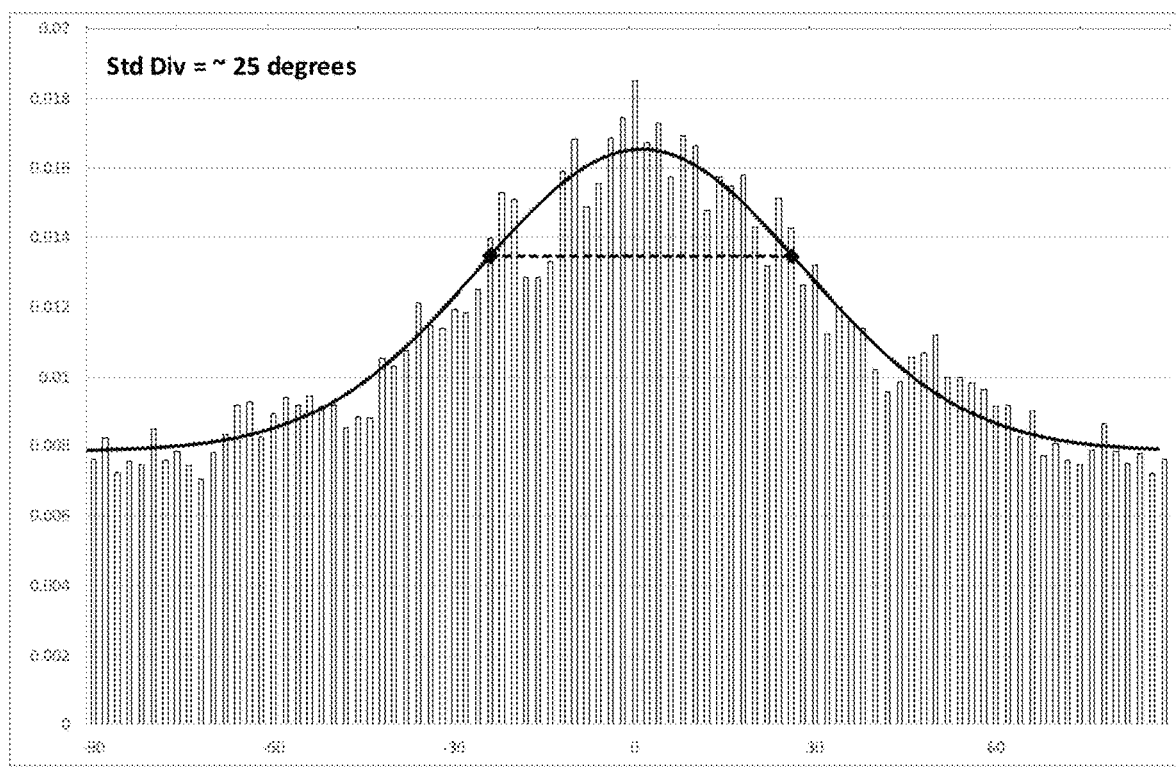
FIG. 30C is a normalized histogram plotting the positional orientation frequency of the nanotube elements within the resulting nanotube fabric within example 12 of the present disclosure.

FIGS. 30A-30C illustrate the surface roughness and degree of rafting within a nanotube fabric produced using the methods of the present disclosure (as described in detail above) in accordance with the parameters of example 12. The nanotube fabric of example 12 was formed by taking a sample of nanotube formulation "B" (formulated as described in detail above), adjusting the nanotube formulation to have an ammonium nitrate ($NH_4NO_3$) concentration level of approximately 1.50 mM (as described in detail with respect to FIGS. 23A-23D above), then performing four spin coating operations of the adjusted nanotube formulation over a silicon wafer (again, as described in detail above) to form a nanotube fabric approximately 20 nm thick. FIG. 30A is an SEM image 3001 illustrating the resulting nanotube fabric, FIG. 30B is a topographical plot 3002 of the surface of the resulting nanotube fabric, and FIG. 30C is a normalized histogram 3003 plotting the positional orientation frequency of the nanotube elements as shown within SEM image 3001. As listed in FIG. 25, the nanotube fabric formed within example 12 has an RMS roughness of 3.04 nm and the standard deviation of the nanotube positional orientation within the fabric was approximately 25° (indicating a moderately low degree of rafting within the fabric). The measurements from this fabric, formed from nanotube formulation "B" with an ammonium nitrate ($NH_4NO_3$) concentration level of approximately 1.50 mM, were used to provide data point 2616 in FIG. 26A.

Example 13

Figure 31A:
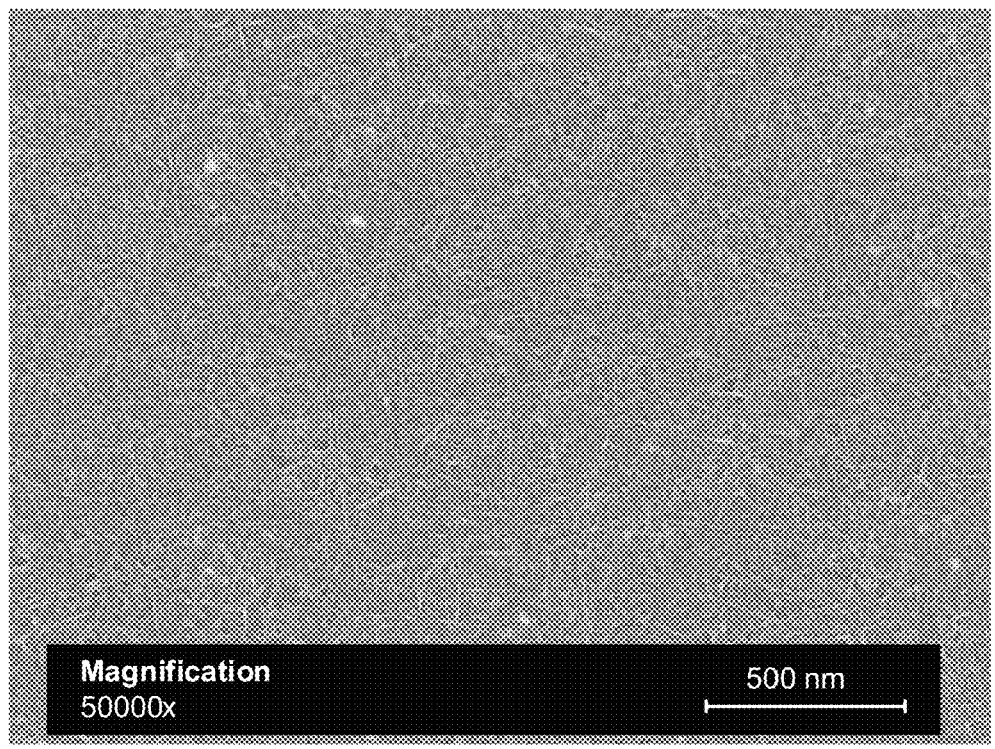
FIG. 31A is an SEM image illustrating the resulting nanotube fabric within example 13 of the present disclosure.
Figure 31B:
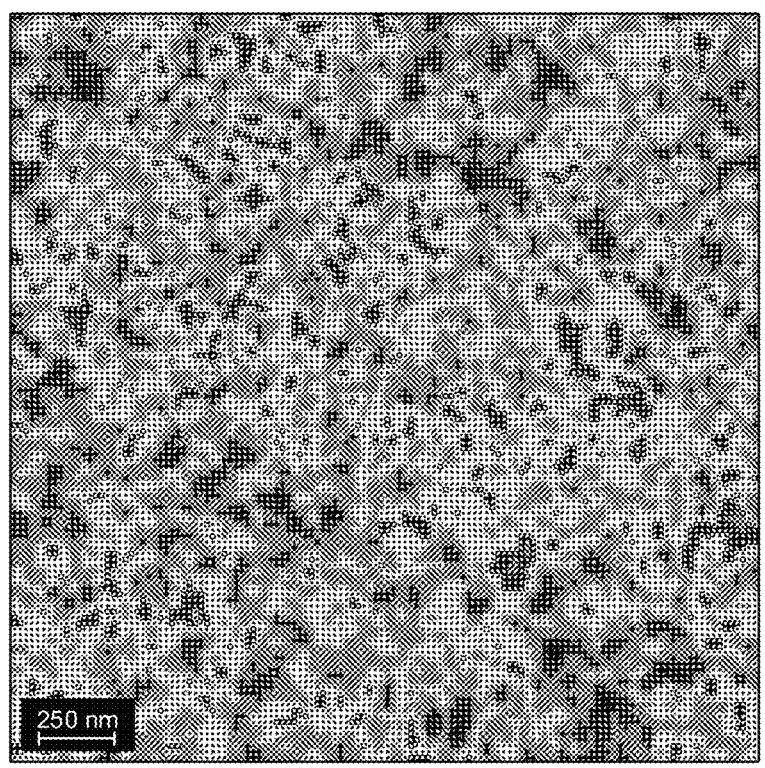
FIG. 31B is a topographical plot of the surface of the resulting nanotube fabric within example 13 of the present disclosure.
Figure 31C:
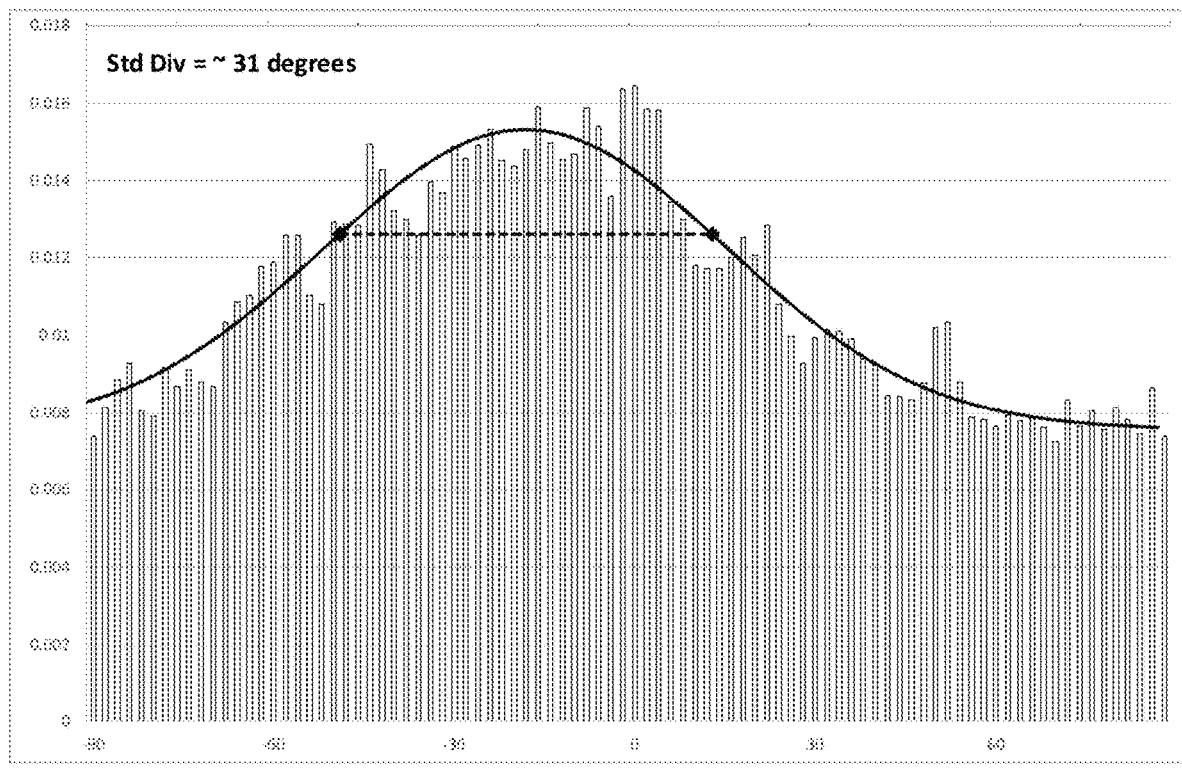
FIG. 31C is a normalized histogram plotting the positional orientation frequency of the nanotube elements within the resulting nanotube fabric within example 13 of the present disclosure.

FIGS. 31A-31C illustrate the surface roughness and degree of rafting within a nanotube fabric produced using the methods of the present disclosure (as described in detail above) in accordance with the parameters of example 13. The nanotube fabric of example 13 was formed by taking a sample of nanotube formulation "B" (formulated as described in detail above), adjusting the nanotube formulation to have an ammonium nitrate ($NH_4NO_3$) concentration level of approximately 7.50 mM (as described in detail with respect to FIGS. 23A-23D above), then performing four spin coating operations of the adjusted nanotube formulation over a silicon wafer (again, as described in detail above) to form a nanotube fabric approximately 20 nm thick. FIG. 31A is an SEM image 3101 illustrating the resulting nanotube fabric, FIG. 31B is a topographical plot 3102 of the surface of the resulting nanotube fabric, and FIG. 31C is a normalized histogram 3103 plotting the positional orientation frequency of the nanotube elements as shown within SEM image 3001. As listed in FIG. 25, the nanotube fabric formed within example 13 has an RMS roughness of 4.10 nm and the standard deviation of the nanotube positional orientation within the fabric was approximately 31° (indicating a low degree of rafting within the fabric). The measurements from this fabric, formed from nanotube formulation "B" with an ammonium nitrate ($NH_4NO_3$) concentration level of approximately 7.50 mM, were used to provide data point 2618 in FIG. 26A.

Example 14

Figure 32A:
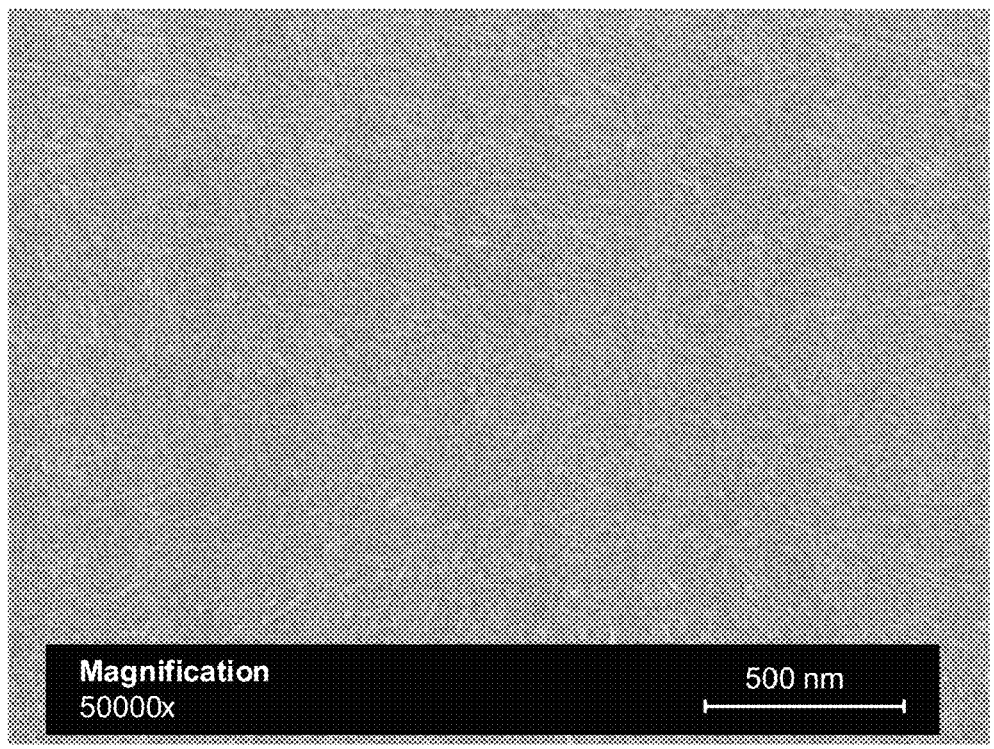
FIG. 32A is an SEM image illustrating the resulting nanotube fabric within example 14 of the present disclosure.
Figure 32B:
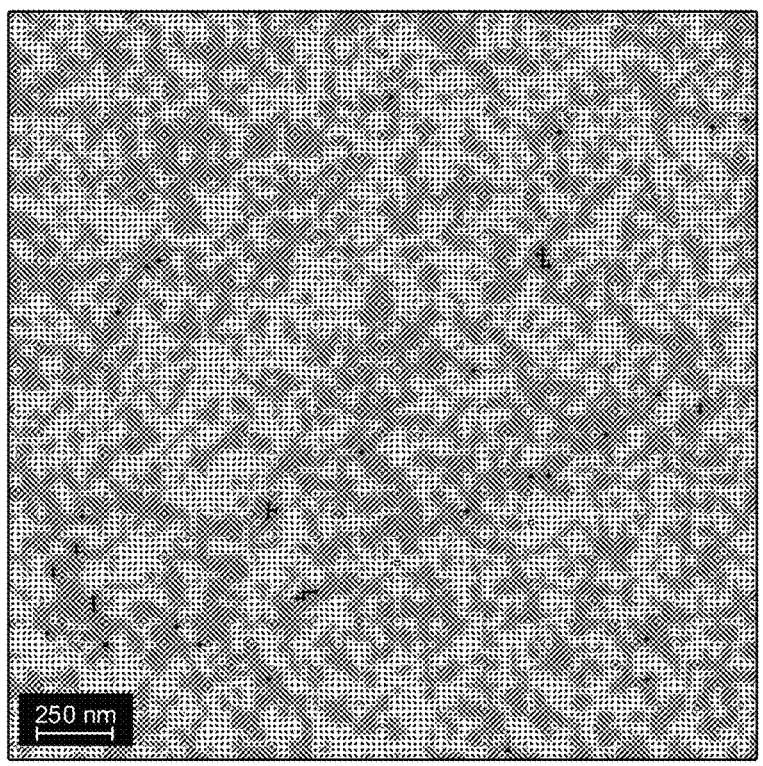
FIG. 32B is a topographical plot of the surface of the resulting nanotube fabric within example 14 of the present disclosure.
Figure 32C:
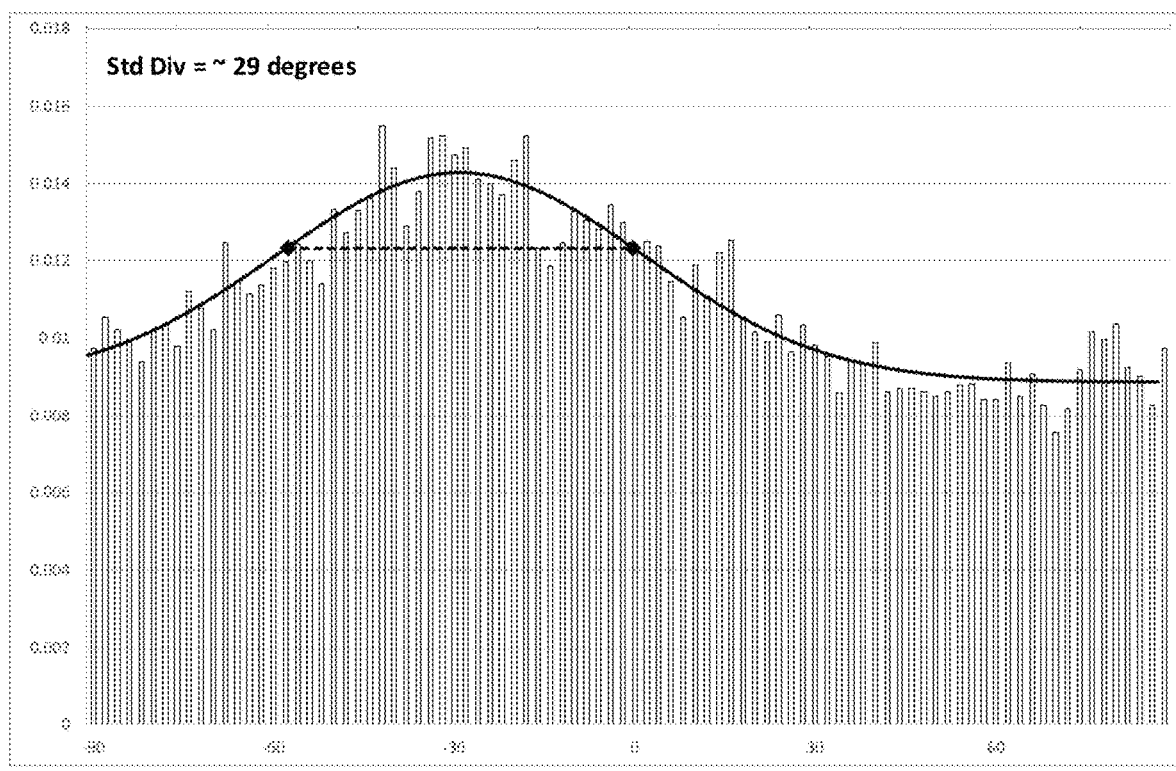
FIG. 32C is a normalized histogram plotting the positional orientation frequency of the nanotube elements within the resulting nanotube fabric within example 14 of the present disclosure.

FIGS. 32A-32C illustrate the surface roughness and degree of rafting within a nanotube fabric produced using the methods of the present disclosure (as described in detail above) in accordance with the parameters of example 14. The nanotube fabric of example 14 was formed by taking a sample of nanotube formulation "B" (formulated as described in detail above), adjusting the nanotube formulation to have a tetramethyl ammonium formate (TMA Fm) concentration level of approximately 0.75 mM (as described in detail with respect to FIGS. 23A-23D above), then performing four spin coating operations of the adjusted nanotube formulation over a silicon wafer (again, as described in detail above) to form a nanotube fabric approximately 20 nm thick. FIG. 32A is an SEM image 3201 illustrating the resulting nanotube fabric, FIG. 32B is a topographical plot 3202 of the surface of the resulting nanotube fabric, and FIG. 32C is a normalized histogram 3203 plotting the positional orientation frequency of the nanotube elements as shown within SEM image 3201. As listed in FIG. 25, the nanotube fabric formed within example 14 has an RMS roughness of 1.95 nm and the standard deviation of the nanotube positional orientation within the fabric was approximately 29° (indicating a moderately low degree of rafting within the fabric). The measurements from this fabric, formed from nanotube formulation "B" with a tetramethyl ammonium formate (TMA Fm) concentration level of approximately 0.75 mM, were used to provide data point 2624 in FIG. 26B.

Example 15

Figure 33A:
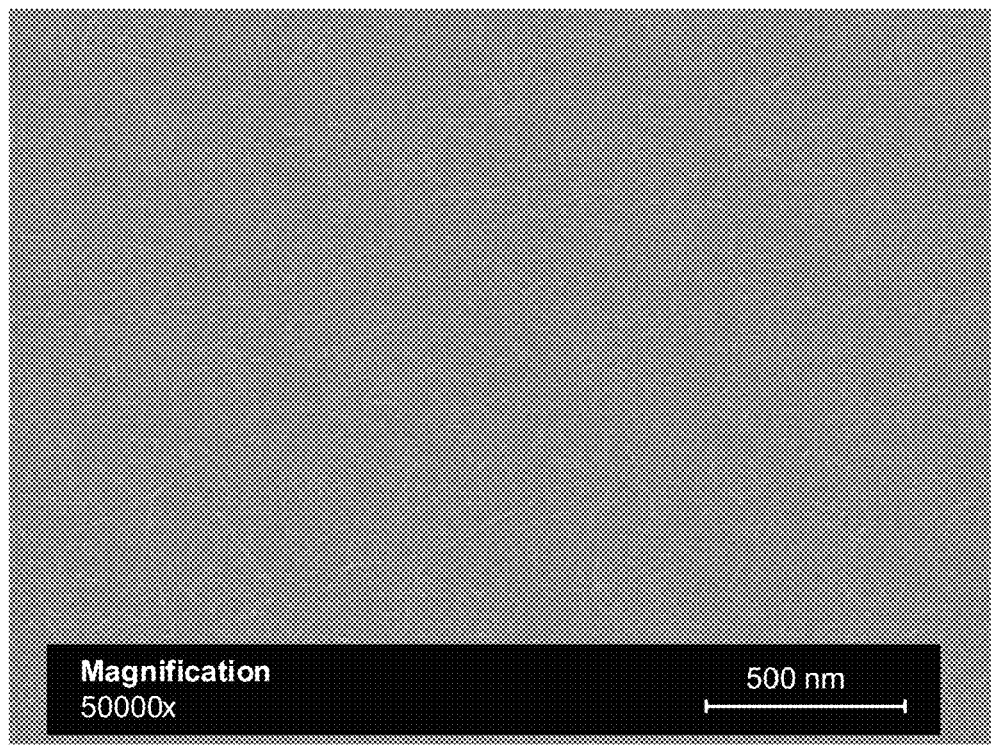
FIG. 33A is an SEM image illustrating the resulting nanotube fabric within example 15 of the present disclosure.
Figure 33B:
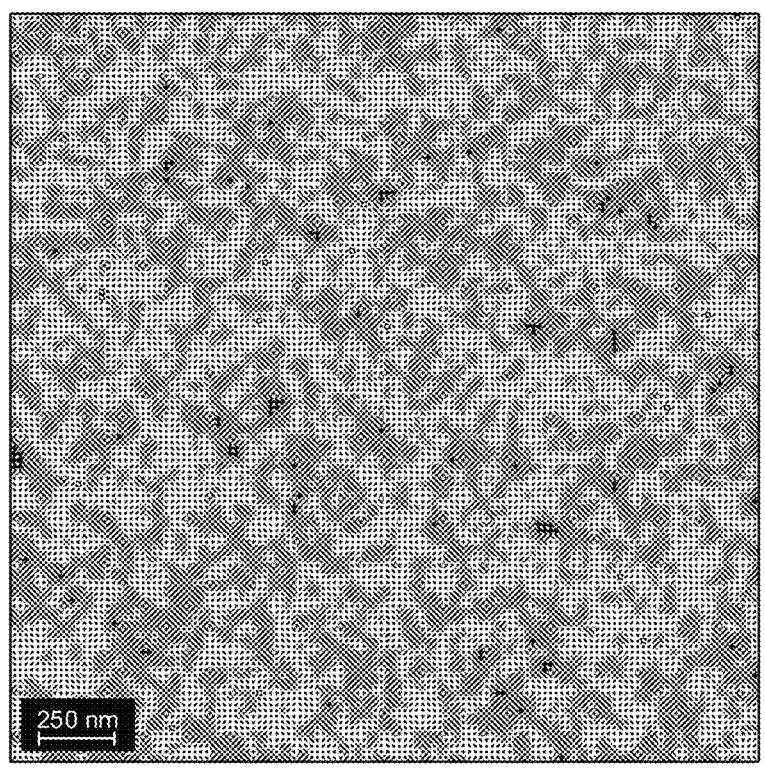
FIG. 33B is a topographical plot of the surface of the resulting nanotube fabric within example 15 of the present disclosure.
Figure 33C:
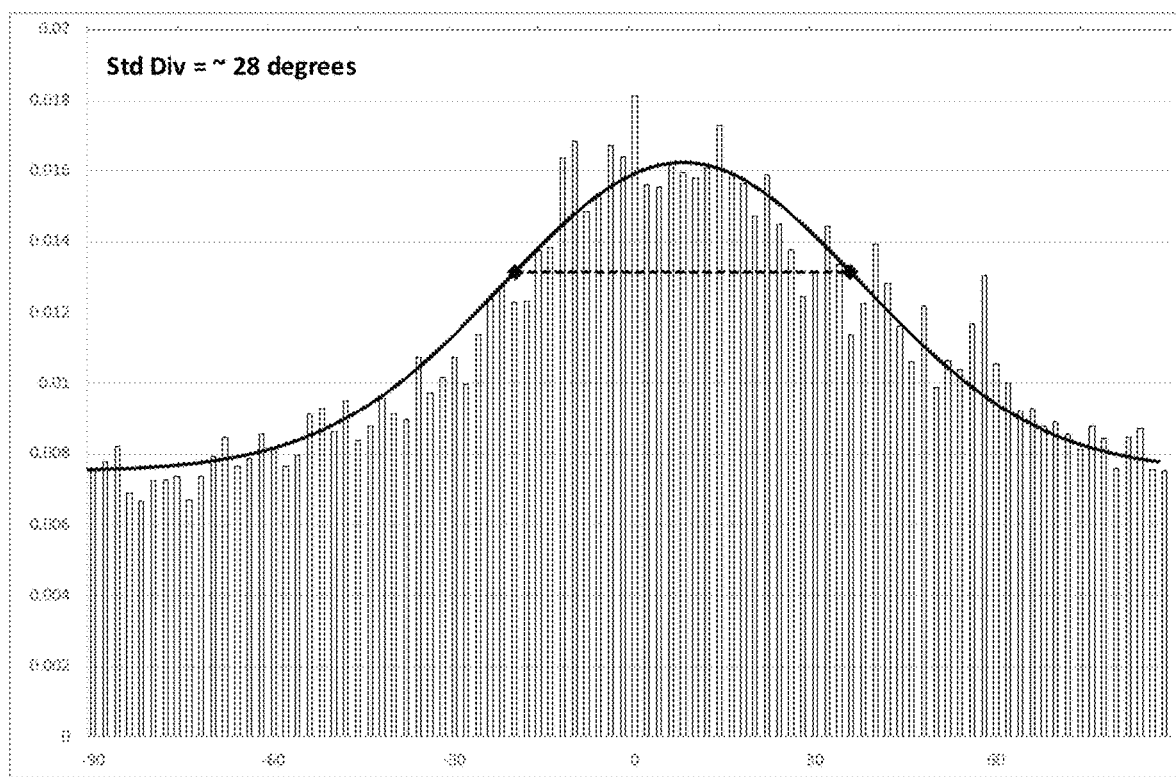
FIG. 33C is a normalized histogram plotting the positional orientation frequency of the nanotube elements within the resulting nanotube fabric within example 15 of the present disclosure.

FIGS. 33A-33C illustrate the surface roughness and degree of rafting within a nanotube fabric produced using the methods of the present disclosure (as described in detail above) in accordance with the parameters of example 15. The nanotube fabric of example 15 was formed by taking a sample of nanotube formulation "B" (formulated as described in detail above), adjusting the nanotube formulation to have a tetramethyl ammonium formate (TMA Fm) concentration level of approximately 1.50 mM (as described in detail with respect to FIGS. 23A-23D above), then performing four spin coating operations of the adjusted nanotube formulation over a silicon wafer (again, as described in detail above) to form a nanotube fabric approximately 20 nm thick. FIG. 33A is an SEM image 3301 illustrating the resulting nanotube fabric, FIG. 33B is a topographical plot 3302 of the surface of the resulting nanotube fabric, and FIG. 33C is a normalized histogram 3303 plotting the positional orientation frequency of the nanotube elements as shown within SEM image 3301. As listed in FIG. 25, the nanotube fabric formed within example 15 has an RMS roughness of 2.22 nm and the standard deviation of the nanotube positional orientation within the fabric was approximately 28° (indicating a moderately low degree of rafting within the fabric). The measurements from this fabric, formed from nanotube formulation "B" with a tetramethyl ammonium formate (TMA Fm) concentration level of approximately 1.50 mM, were used to provide data point 2626 in FIG. 26B.

Example 16

Figure 34A:
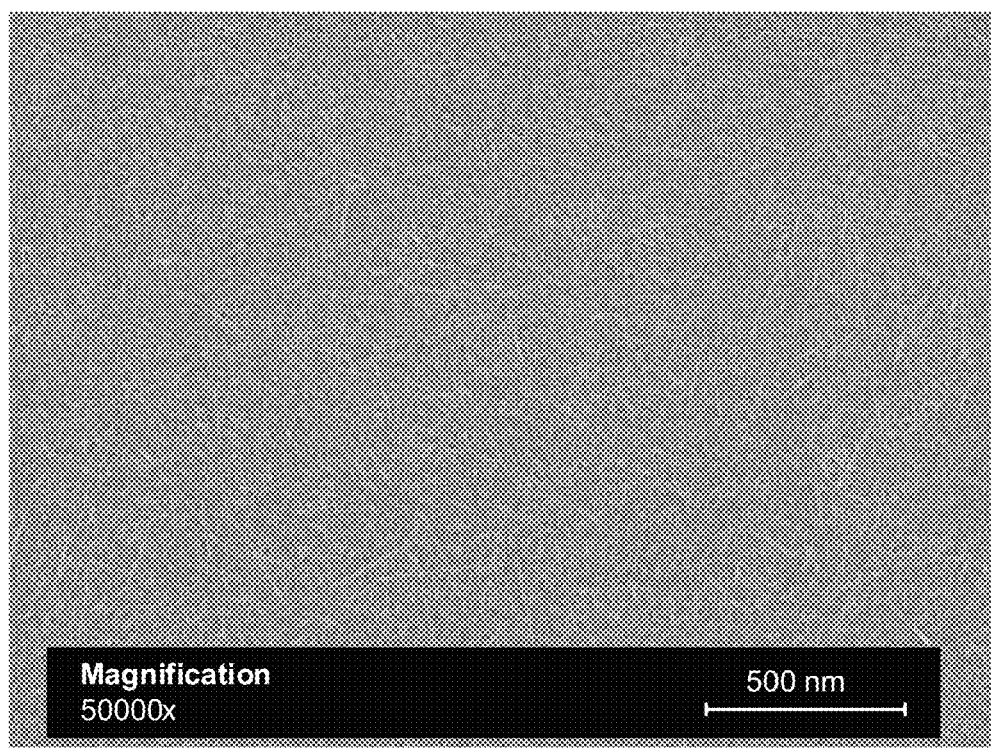
FIG. 34A is an SEM image illustrating the resulting nanotube fabric within example 16 of the present disclosure.
Figure 34B:
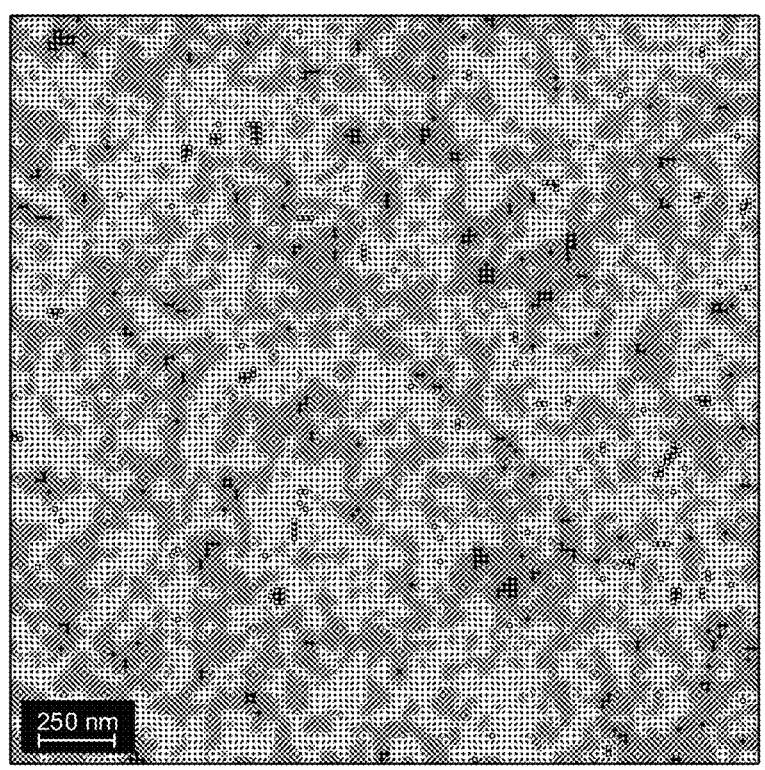
FIG. 34B is a topographical plot of the surface of the resulting nanotube fabric within example 16 of the present disclosure.
Figure 34C:
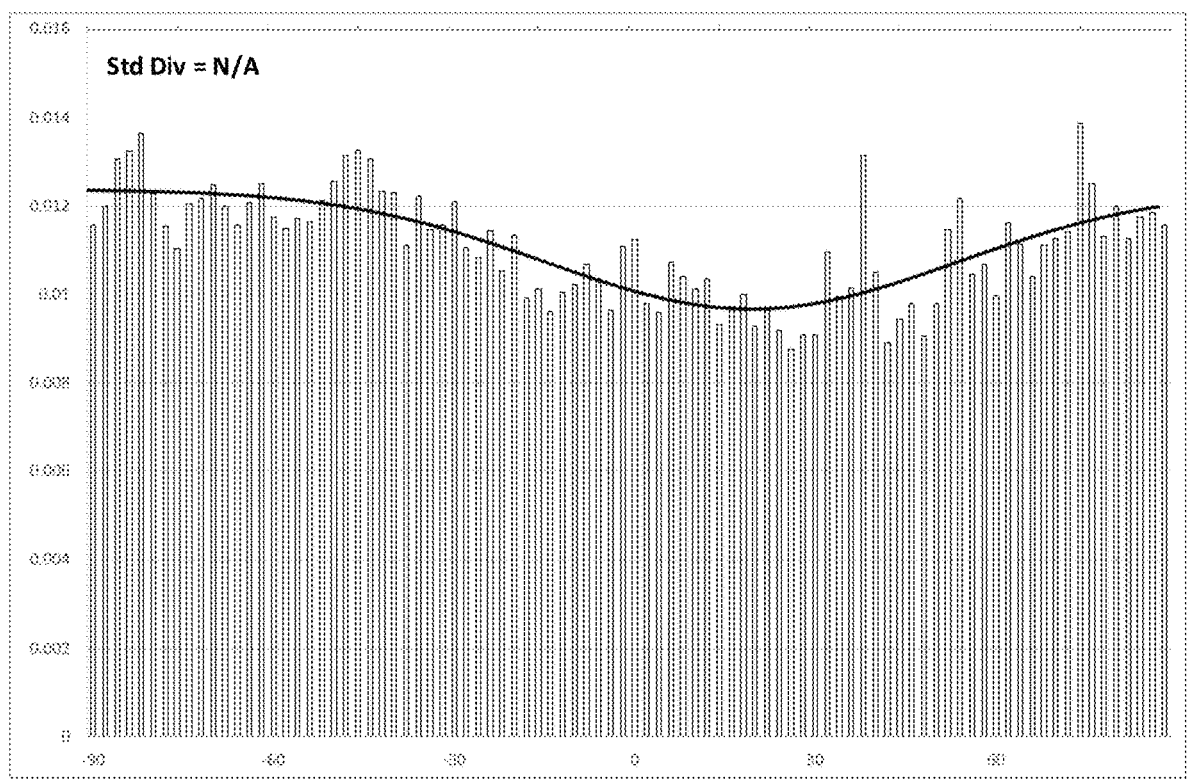
FIG. 34C is a normalized histogram plotting the positional orientation frequency of the nanotube elements within the resulting nanotube fabric within example 16 of the present disclosure.

FIGS. 34A-34C illustrate the surface roughness and degree of rafting within a nanotube fabric produced using the methods of the present disclosure (as described in detail above) in accordance with the parameters of example 16. The nanotube fabric of example 16 was formed by taking a sample of nanotube formulation "B" (formulated as described in detail above), adjusting the nanotube formulation to have a tetramethyl ammonium formate (TMA Fm) concentration level of approximately 7.50 mM (as described in detail with respect to FIGS. 23A-23D above), then performing four spin coating operations of the adjusted nanotube formulation over a silicon wafer (again, as described in detail above) to form a nanotube fabric approximately 20 nm thick. FIG. 34A is an SEM image 3401 illustrating the resulting nanotube fabric, FIG. 34B is a topographical plot 3402 of the surface of the resulting nanotube fabric, and FIG. 34C is a normalized histogram 3403 plotting the positional orientation frequency of the nanotube elements as shown within SEM image 3401. As listed in FIG. 25, the nanotube fabric formed within example 16 has an RMS roughness of 2.61 nm and the standard deviation of the nanotube positional orientation within the fabric was essentially undefined (indicating a essentially no rafting within the fabric). The measurements from this fabric, formed from nanotube formulation "B" with a tetramethyl ammonium formate (TMA Fm) concentration level of approximately 7.50 mM, were used to provide data point 2628 in FIG. 26B.

Example 17

Figure 35A:
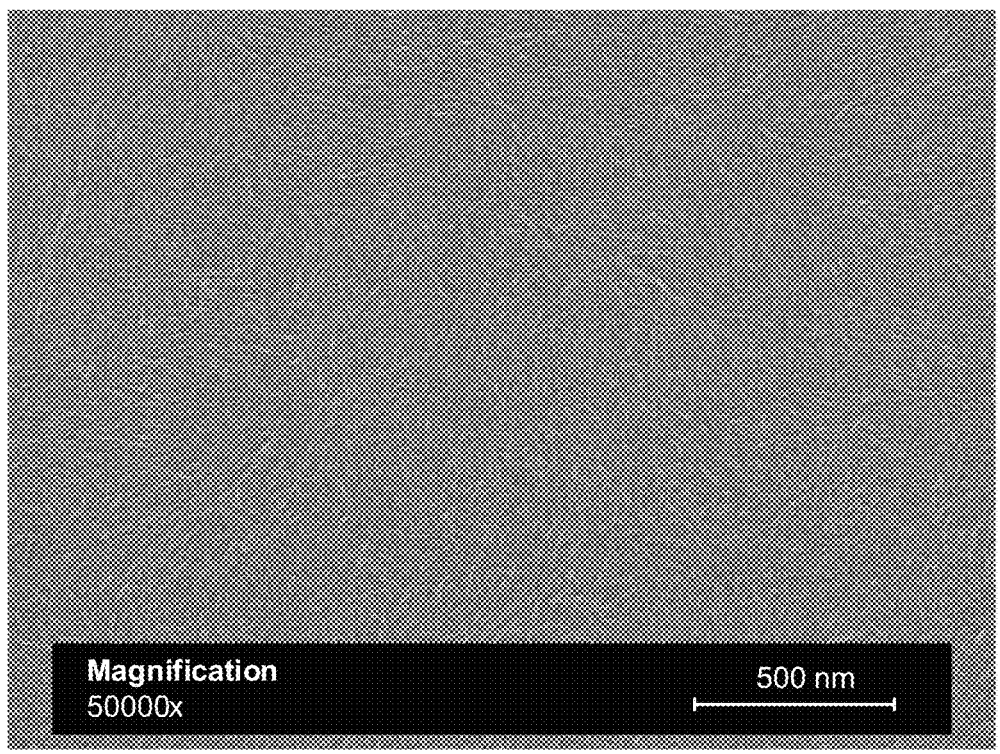
FIG. 35A is an SEM image illustrating the resulting nanotube fabric within example 17 of the present disclosure.
Figure 35B:
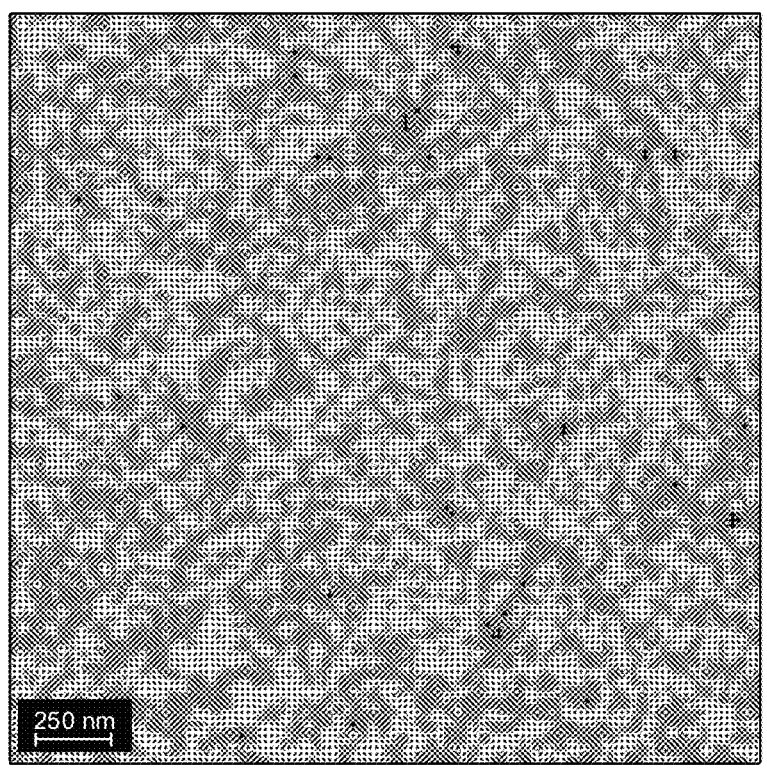
FIG. 35B is a topographical plot of the surface of the resulting nanotube fabric within example 17 of the present disclosure.
Figure 35C:
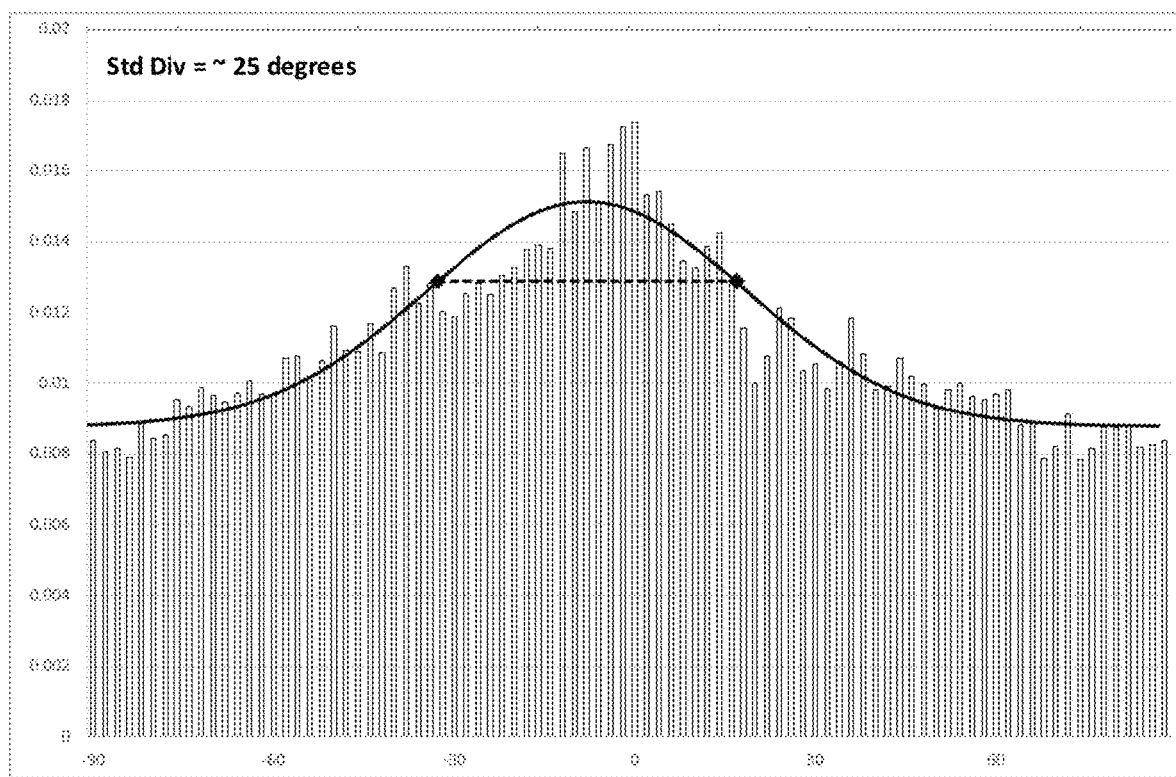
FIG. 35C is a normalized histogram plotting the positional orientation frequency of the nanotube elements within the resulting nanotube fabric within example 17 of the present disclosure.

FIGS. 35A-35C illustrate the surface roughness and degree of rafting within a nanotube fabric produced using the methods of the present disclosure (as described in detail above) in accordance with the parameters of example 17. The nanotube fabric of example 17 was formed by taking a sample of nanotube formulation "C" (formulated as described in detail above), adjusting the nanotube formulation to have an ionic species concentration level of substantially zero (as described in detail with respect to FIGS. 23A-23D above), then performing three spin coating operations of the adjusted nanotube formulation over a silicon wafer (again, as described in detail above) to form a nanotube fabric approximately 20 nm thick. FIG. 35A is an SEM image 3501 illustrating the resulting nanotube fabric, FIG. 35B is a topographical plot 3502 of the surface of the resulting nanotube fabric, and FIG. 35C is a normalized histogram 3503 plotting the positional orientation frequency of the nanotube elements as shown within SEM image 3501. As listed in FIG. 25, the nanotube fabric formed within example 17 has an RMS roughness of 1.77 nm and the standard deviation of the nanotube positional orientation within the fabric was approximately 25° (indicating a moderate low degree of rafting within the fabric). The measurements from this fabric, formed from nanotube formulation "C" with essentially no ionic species present within the formulation, were used to provide data point 2632 in FIG. 26C and 2642 in FIG. 26D.

Example 18

Figure 36A:
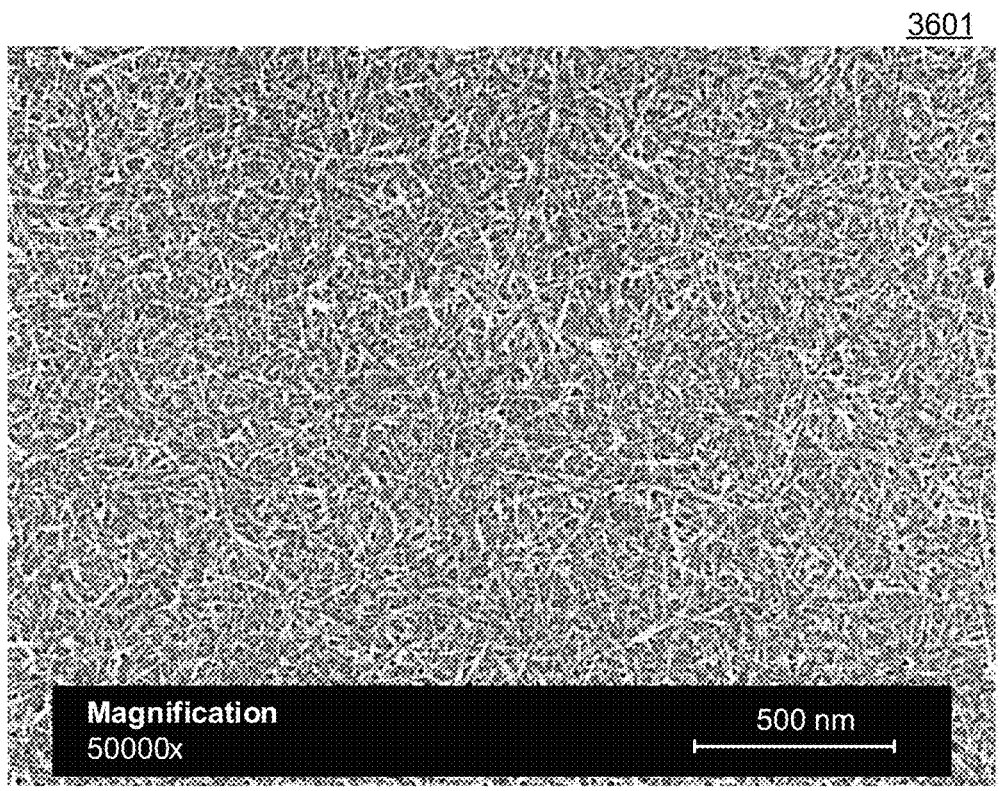
FIG. 36A is an SEM image illustrating the resulting nanotube fabric within example 18 of the present disclosure.
Figure 36B:
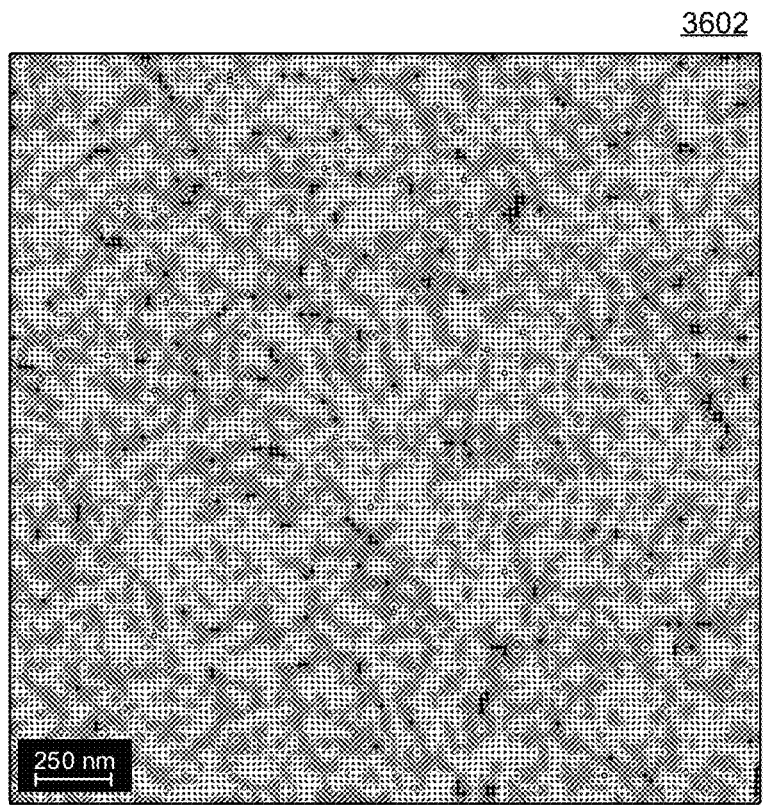
FIG. 36B is a topographical plot of the surface of the resulting nanotube fabric within example 18 of the present disclosure.
Figure 36C:
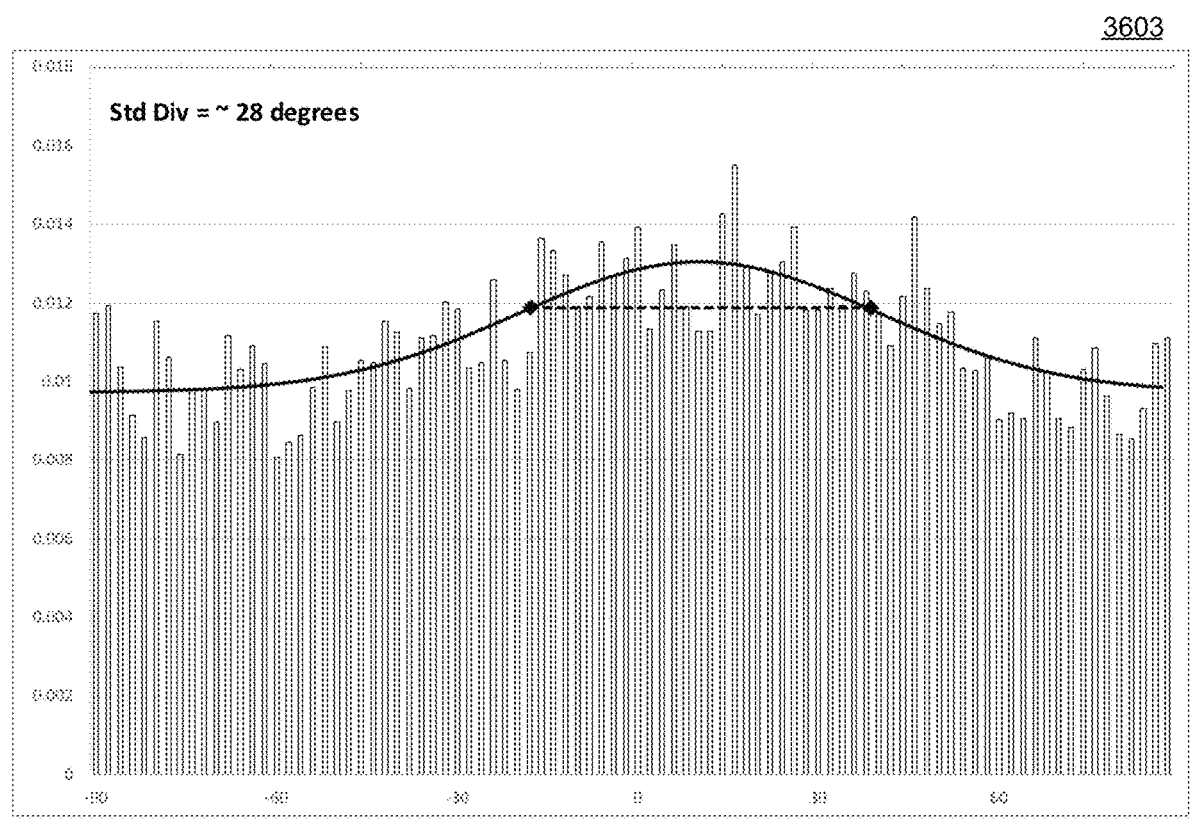
FIG. 36C is a normalized histogram plotting the positional orientation frequency of the nanotube elements within the resulting nanotube fabric within example 18 of the present disclosure.

FIGS. 36A-36C illustrate the surface roughness and degree of rafting within a nanotube fabric produced using the methods of the present disclosure (as described in detail above) in accordance with the parameters of example 18. The nanotube fabric of example 18 was formed by taking a sample of nanotube formulation "C" (formulated as described in detail above), adjusting the nanotube formulation to have an ammonium nitrate ($NH_4NO_3$) concentration level of approximately 0.71 mM (as described in detail with respect to FIGS. 23A-23D above), then performing three spin coating operations of the adjusted nanotube formulation over a silicon wafer (again, as described in detail above) to form a nanotube fabric approximately 20 nm thick. FIG. 36A is an SEM image 3601 illustrating the resulting nanotube fabric, FIG. 36B is a topographical plot 3602 of the surface of the resulting nanotube fabric, and FIG. 36C is a normalized histogram 3603 plotting the positional orientation frequency of the nanotube elements as shown within SEM image 3601. As listed in FIG. 25, the nanotube fabric formed within example 18 has an RMS roughness of 3.22 nm and the standard deviation of the nanotube positional orientation within the fabric was approximately 28° (indicating a moderately low degree of rafting within the fabric). The measurements from this fabric, formed from nanotube formulation "C" with an ammonium nitrate ($NH_4NO_3$) concentration level of approximately 0.71 mM, were used to provide data point 2634 in FIG. 26C.

Example 19

Figure 37A:
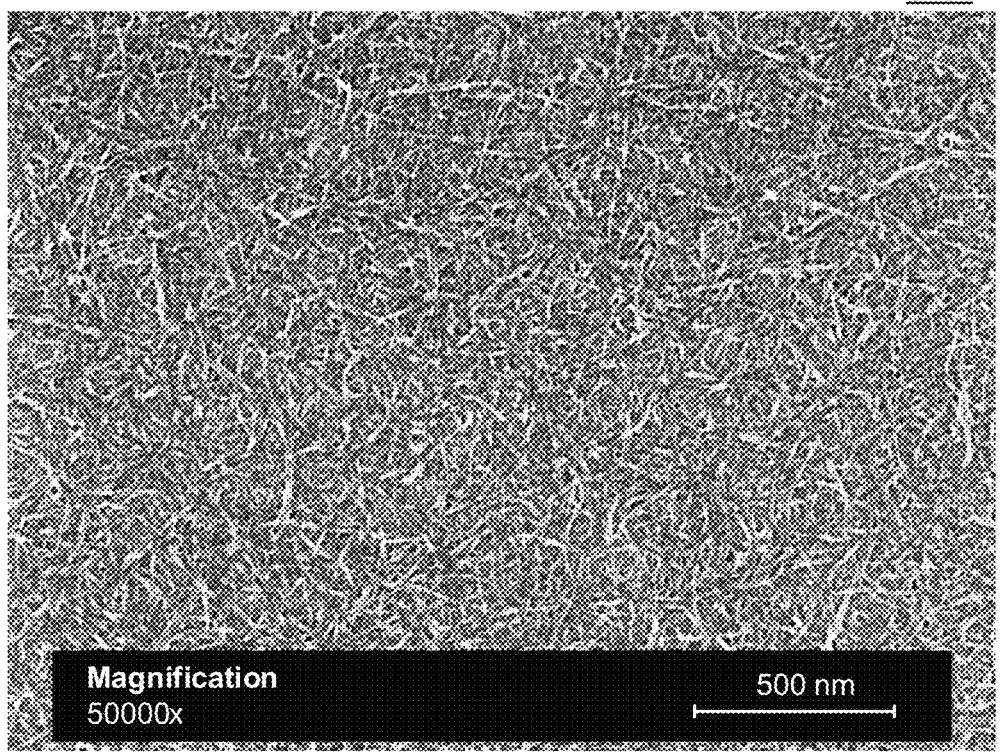
FIG. 37A is an SEM image illustrating the resulting nanotube fabric within example 19 of the present disclosure.
Figure 37B:
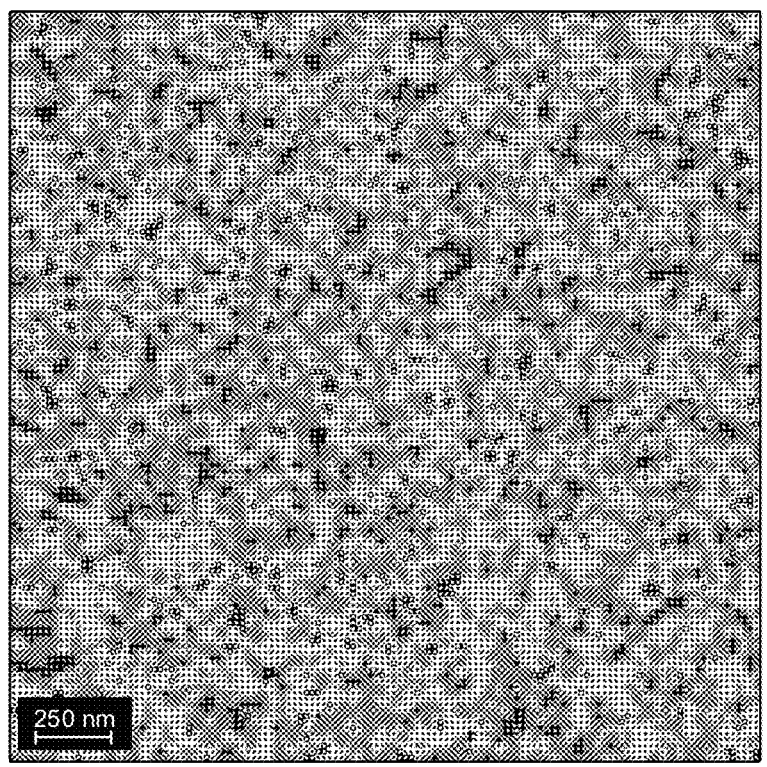
FIG. 37B is a topographical plot of the surface of the resulting nanotube fabric within example 19 of the present disclosure.
Figure 37C:
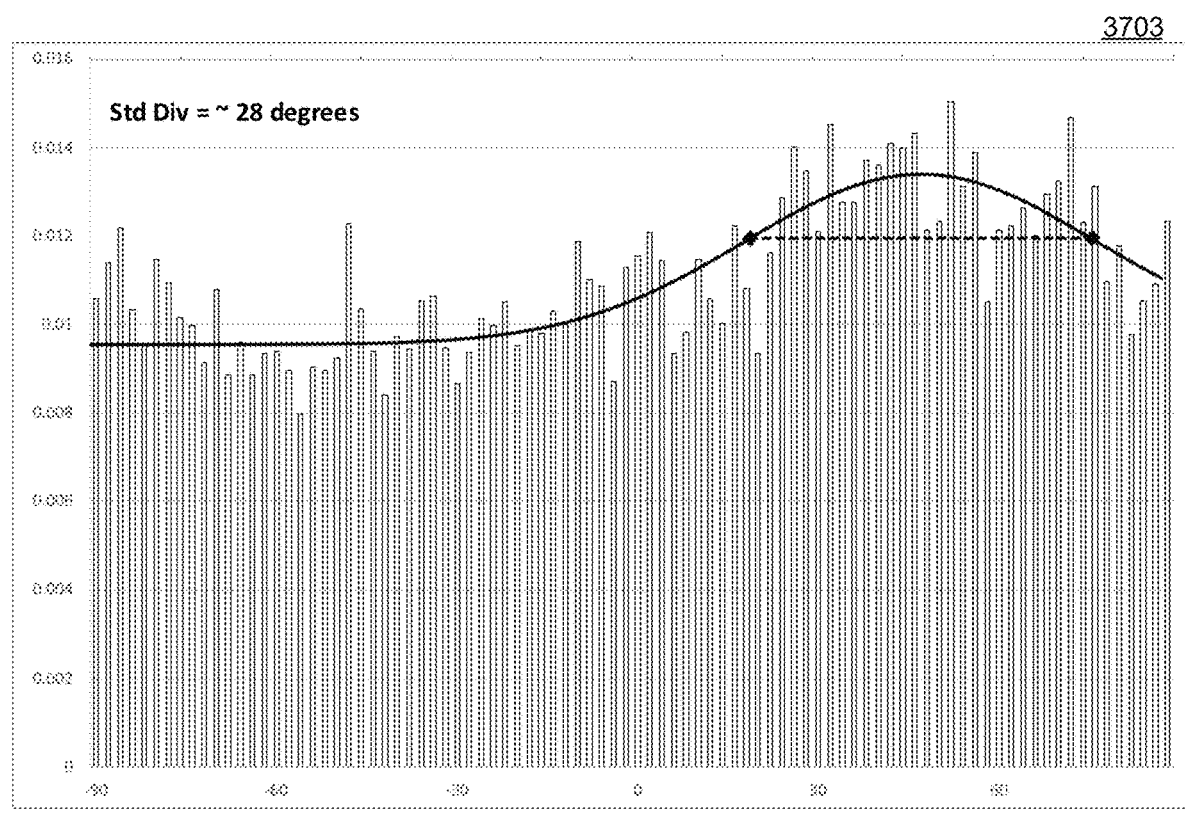
FIG. 37C is a normalized histogram plotting the positional orientation frequency of the nanotube elements within the resulting nanotube fabric within example 19 of the present disclosure.

FIGS. 37A-37C illustrate the surface roughness and degree of rafting within a nanotube fabric produced using the methods of the present disclosure (as described in detail above) in accordance with the parameters of example 19. The nanotube fabric of example 19 was formed by taking a sample of nanotube formulation "C" (formulated as described in detail above), adjusting the nanotube formulation to have an ammonium nitrate ($NH_4NO_3$) concentration level of approximately 1.43 mM (as described in detail with respect to FIGS. 23A-23D above), then performing three spin coating operations of the adjusted nanotube formulation over a silicon wafer (again, as described in detail above) to form a nanotube fabric approximately 20 nm thick. FIG. 37A is an SEM image 3701 illustrating the resulting nanotube fabric, FIG. 37B is a topographical plot 3702 of the surface of the resulting nanotube fabric, and FIG. 37C is a normalized histogram 3703 plotting the positional orientation frequency of the nanotube elements as shown within SEM image 3701. As listed in FIG. 25, the nanotube fabric formed within example 19 has an RMS roughness of 3.62 nm and the standard deviation of the nanotube positional orientation within the fabric was approximately 28° (indicating a moderately low degree of rafting within the fabric). The measurements from this fabric, formed from nanotube formulation "C" with an ammonium nitrate ($NH_4NO_3$) concentration level of approximately 1.43 mM, were used to provide data point 2636 in FIG. 26C.

Example 20

Figure 38A:
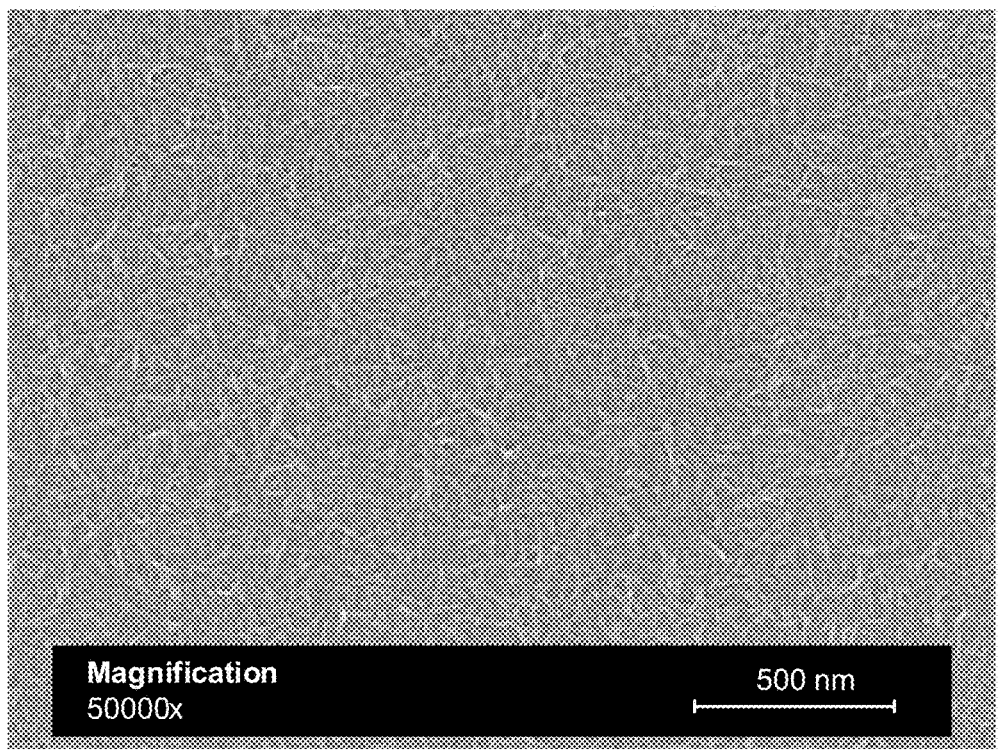
FIG. 38A is an SEM image illustrating the resulting nanotube fabric within example 20 of the present disclosure.
Figure 38B:
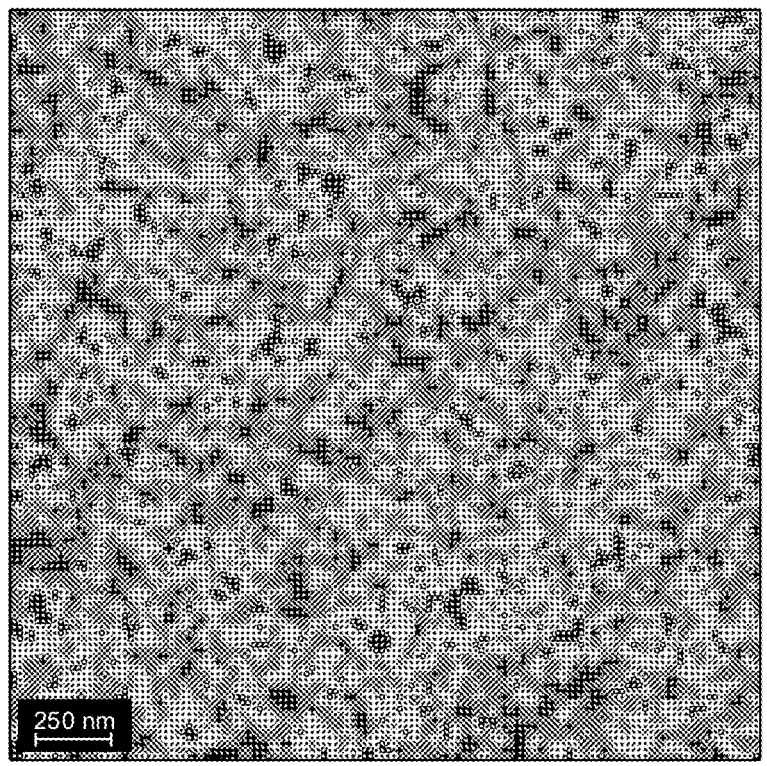
FIG. 38B is a topographical plot of the surface of the resulting nanotube fabric within example 20 of the present disclosure.
Figure 38C:
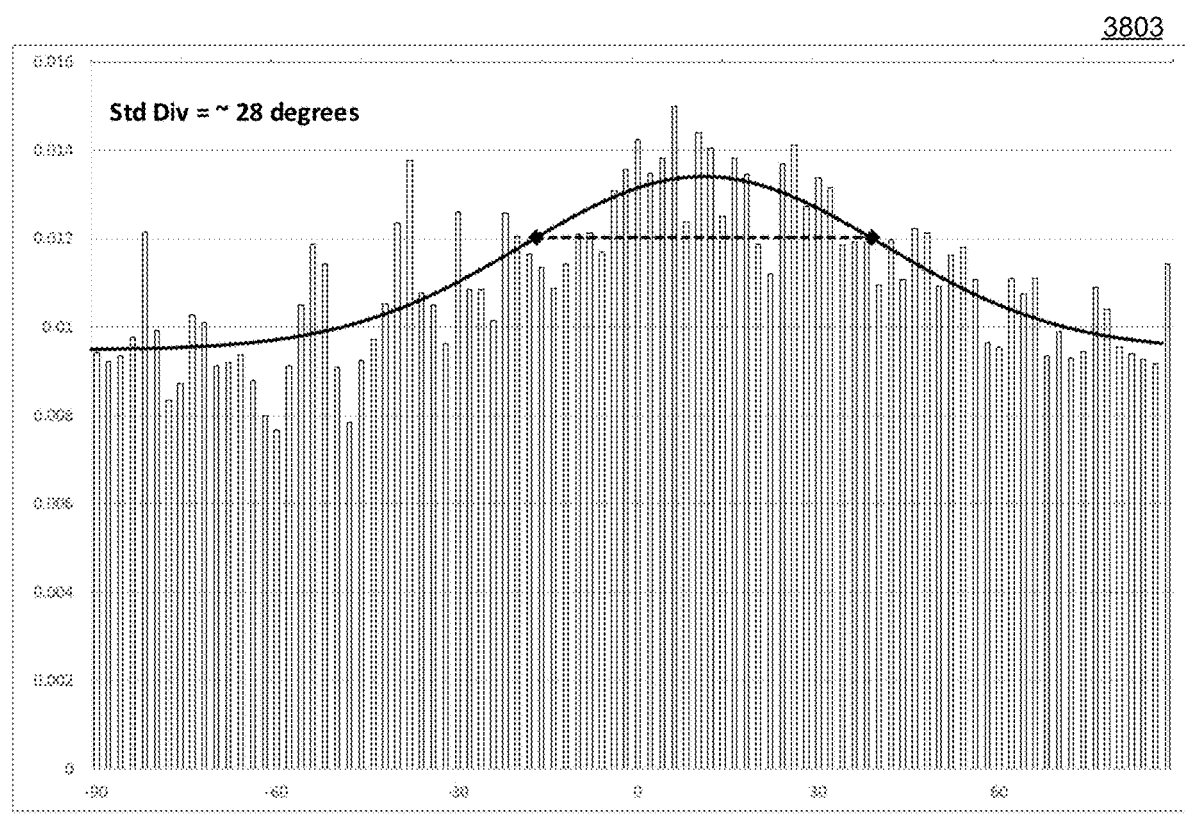
FIG. 38C is a normalized histogram plotting the positional orientation frequency of the nanotube elements within the resulting nanotube fabric within example 20 of the present disclosure.

FIGS. 38A-38C illustrate the surface roughness and degree of rafting within a nanotube fabric produced using the methods of the present disclosure (as described in detail above) in accordance with the parameters of example 20. The nanotube fabric of example 20 was formed by taking a sample of nanotube formulation "C" (formulated as described in detail above), adjusting the nanotube formulation to have an ammonium nitrate ($NH_4NO_3$) concentration level of approximately 8.14 mM (as described in detail with respect to FIGS. 23A-23D above), then performing three spin coating operations of the adjusted nanotube formulation over a silicon wafer (again, as described in detail above) to form a nanotube fabric approximately 20 nm thick. FIG. 38A is an SEM image 3801 illustrating the resulting nanotube fabric, FIG. 38B is a topographical plot 3802 of the surface of the resulting nanotube fabric, and FIG. 38C is a normalized histogram 3803 plotting the positional orientation frequency of the nanotube elements as shown within SEM image 3801. As listed in FIG. 25, the nanotube fabric formed within example 20 has an RMS roughness of 3.82 nm and the standard deviation of the nanotube positional orientation within the fabric was approximately 28° (indicating a moderately low degree of rafting within the fabric). The measurements from this fabric, formed from nanotube formulation "C" with an ammonium nitrate ($NH_4NO_3$) concentration level of approximately 8.14 mM, were used to provide data point 2638 in FIG. 26C.

Example 21

Figure 39A:
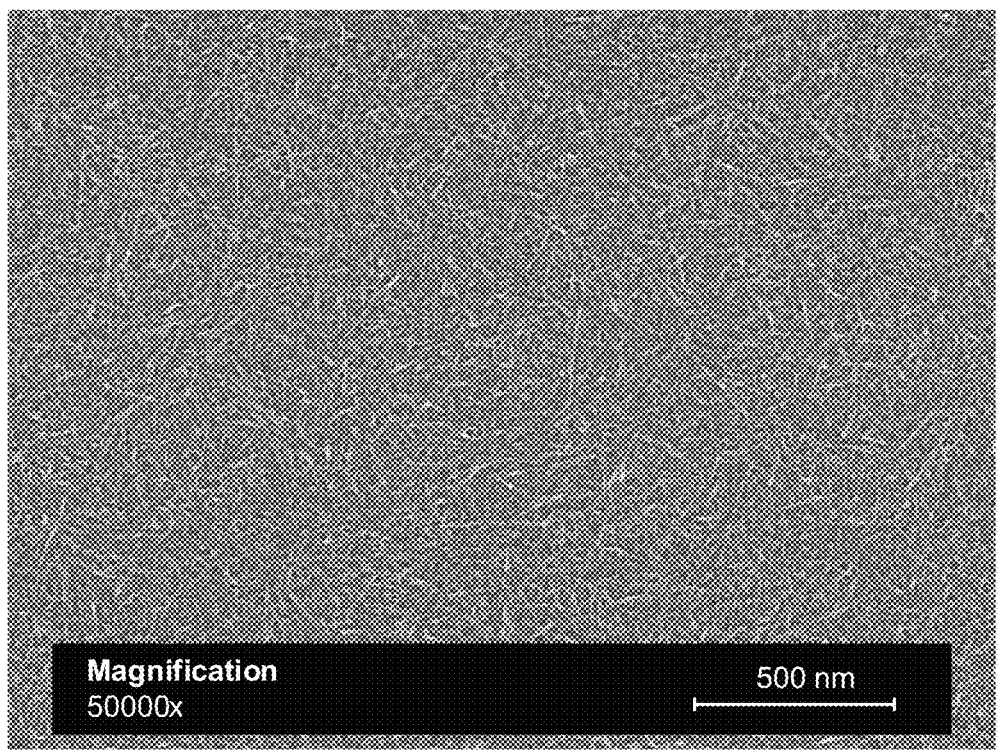
FIG. 39A is an SEM image illustrating the resulting nanotube fabric within example 21 of the present disclosure.
Figure 39B:
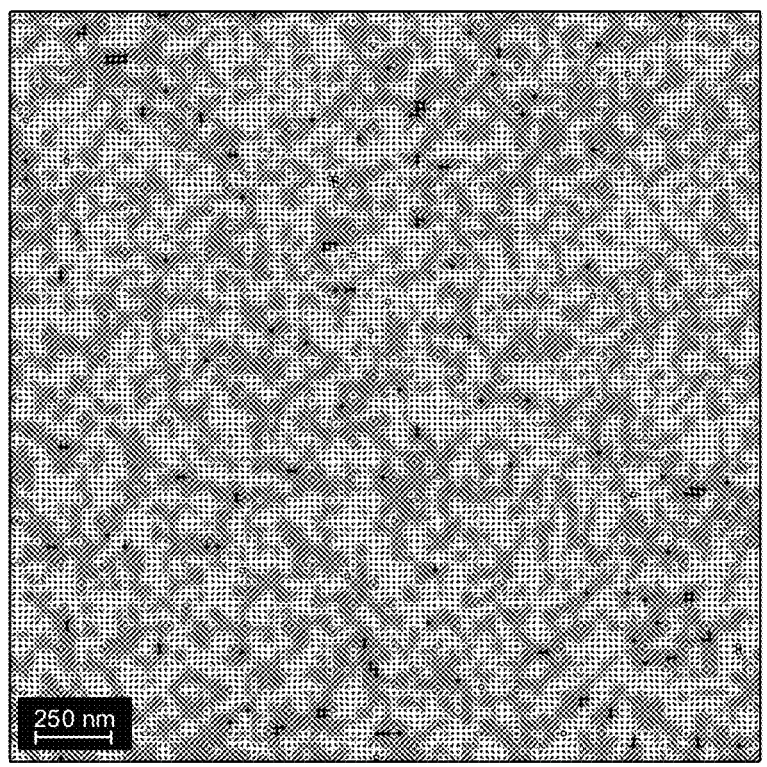
FIG. 39B is a topographical plot of the surface of the resulting nanotube fabric within example 21 of the present disclosure.
Figure 39C:
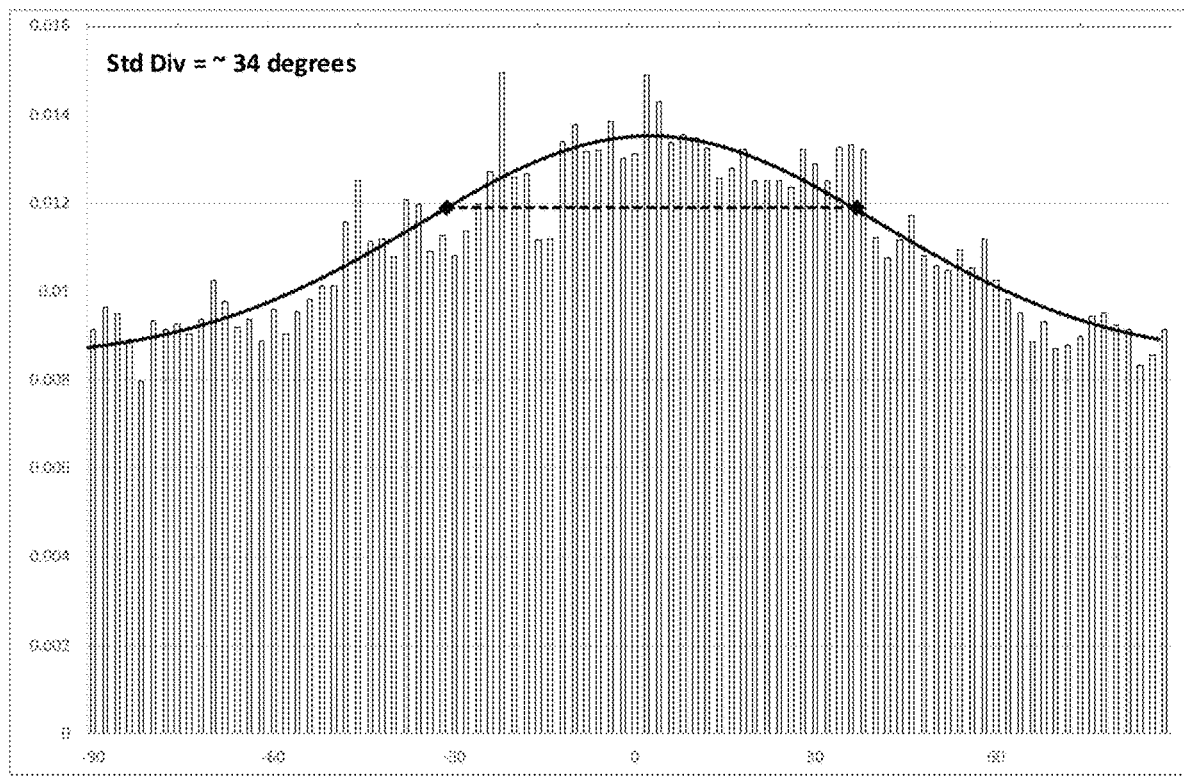
FIG. 39C is a normalized histogram plotting the positional orientation frequency of the nanotube elements within the resulting nanotube fabric within example 21 of the present disclosure.

FIGS. 39A-39C illustrate the surface roughness and degree of rafting within a nanotube fabric produced using the methods of the present disclosure (as described in detail above) in accordance with the parameters of example 21. The nanotube fabric of example 21 was formed by taking a sample of nanotube formulation "C" (formulated as described in detail above), adjusting the nanotube formulation to have a tetramethyl ammonium formate (TMA Fm) concentration level of approximately 0.75 mM (as described in detail with respect to FIGS. 23A-23D above), then performing three spin coating operations of the adjusted nanotube formulation over a silicon wafer (again, as described in detail above) to form a nanotube fabric approximately 20 nm thick. FIG. 39A is an SEM image 3901 illustrating the resulting nanotube fabric, FIG. 39B is a topographical plot 3902 of the surface of the resulting nanotube fabric, and FIG. 39C is a normalized histogram 3903 plotting the positional orientation frequency of the nanotube elements as shown within SEM image 3901. As listed in FIG. 25, the nanotube fabric formed within example 21 has an RMS roughness of 2.33 nm and the standard deviation of the nanotube positional orientation within the fabric was approximately 34° (indicating a low degree of rafting within the fabric). The measurements from this fabric, formed from nanotube formulation "C" with a tetramethyl ammonium formate (TMA Fm) concentration level of approximately 0.75 mM, were used to provide data point 2644 in FIG. 26D.

Example 22

Figure 40A:
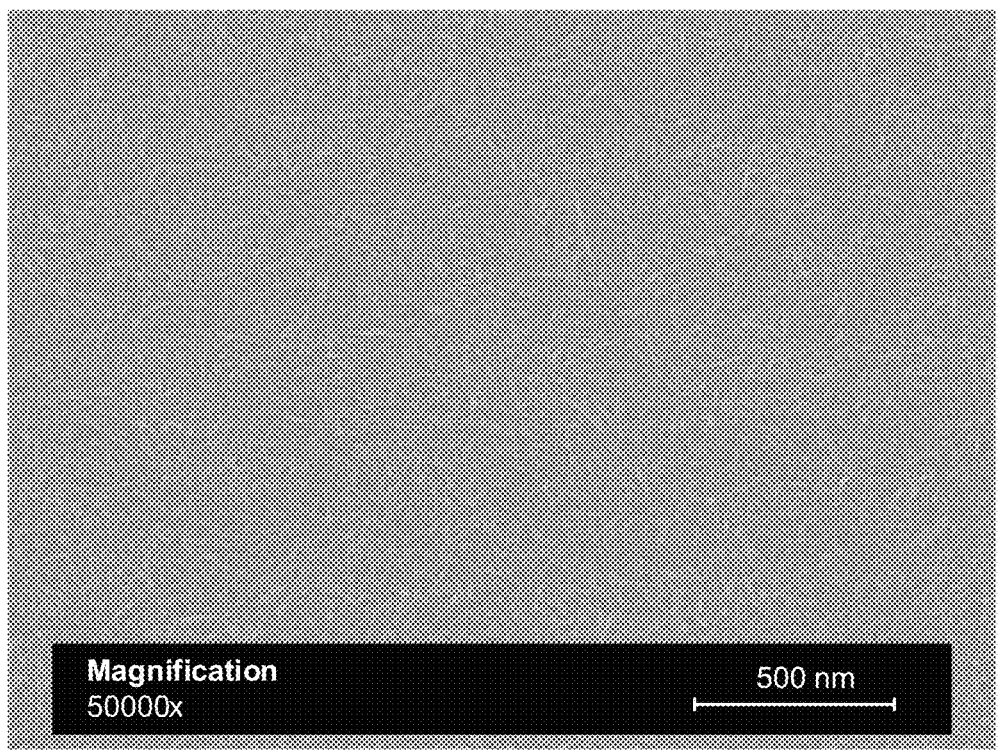
FIG. 40A is an SEM image illustrating the resulting nanotube fabric within example 22 of the present disclosure.
Figure 40B:
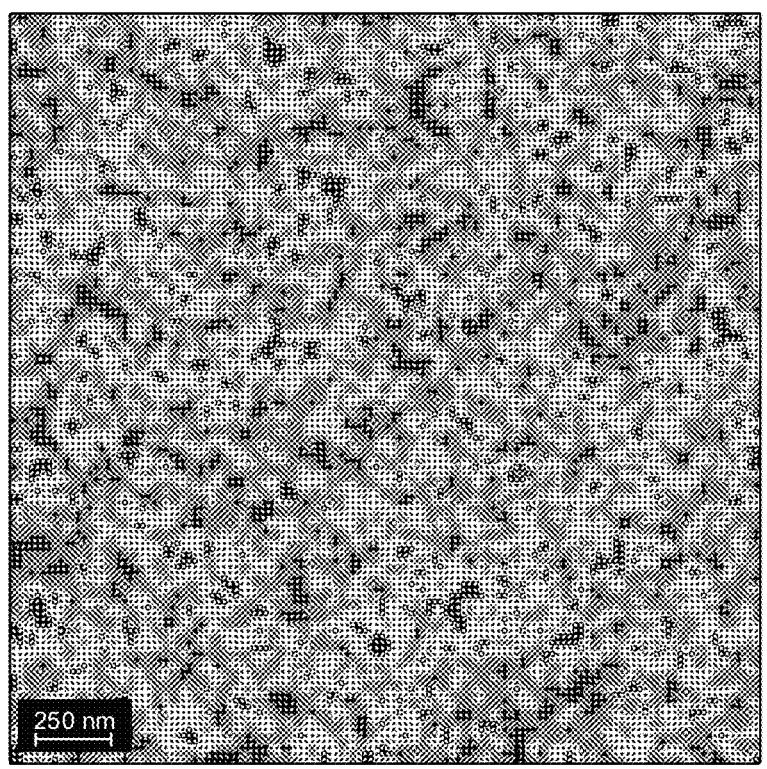
FIG. 40B is a topographical plot of the surface of the resulting nanotube fabric within example 22 of the present disclosure.
Figure 40C:
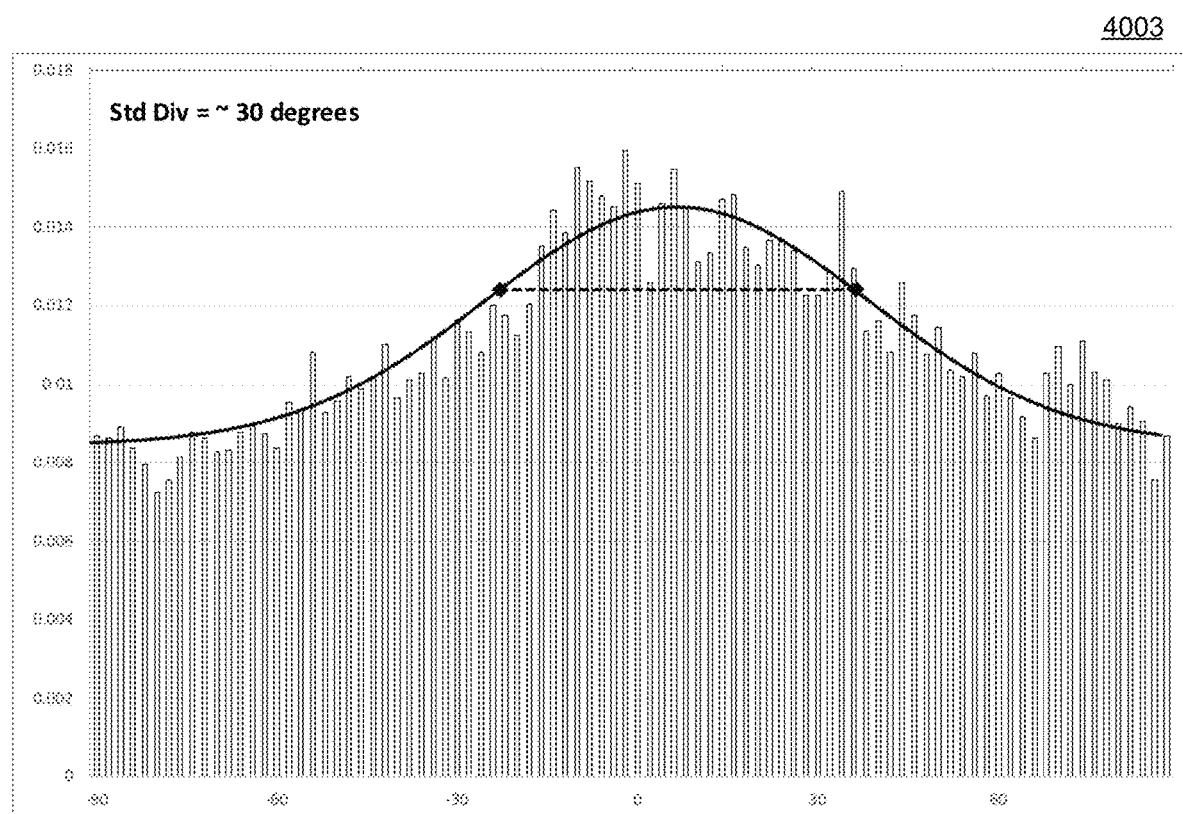
FIG. 40C is a normalized histogram plotting the positional orientation frequency of the nanotube elements within the resulting nanotube fabric within example 22 of the present disclosure.

FIGS. 40A-40C illustrate the surface roughness and degree of rafting within a nanotube fabric produced using the methods of the present disclosure (as described in detail above) in accordance with the parameters of example 22. The nanotube fabric of example 22 was formed by taking a sample of nanotube formulation "C" (formulated as described in detail above), adjusting the nanotube formulation to have a tetramethyl ammonium formate (TMA Fm) concentration level of approximately 1.50 mM (as described in detail with respect to FIGS. 23A-23D above), then performing three spin coating operations of the adjusted nanotube formulation over a silicon wafer (again, as described in detail above) to form a nanotube fabric approximately 20 nm thick. FIG. 40A is an SEM image 4001 illustrating the resulting nanotube fabric, FIG. 40B is a topographical plot 4002 of the surface of the resulting nanotube fabric, and FIG. 40C is a normalized histogram 4003 plotting the positional orientation frequency of the nanotube elements as shown within SEM image 4001. As listed in FIG. 25, the nanotube fabric formed within example 22 has an RMS roughness of 2.50 nm and the standard deviation of the nanotube positional orientation within the fabric was approximately 30° (indicating a low degree of rafting within the fabric). The measurements from this fabric, formed from nanotube formulation "C" with a tetramethyl ammonium formate (TMA Fm) concentration level of approximately 1.50 mM, were used to provide data point 2646 in FIG. 26D.

Example 23

Figure 41A:
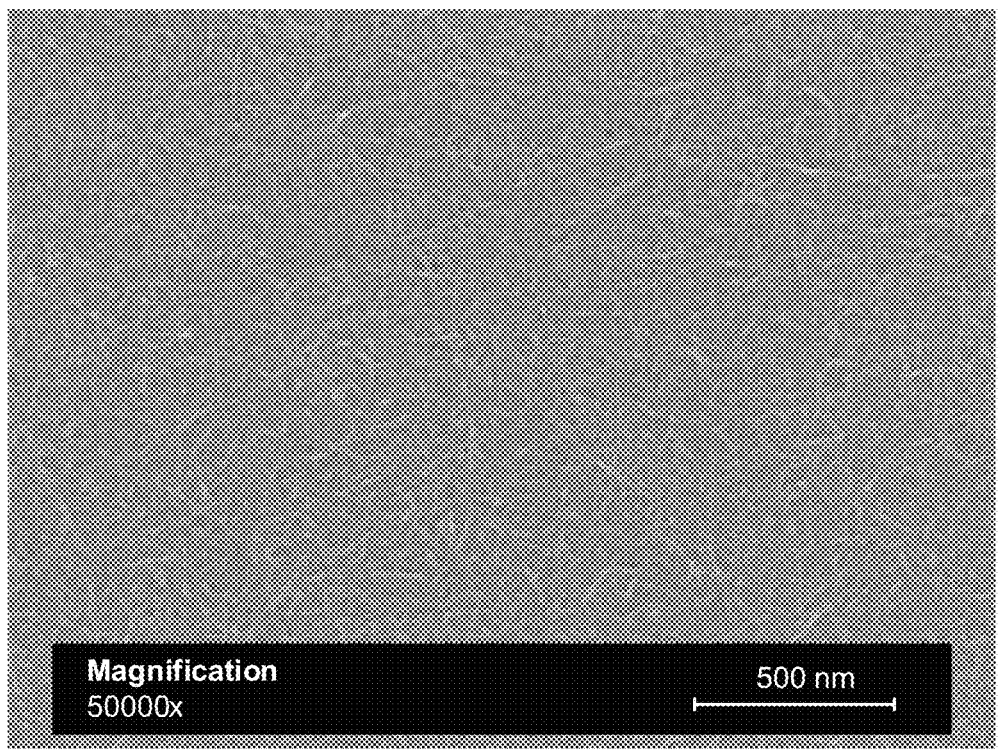
FIG. 41A is an SEM image illustrating the resulting nanotube fabric within example 23 of the present disclosure.
Figure 41B:
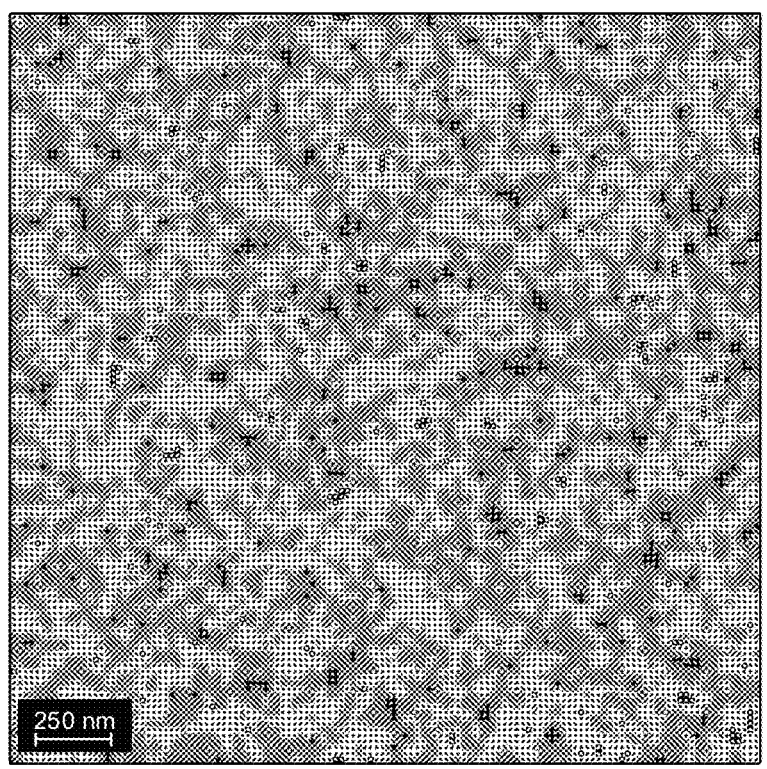
FIG. 41B is a topographical plot of the surface of the resulting nanotube fabric within example 23 of the present disclosure.
Figure 41C:
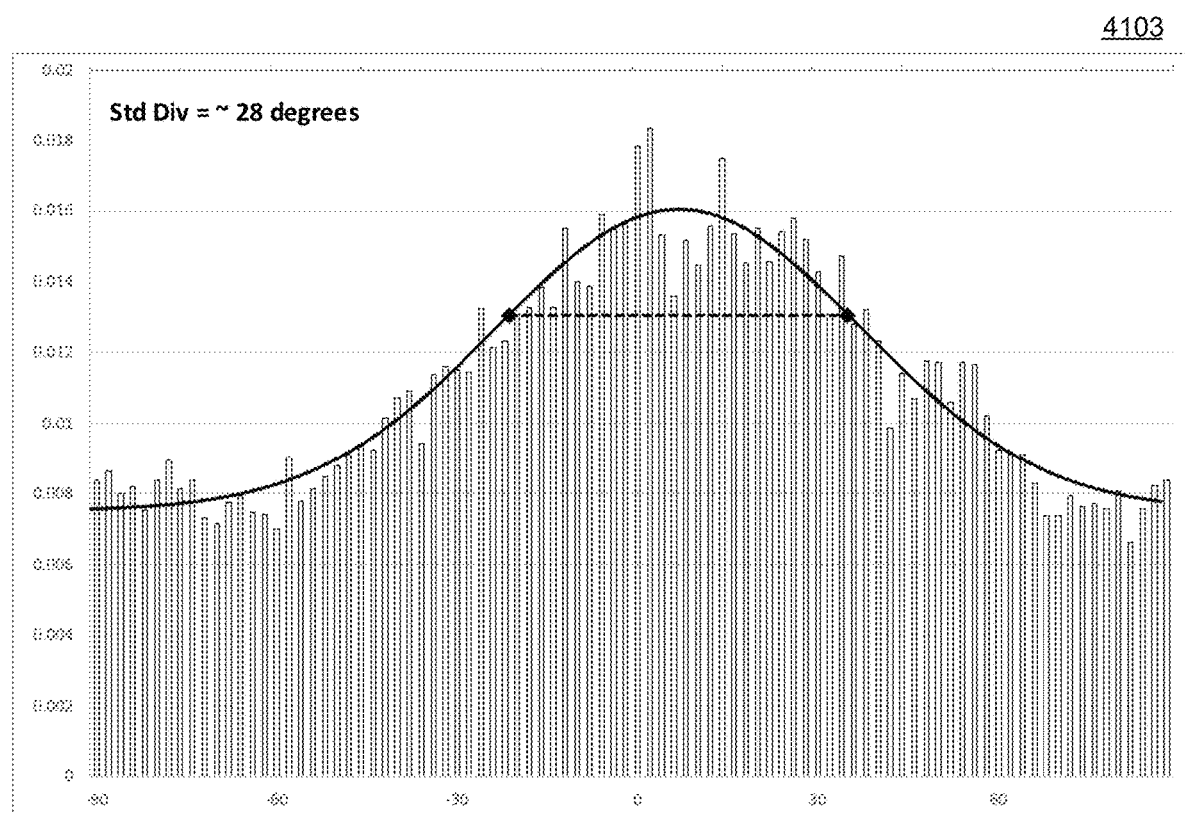
FIG. 41C is a normalized histogram plotting the positional orientation frequency of the nanotube elements within the resulting nanotube fabric within example 23 of the present disclosure.

FIGS. 41A-41C illustrate the surface roughness and degree of rafting within a nanotube fabric produced using the methods of the present disclosure (as described in detail above) in accordance with the parameters of example 23. The nanotube fabric of example 23 was formed by taking a sample of nanotube formulation "C" (formulated as described in detail above), adjusting the nanotube formulation to have a tetramethyl ammonium formate (TMA Fm) concentration level of approximately 7.50 mM (as described in detail with respect to FIGS. 23A-23D above), then performing three spin coating operations of the adjusted nanotube formulation over a silicon wafer (again, as described in detail above) to form a nanotube fabric approximately 20 nm thick. FIG. 41A is an SEM image 4101 illustrating the resulting nanotube fabric, FIG. 41B is a topographical plot 4102 of the surface of the resulting nanotube fabric, and FIG. 41C is a normalized histogram 4103 plotting the positional orientation frequency of the nanotube elements as shown within SEM image 4101. As listed in FIG. 25, the nanotube fabric formed within example 23 has an RMS roughness of 2.78 nm and the standard deviation of the nanotube positional orientation within the fabric was approximately 28° (indicating a moderately low degree of rafting within the fabric). The measurements from this fabric, formed from nanotube formulation "C" with a tetramethyl ammonium formate (TMA Fm) concentration level of approximately 7.50 mM, were used to provide data point 2648 in FIG. 26D.

Although the present invention has been described in relation to particular embodiments thereof, many other variations and modifications and other uses will become apparent to those skilled in the art. It is preferred, therefore, that the present invention not be limited by the specific disclosure herein, but rather be defined by the appended claims; and that these claims will encompass modifications of and improvements to what has been described.

What is claimed is:

1. A method of forming a nanotube fabric, comprising:
suspending a volume of nanotubes within a liquid medium;
processing and purifying said suspension of nanotubes to realize a nanotube formulation;
selecting at least one ionic species to use within said nanotube formulation;
selecting at least one of a surface roughness threshold and a degree of rafting threshold for said nanotube fabric;
characterizing said nanotube formulation and using said nanotube formulation
characterization to select a target concentration level for said at least one ionic species within said nanotube formulation;
adjusting said nanotube formulation to form an adjusted nanotube formulation that includes said selected at least one ionic species at said target concentration level; and
depositing said adjusted nanotube formulation via a spin coating operation to form a nanotube fabric.

2. The method of claim 1 wherein said nanotubes within said volume of nanotubes have at least one preselected parameter.

3. The method of claim 2 wherein said at least one preselected parameter includes at least one of length, length distribution, degree of straightness, nanotube wall type, chirality, and functionalization.

4. The method of claim 3 wherein said nanotube wall type is one of singled walled, doublewalled, multi-walled, or a preselected mixture thereof.

5. The method of claim 1 wherein said nanotubes are carbon nanotubes.

6. The method of claim 1 wherein said nanotube formulation characterization includes defining a utilization range of concentration levels for said at least one selected ionic species.

7. The method of claim 6 wherein said utilization range corresponds to desired characteristics within said nanotube fabric.

8. The method of claim 7 wherein said desired characteristics include at least one of surface roughness and degree of rafting.

9. The method of claim 8 wherein said desired characteristics include a surface roughness less than a preselected threshold value.

10. The method of claim 8 wherein said desired characteristics include a degree of rafting less than a preselected threshold value.

11. The method of claim 1 wherein said at least one ionic species is selected from the list consisting of ammonium salts, nitrate salts, ammonium nitrate salts, ammonium formate, ammonium acetate, ammonium carbonate, ammonium bicarbonate, ionic organic species, ionic polymers, and inorganic salts.

12. The method of claim 1 where said at least one ionic species includes a cation component selected from the list consisting of ammonium, tetraalkylammoniums, acids of primary aliphatic amines, acids of secondary aliphatic amines, acids of tertiary aliphatic amines, acids of cylic amines, cylic aromatic quaternary amines, and phosphorus-based ions.

13. The method of claim 1 where said at least one ionic species includes an anion component selected from the list consisting of soluble organic acid bases, simple soluble aliphatic carboxylic acids, complex organic acids, nitrate, phosphate, sulfate, and carbonate.

* * * * *